(12) United States Patent
Lee et al.

(10) Patent No.: US 11,557,720 B2
(45) Date of Patent: Jan. 17, 2023

(54) MEMORY DEVICE AND METHOD OF MANUFACTURING THE SAME

(71) Applicant: SAMSUNG ELECTRONICS CO., LTD., Suwon-si (KR)

(72) Inventors: Kyunghwan Lee, Seoul (KR); Yongseok Kim, Suwon-si (KR); Kohji Kanamori, Seongnam-si (KR); Unghwan Pi, Hwaseong-si (KR); Hyuncheol Kim, Seoul (KR); Sungwon Yoo, Hwaseong-si (KR); Jaeho Hong, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 224 days.

(21) Appl. No.: 17/110,524

(22) Filed: Dec. 3, 2020

(65) Prior Publication Data
US 2021/0359200 A1 Nov. 18, 2021

(30) Foreign Application Priority Data
May 14, 2020 (KR) .................. 10-2020-0057831

(51) Int. Cl.
| | | |
|---|---|---|
| H01L 43/08 | (2006.01) | |
| H01L 27/22 | (2006.01) | |
| H01L 43/10 | (2006.01) | |
| G11C 11/16 | (2006.01) | |
| H01L 23/522 | (2006.01) | |
| H01L 43/02 | (2006.01) | |

(52) U.S. Cl.
CPC .......... *H01L 43/08* (2013.01); *G11C 11/1655* (2013.01); *G11C 11/1673* (2013.01); *H01L 23/5226* (2013.01); *H01L 27/222* (2013.01); *H01L 43/02* (2013.01); *H01L 43/10* (2013.01)

(58) Field of Classification Search
CPC ... H01L 43/08; H01L 23/5226; H01L 27/222; H01L 43/02; H01L 43/10; G11C 11/1655; G11C 11/1673
USPC .............................................. 257/4
See application file for complete search history.

(56) References Cited

U.S. PATENT DOCUMENTS

| | | | |
|---|---|---|---|
| 6,104,632 A | 8/2000 | Nishimura | |
| 6,600,634 B1 * | 7/2003 | Kim | ............. G11B 5/5552 |
| 6,834,005 B1 * | 12/2004 | Parkin | ............. G11C 11/1675 365/83 |
| 6,861,314 B2 | 3/2005 | Hosotani | |
| 7,061,036 B2 | 6/2006 | Kajiyama | |
| 7,405,962 B2 | 7/2008 | Kajiyama | |

(Continued)

FOREIGN PATENT DOCUMENTS

| | | |
|---|---|---|
| JP | 2000-187976 A | 7/2000 |
| JP | 3857658 B2 | 12/2006 |
| JP | 2007-226951 A | 9/2007 |

*Primary Examiner* — Jami Valentine Miller
(74) *Attorney, Agent, or Firm* — Lee IP Law, P.C.

(57) ABSTRACT

A memory device includes a magnetic track layer extending on a substrate, the magnetic track layer having a folded structure that is two-dimensionally villi-shaped, a plurality of reading units including a plurality of fixed layers and a tunnel barrier layer between the magnetic track layer and each of the plurality of fixed layers, and a plurality of bit lines extending on different ones of the plurality of reading units, the plurality of reading units being between the magnetic track layer and corresponding ones of the plurality of bit lines.

20 Claims, 53 Drawing Sheets

(56) References Cited

U.S. PATENT DOCUMENTS

| | | |
|---|---|---|
| 8,115,238 B2 | 2/2012 | Lim et al. |
| 8,154,004 B2 | 4/2012 | Seyyedy et al. |
| 8,339,728 B2 | 12/2012 | Kim et al. |
| 10,290,679 B1 | 5/2019 | Bhushan et al. |
| 2009/0040883 A1* | 2/2009 | Kim .................. G11C 19/0808 369/13.41 |
| 2010/0039728 A1* | 2/2010 | Suzuki ................ G11B 5/5526 |

* cited by examiner

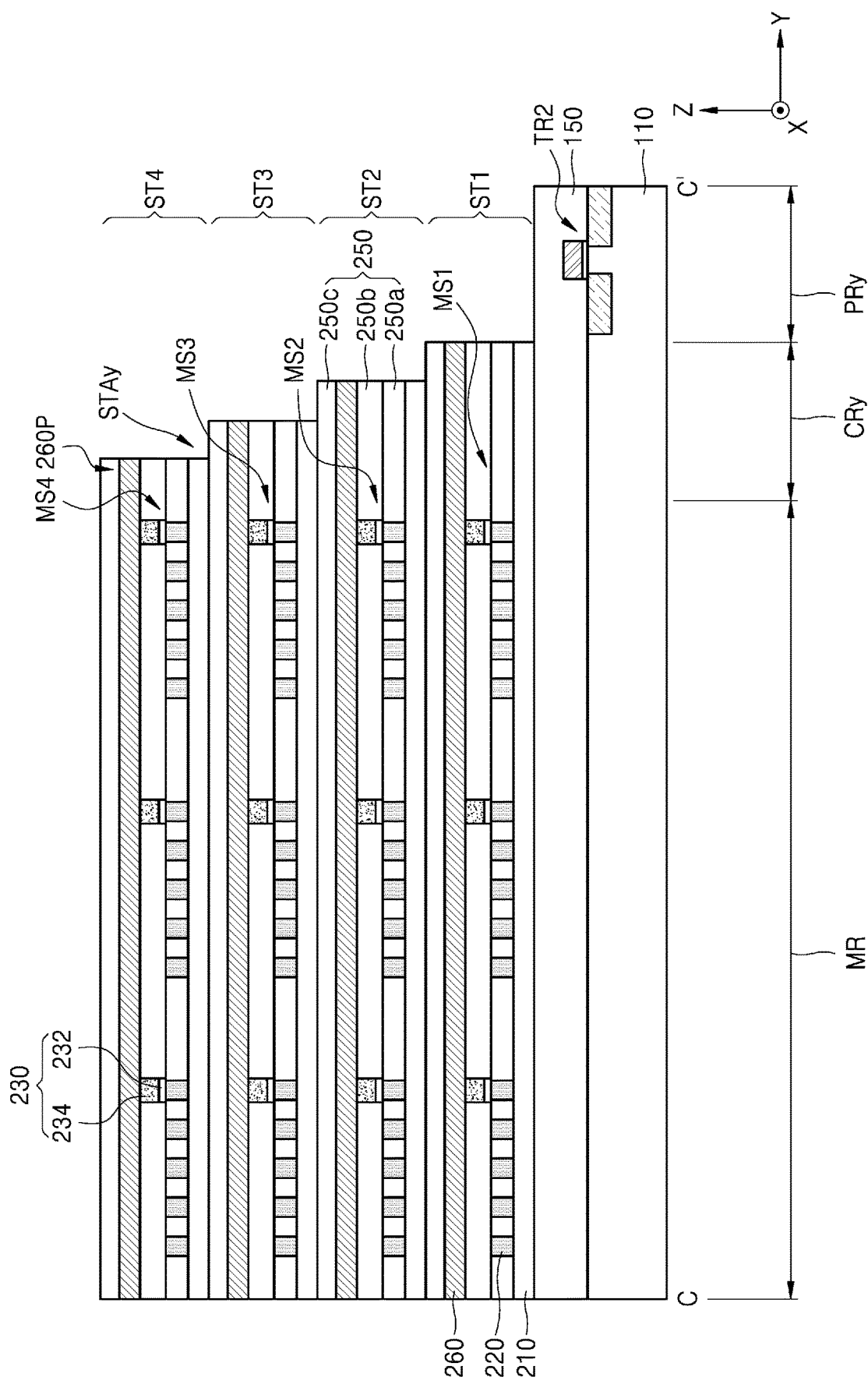

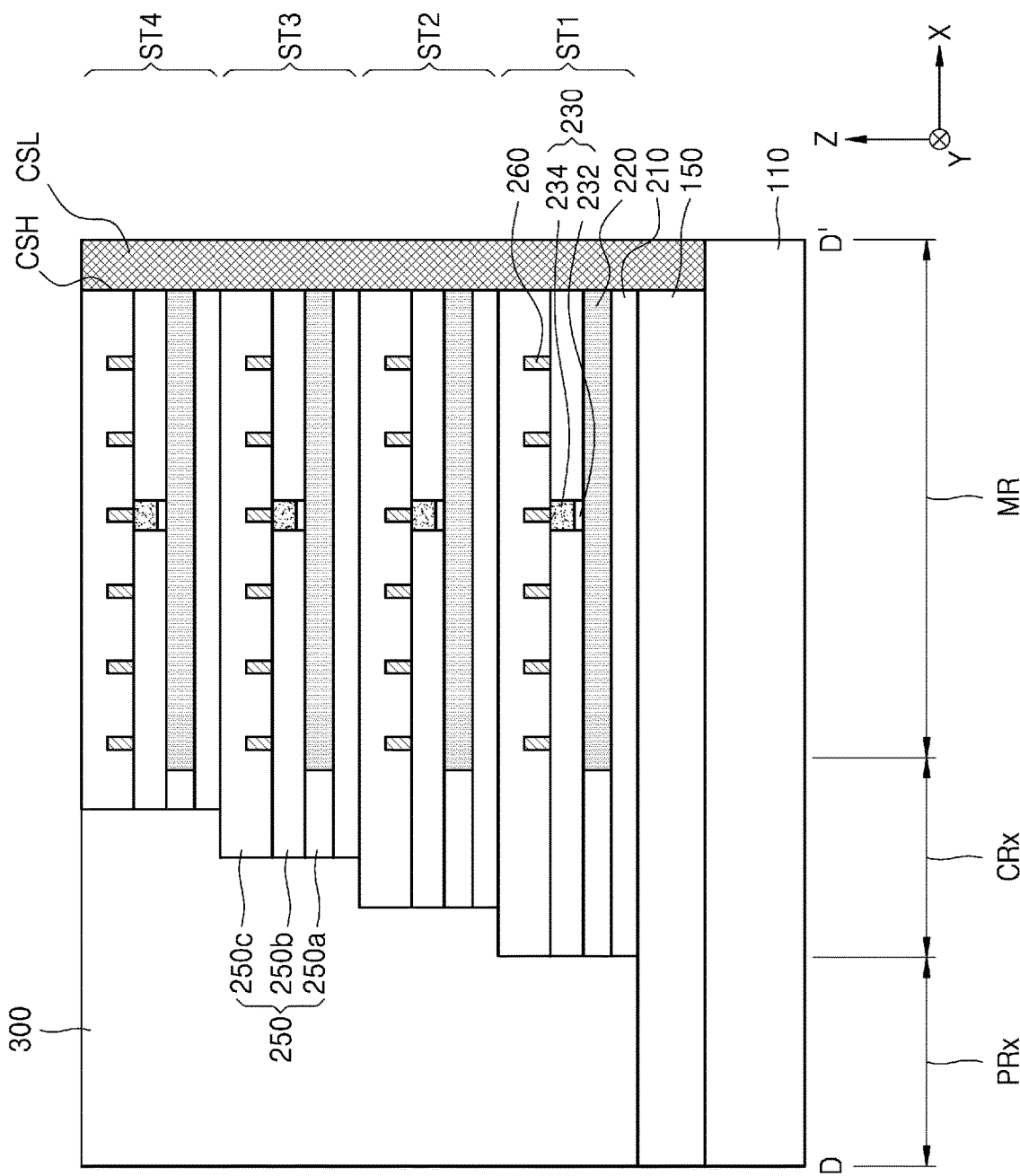

MEMORY DEVICE AND METHOD OF MANUFACTURING THE SAME

CROSS-REFERENCE TO RELATED APPLICATION

Korean Patent Application No. 10-2020-0057831, filed on May 14, 2020, in the Korean Intellectual Property Office, and entitled: "Memory Device and Method of Manufacturing the Same.

BACKGROUND

1. Field

Embodiments relate to a memory device and a method of manufacturing the same, and more particularly, to a memory device including a racetrack and a method of manufacturing the same.

2. Description of the Related Art

As electronic products are required to be miniaturized and multifunctionalized and to have high performance, high capacity memory devices are required. In order to provide high capacity, a magnetic domain wall shift register-type memory device including a racetrack including a plurality of magnetic domains storing information by movement of a magnetic domain wall between magnetic domains is suggested.

SUMMARY

According to embodiments, there is provided a memory device including a magnetic track layer extending on a substrate with a folding structure in which the magnetic track layer is two-dimensionally villi-shaped, a plurality of reading units including a plurality of fixed layers and a tunnel barrier layer arranged between the magnetic track layer and the plurality of fixed layers, and a plurality of bit lines extending with different ones of the plurality of reading units between the magnetic track layer and the plurality of bit lines.

According to embodiments, there is also provided a memory device including a substrate having a memory region and a connection region in a first horizontal direction of the memory region, a plurality of memory stacks each including a magnetic track layer laminated on the substrate and forming stairs in the connection region and extending and arranged over the memory region and the connection region with a folding structure in which the magnetic track layer is at least two villi-shaped to include a plurality of extended track layers two-dimensionally extending in one direction and at least two connecting track layers connecting two extended track layers among the plurality of extended track layers; a plurality of reading units including a plurality of fixed layers and a tunnel barrier layer arranged between the magnetic track layer and the plurality of fixed layers; and a plurality of bit lines extending with different ones of the plurality of reading units between the magnetic track layer and the plurality of bit lines, a plurality of connecting contact plugs connected to a pad track layer that is a part of one end of the magnetic track layer of the plurality of memory stacks in the connection region, and a common source line connected to the magnetic track layers of the plurality of memory stacks in the memory region opposite to the connection region in the first horizontal direction.

According to embodiments, there is also provided a memory device including a substrate including a memory region, a first connection region in a first horizontal direction of the memory region, and a second connection region in a second horizontal direction perpendicular to the first horizontal direction of the memory region, a plurality of memory stacks each including an etch stop layer laminated on the substrate while forming stairs in the first connection region and the second connection region; a magnetic track layer extending along an upper surface of the etch stop layer over the memory region and the first connection region with a folding structure in which the magnetic track layer is at least two villi-shaped to include a plurality of extended track layers two-dimensionally extending in one direction and at least two connecting track layers connecting two extended track layers among the plurality of extended track layers and having a plurality of magnetic domains; a plurality of reading units including a plurality of fixed layers and a tunnel barrier layer arranged between the magnetic track layer and the plurality of fixed layers; and a plurality of bit lines extending with different ones among the plurality of reading units between the magnetic track layer and the plurality of bit lines so as to form a magnetic tunnel junction (MTJ), a plurality of first connecting contact plugs connected to a pad track layer that is a part of one end of the magnetic track layer of the plurality of memory stacks in the first connection region, a common source line connected to the magnetic track layers of the plurality of memory stacks in the memory region opposite to the first connection region in the first horizontal direction, and a plurality of second connecting contact plugs connected to a partial bit line pad unit of a magnetic track layer that is a part of the bit line of the plurality of memory stacks in the second connection region.

According to embodiments, there is also provided a method of manufacturing a memory device, including providing a substrate including a memory region and a connection region in a first horizontal direction of the memory region, forming a plurality of memory stacks forming stairs in the connection region and laminated on the substrate, and forming a plurality of connecting contact plugs connected to the stairs of the plurality of memory stacks. Each of the plurality of memory stacks includes an etch stop layer on the substrate, a magnetic track layer extending along an upper surface of the etch stop layer over the memory region and the connection region with a folding structure in which the magnetic track layer is at least two villi-shaped to include a plurality of extended track layers two-dimensionally extending in one direction and at least two connecting track layers connecting two extended track layers among the plurality of extended track layers, a plurality of reading units including a plurality of fixed layers and a tunnel barrier layer arranged between the magnetic track layer and the plurality of fixed layers, and a plurality of bit lines extending with different ones among the plurality of reading units between the magnetic track layer and the plurality of bit lines. The forming of the plurality of connecting contact plugs includes forming a plurality of connecting contact holes exposing a part of the magnetic track layer of the plurality of memory stacks in the connection region and forming the plurality of connecting contact plugs filling the plurality of connecting contact holes and connected to a part of the magnetic track layer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 7A:
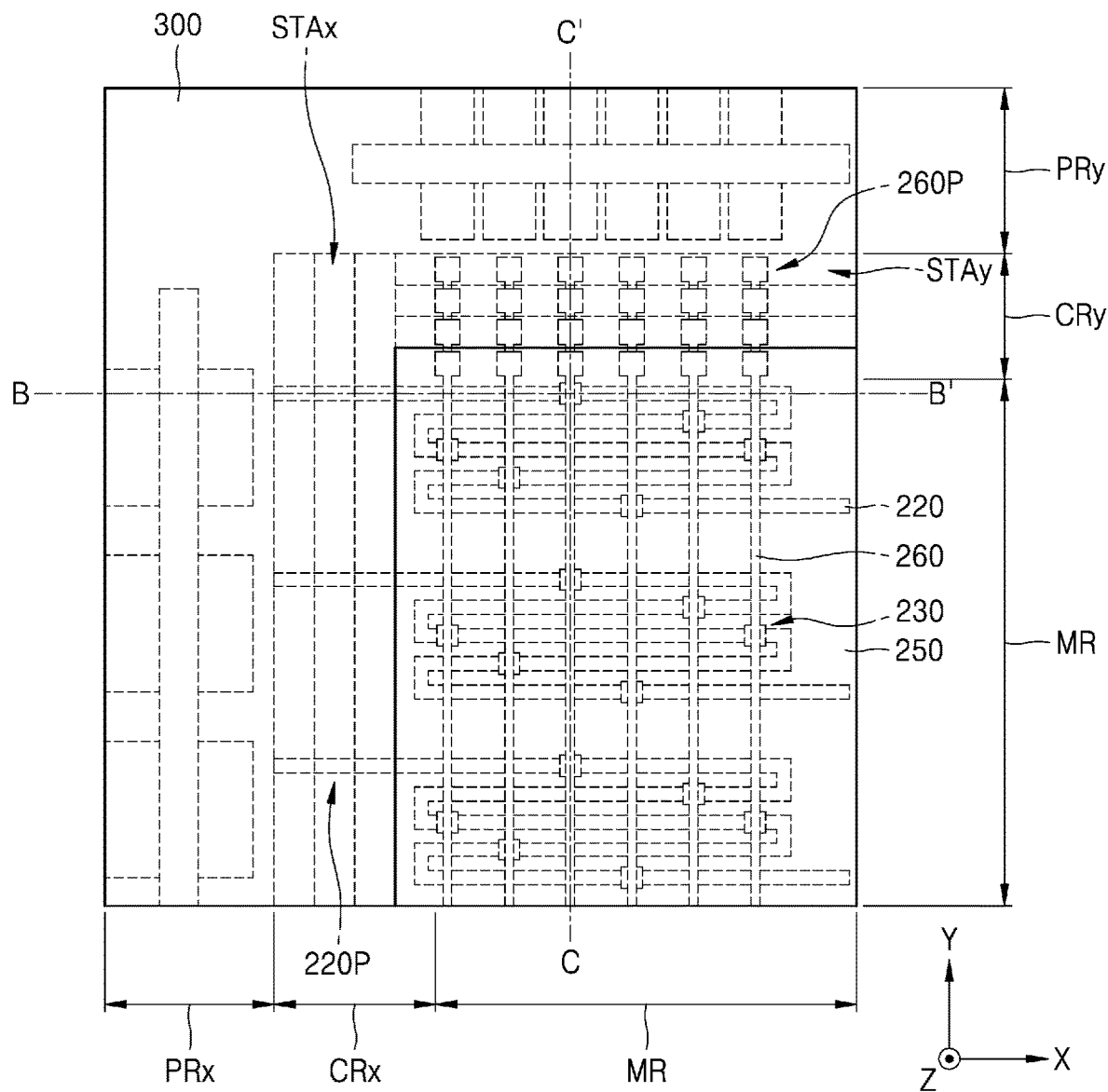
Figure 7B:
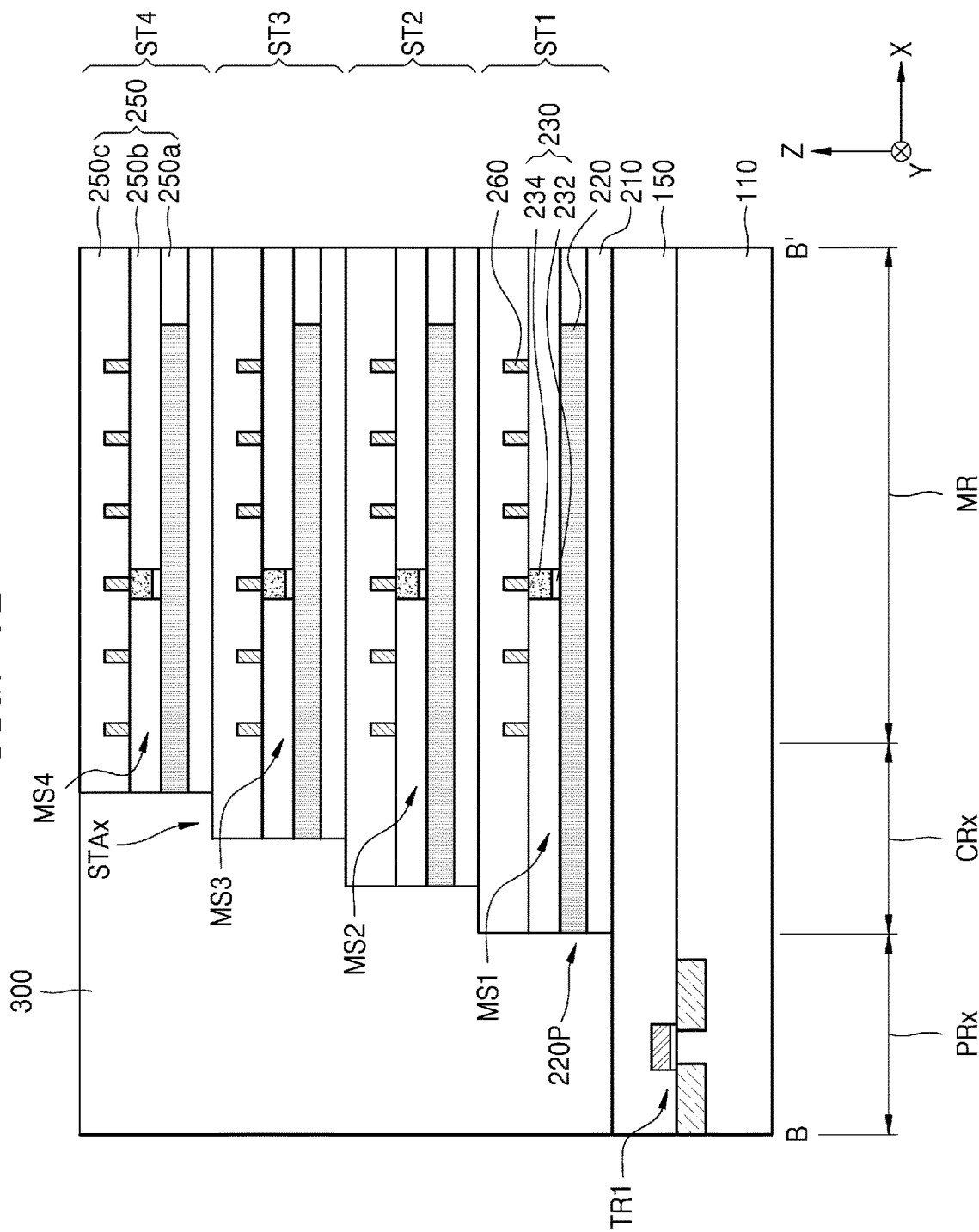
Figure 7C:
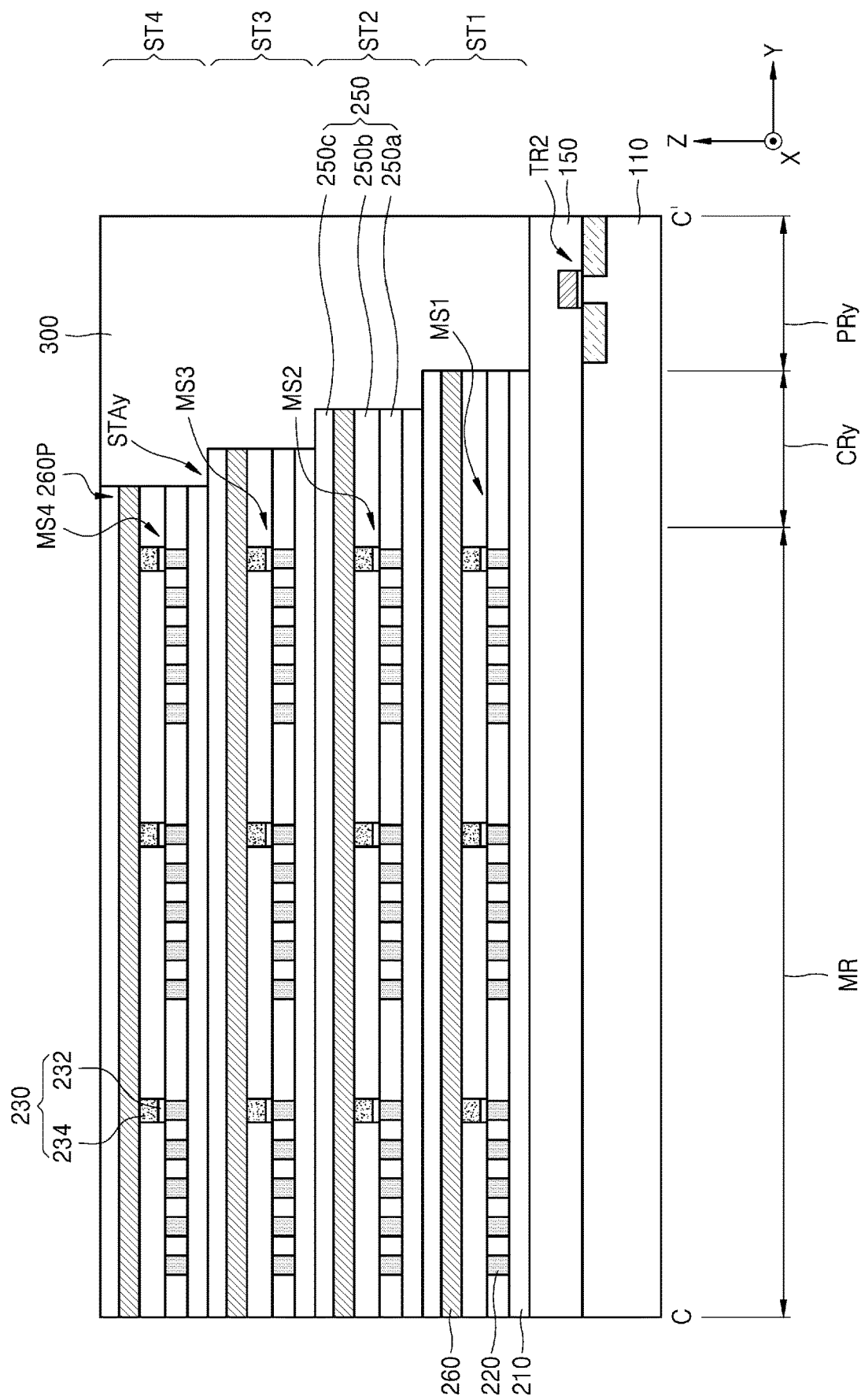
Figure 8A:
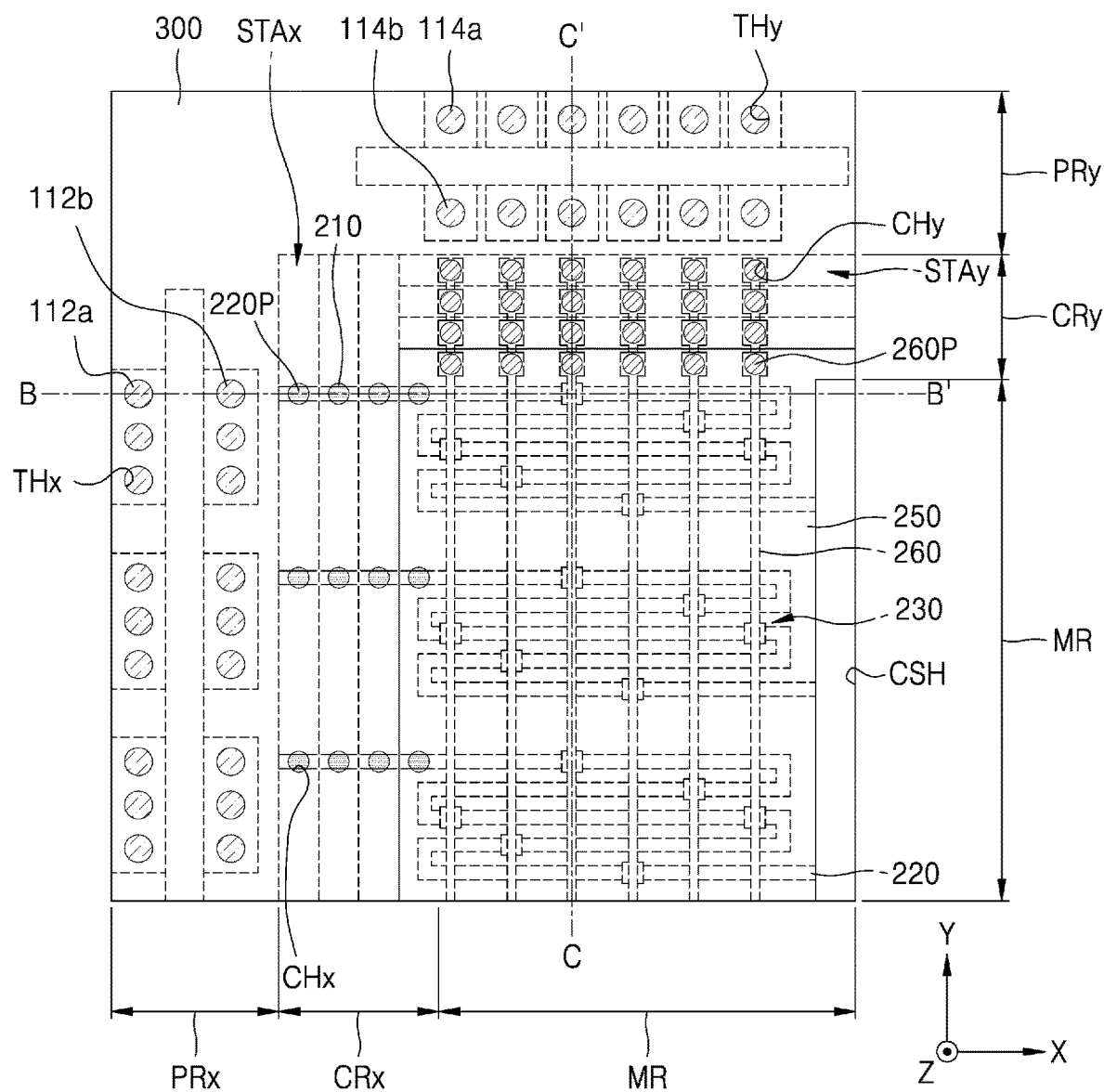
Figure 8B:
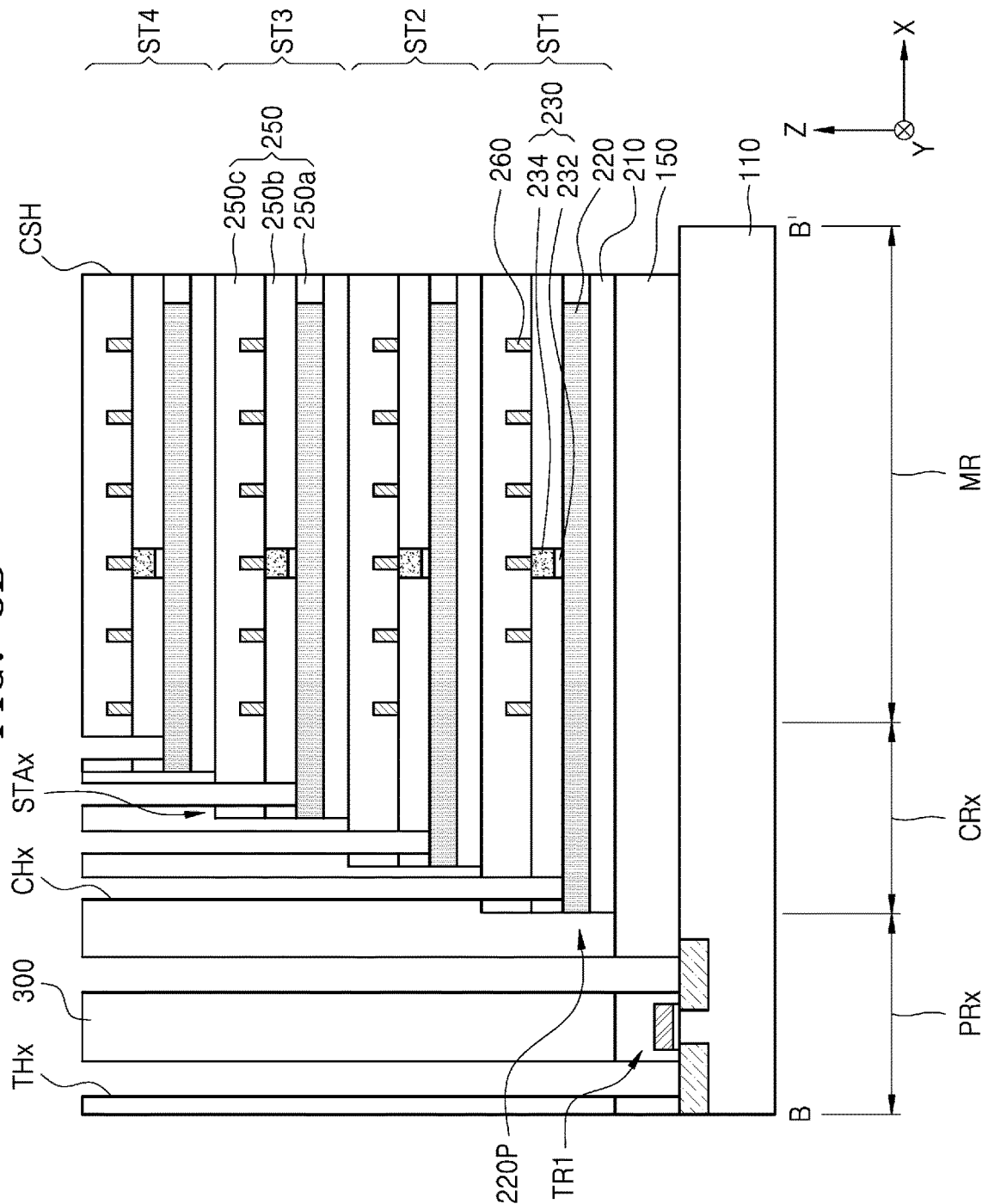
Figure 8C:
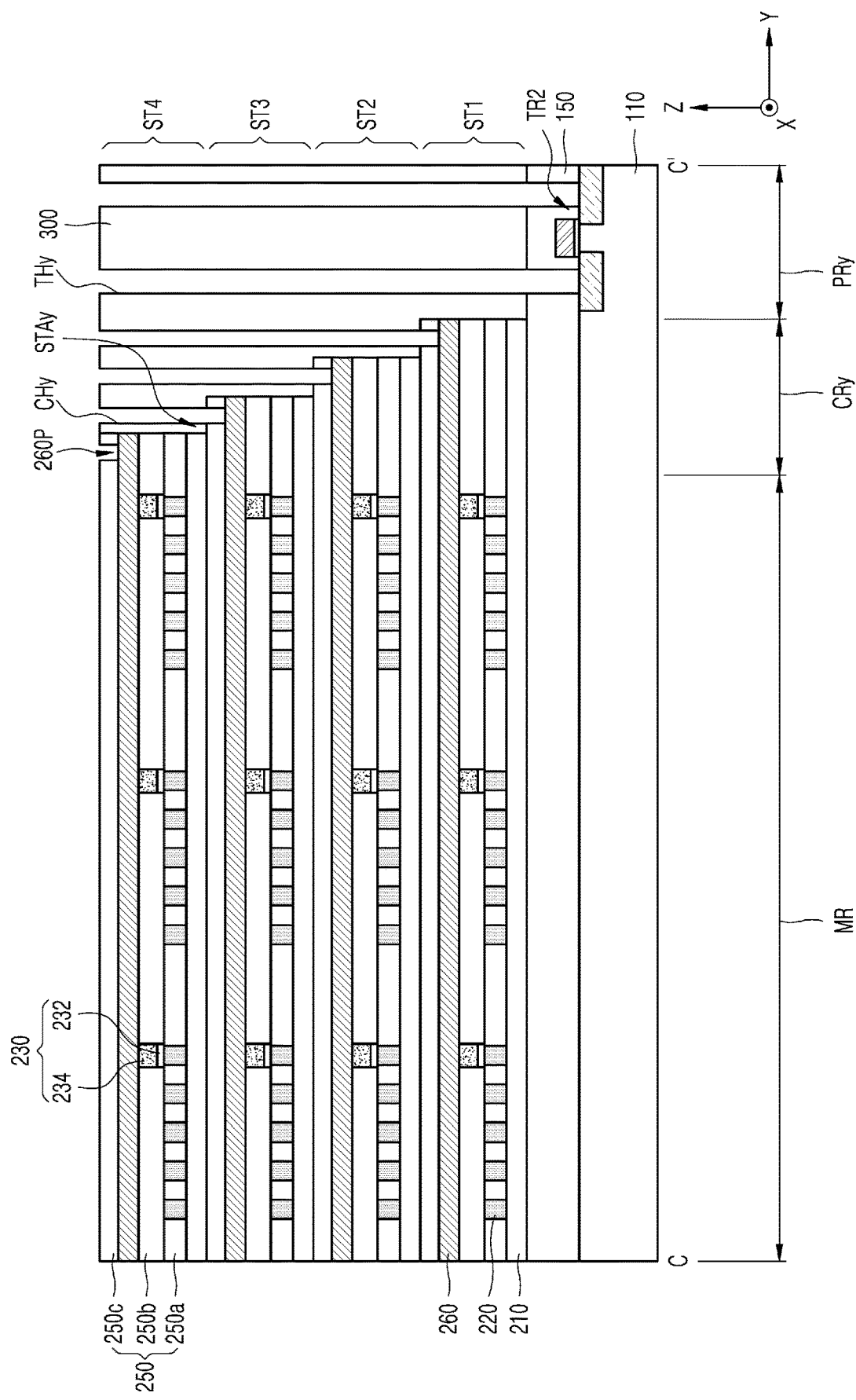
Figure 9A:
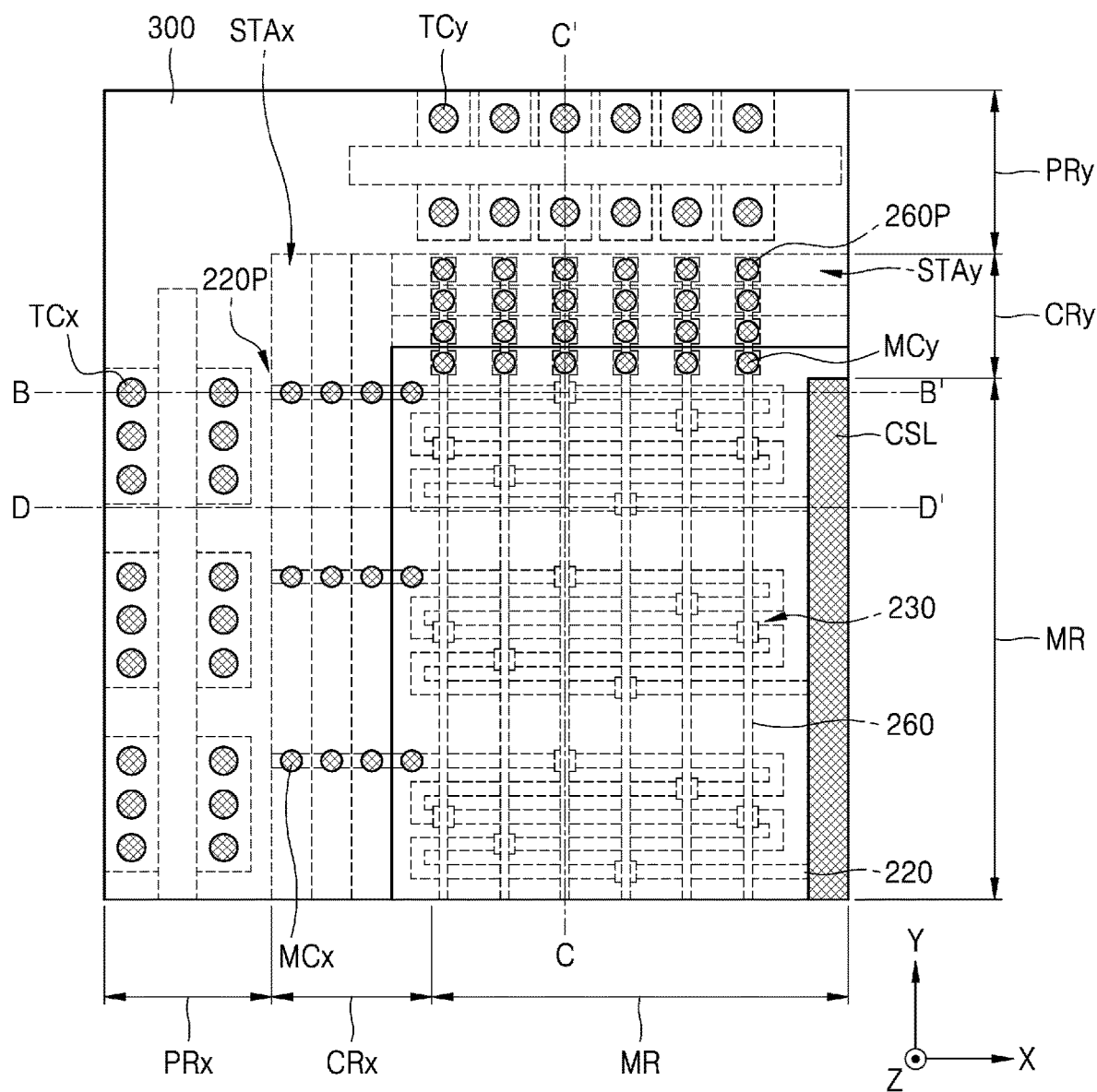
FIG. 9E is an enlarged cross-sectional view illustrating a portion in which a first connection contact plug is connected to a magnetic track layer.
Figure 9B:
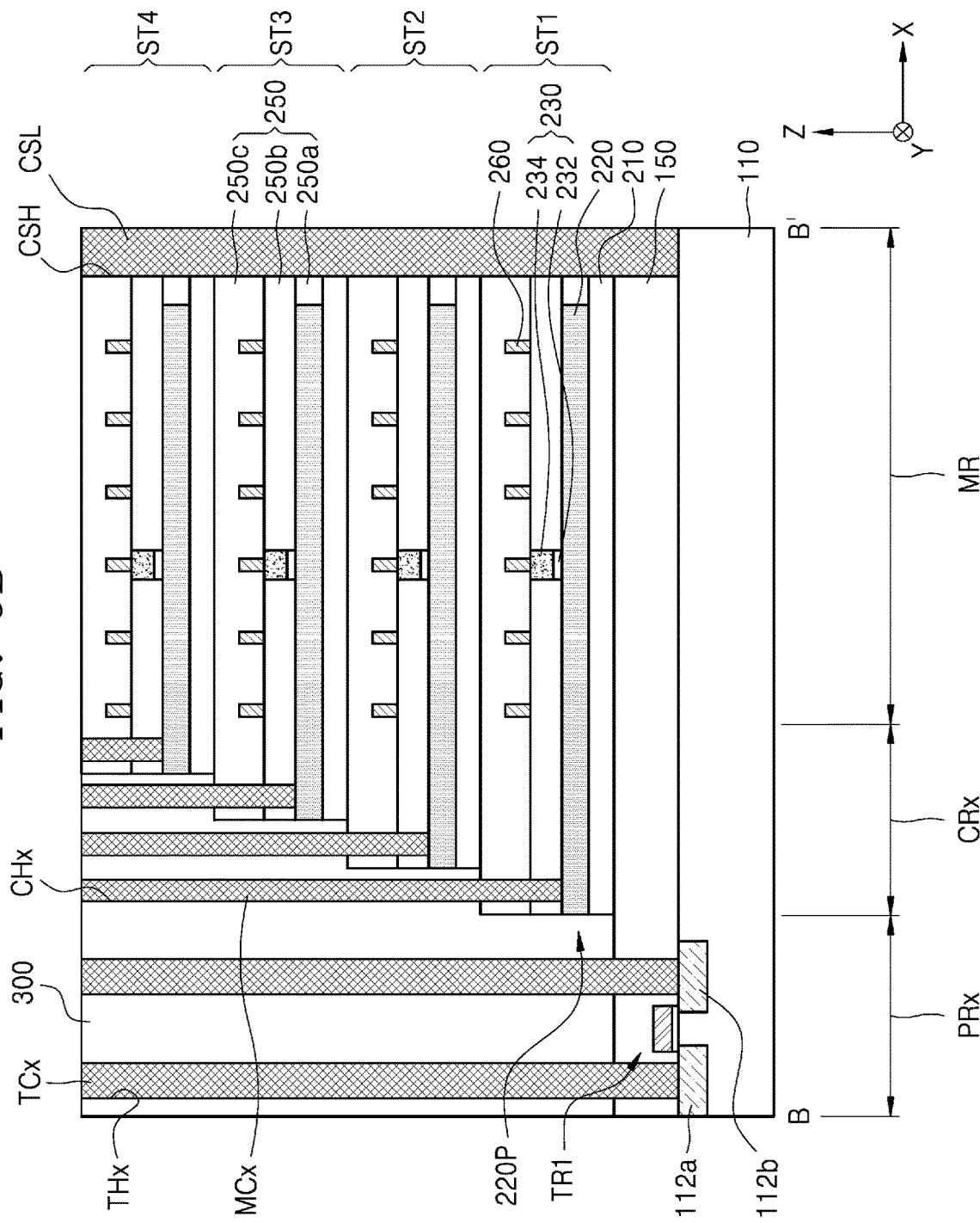
Figure 9C:
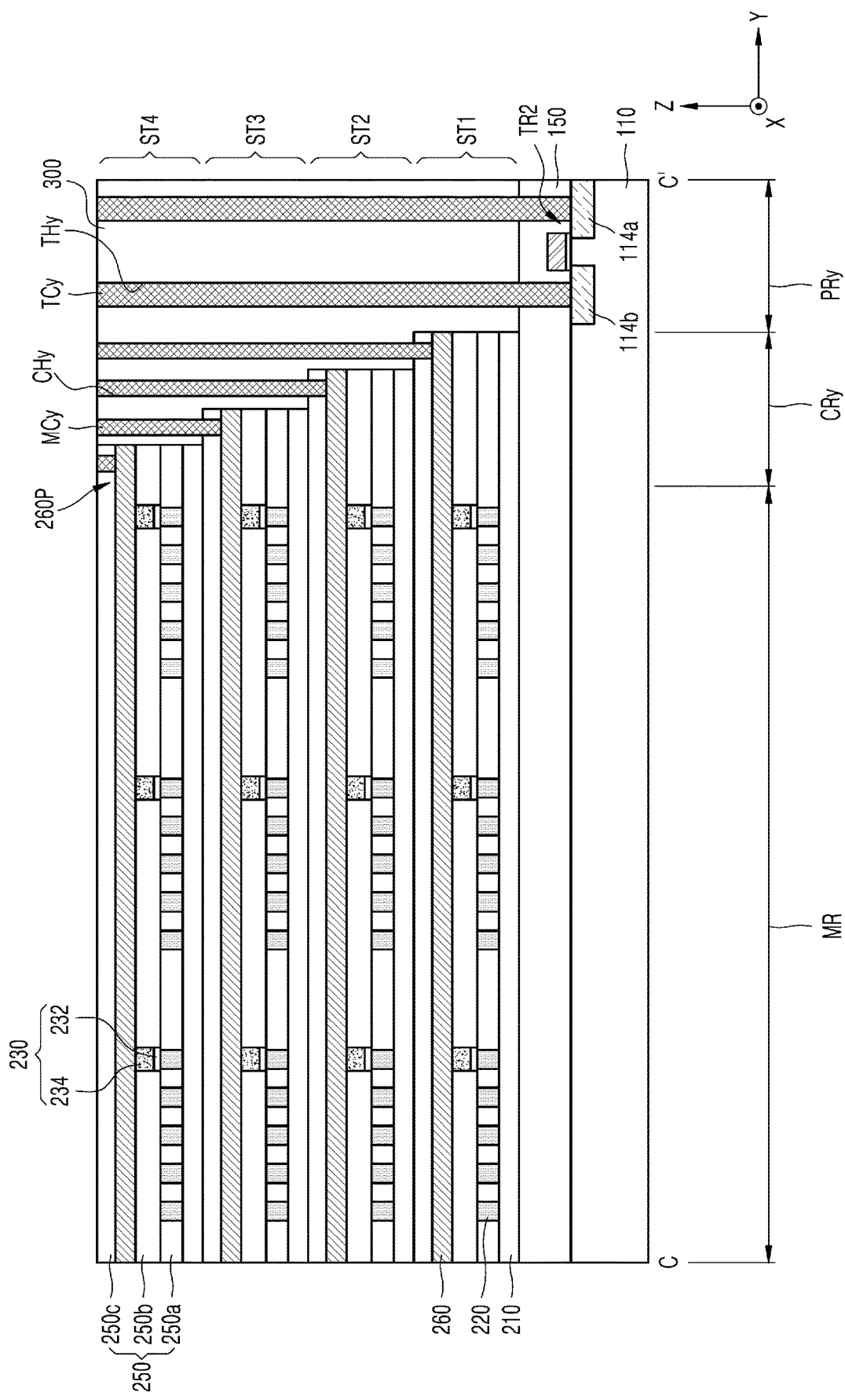
Figure 9E:
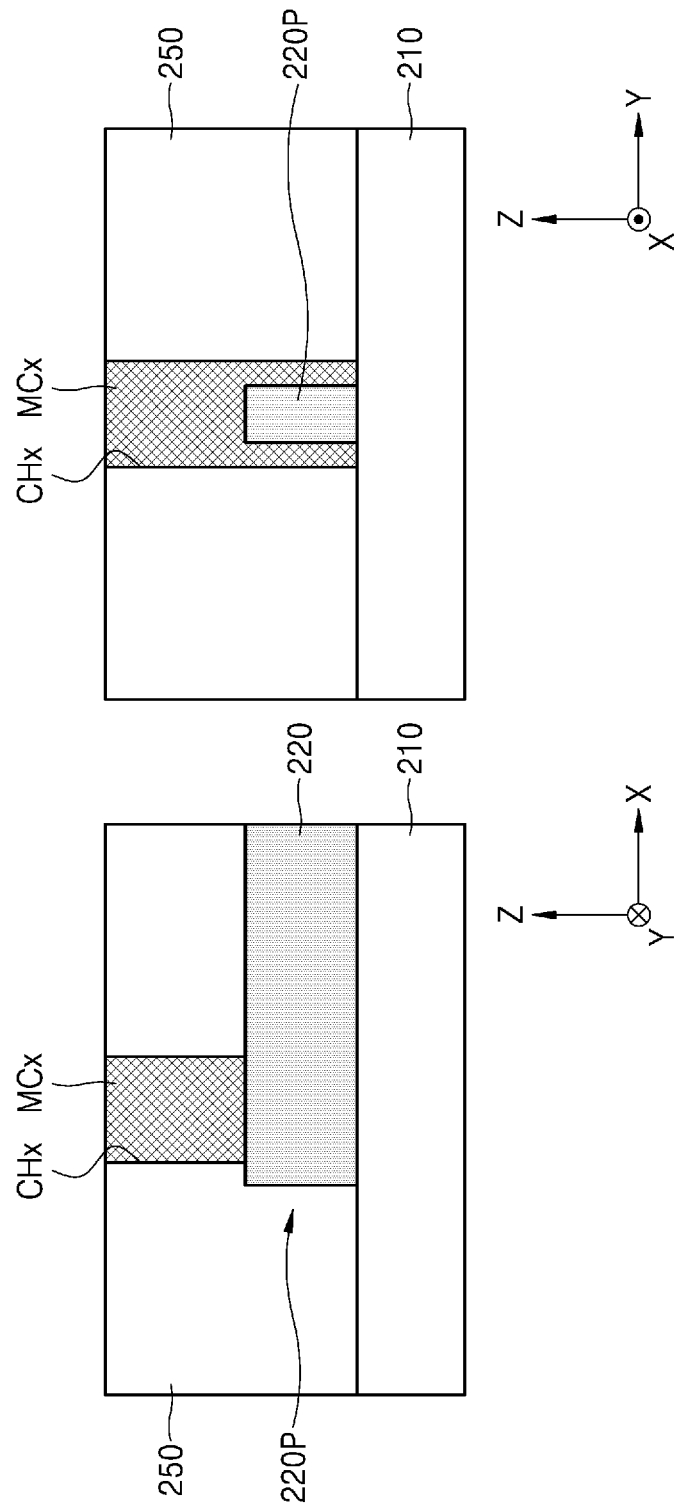

FIGS. 1A to 9D are plan views and cross-sectional views illustrating stages in a method of manufacturing a memory device according to embodiments, and FIG. 9E is an enlarged cross-sectional view illustrating a portion in which a first connection contact plug is connected to a magnetic track layer. Specifically, FIGS. 1A, 2A, 3A, 4A, 5A, 6A, 7A, 8A, and 9A are plan views illustrating stages in a method of manufacturing a memory device according to embodiments, and FIGS. 1B, 2B, 3B, 4B, 5B, 6B, 7B, 8B, and 9B are cross-sectional views taken along line B-B' of FIGS. 1A, 2A, 3A, 4A, 5A, 6A, 7A, 8A, and 9A, respectively, and FIGS. 1C, 2C, 3C, 4C, 5C, 6C, 7C, 8C, and 9C are cross-sectional views along line C-C' of FIGS. 1A, 2A, 3A, 4A, 5A, 6A, 7A, 8A, and 9A, respectively, and FIG. 9D is a cross-sectional view along line D-D' of FIG. 9A.

Figure 1A:
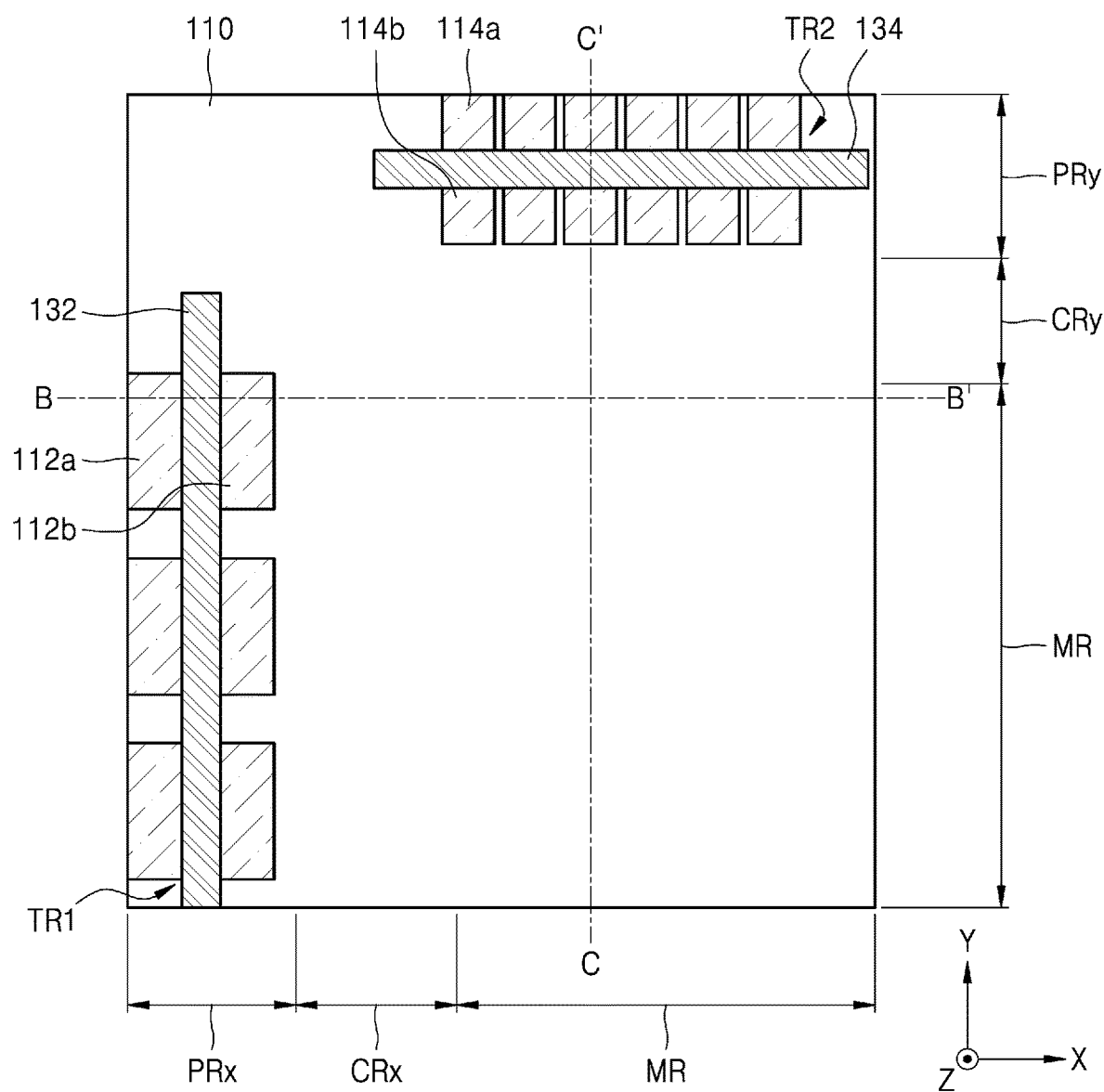
FIGS. 1A to 9D are plan views and cross-sectional views illustrating stages in a method of manufacturing a memory device according to embodiments.
Figure 1B:
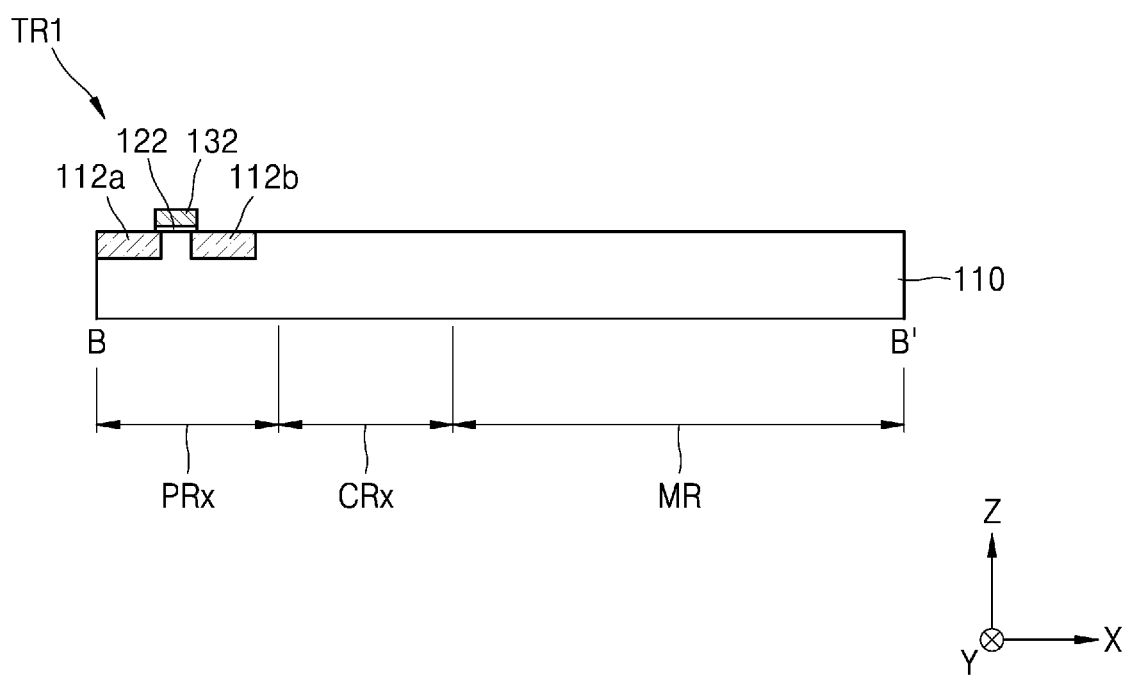
Figure 1C:
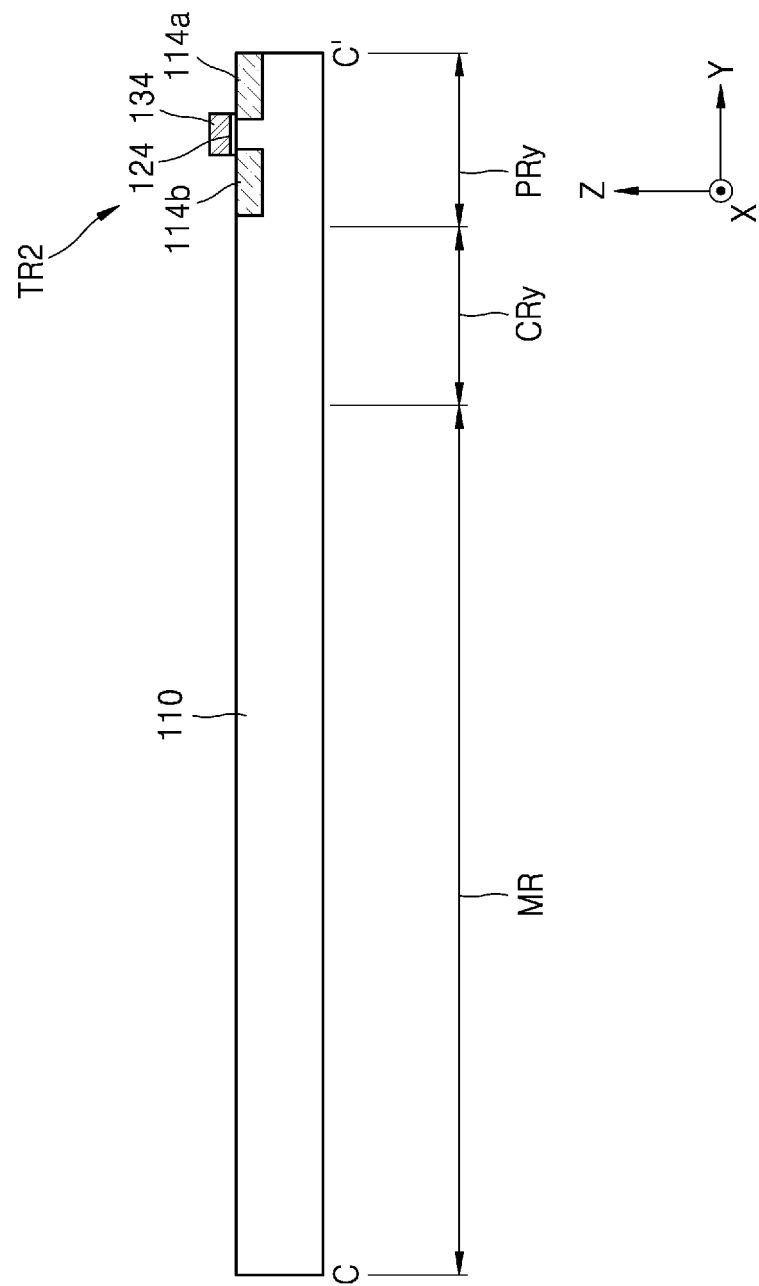

Referring to FIGS. 1A to 1C, a substrate 110 with a memory region MR, a first peripheral circuit region PRx, a second peripheral circuit region PRy, a first connection region CRx between the memory region MR and the first peripheral circuit region PRx, and a second connection region CRy between the memory region MR and the second peripheral circuit region PRy is provided.

In some embodiments, the memory region MR may be two-dimensionally rectangular. The first connection region CRx and the first peripheral circuit region PRx may be positioned in a first horizontal direction (X direction) based on the memory region MR, and the second connection region CRy and the second peripheral circuit region PRy may be positioned in a second horizontal direction (Y direction) perpendicular to the first horizontal direction based on the memory region MR. The first connection region CRx and the second connection region CRy may be referred to as a connection region, and the first peripheral circuit region PRx and the second peripheral circuit region PRy may be referred to as a peripheral circuit region. The connection region may be between the memory region MR and the peripheral circuit region.

For example, the substrate 110 may include a semiconductor material, e.g., silicon (Si) or germanium (Ge). In another example, the substrate 110 may include a compound semiconductor, e.g., silicon carbide (SiC), gallium arsenide (GaAs), indium arsenide (InAs), or indium phosphide (InP). The substrate 110 may include an active surface and an inactive surface opposite to the active surface. The substrate 110 may include a conductive region, e.g., a well doped with impurities in the active surface. The substrate 110 may have each of various isolation structures, e.g., a shallow trench isolation (STI) structure in the active surface.

A plurality of first driving elements TR1 may be formed in the first peripheral circuit region PRx, and a plurality of second driving elements TR2 may be formed in the second peripheral circuit region PRy. For example, the first driving elements TR1 may be recording elements, and the second driving elements TR2 may be selective elements.

Each of the plurality of first driving elements TR1 may include a first gate insulating layer 122 formed on the substrate 110, a first gate electrode 132 covering the first gate insulating layer 122, and a first source region 112a and a first drain region 112b formed in the substrate 110 with the first gate electrode 132 therebetween. Each of the plurality of second driving elements TR2 may include a second gate insulating layer 124 formed on the substrate 110, a second gate electrode 134 covering the second gate insulating layer 124, and a second source region 114a and a second drain region 114b formed in the substrate 110 with the second gate electrode 134 therebetween. Around the plurality of first driving elements TR1 and the plurality of second driving elements TR2, the isolation structure may be formed.

In FIGS. 1A to 1C, it is exemplarily illustrated that the plurality of first and second driving elements TR1 and TR2 are transistors. However, at least some of the plurality of first driving elements TR1 and the plurality of second driving elements TR2 may include diodes or ovonic threshold switching (OTS) elements.

Figure 2A:
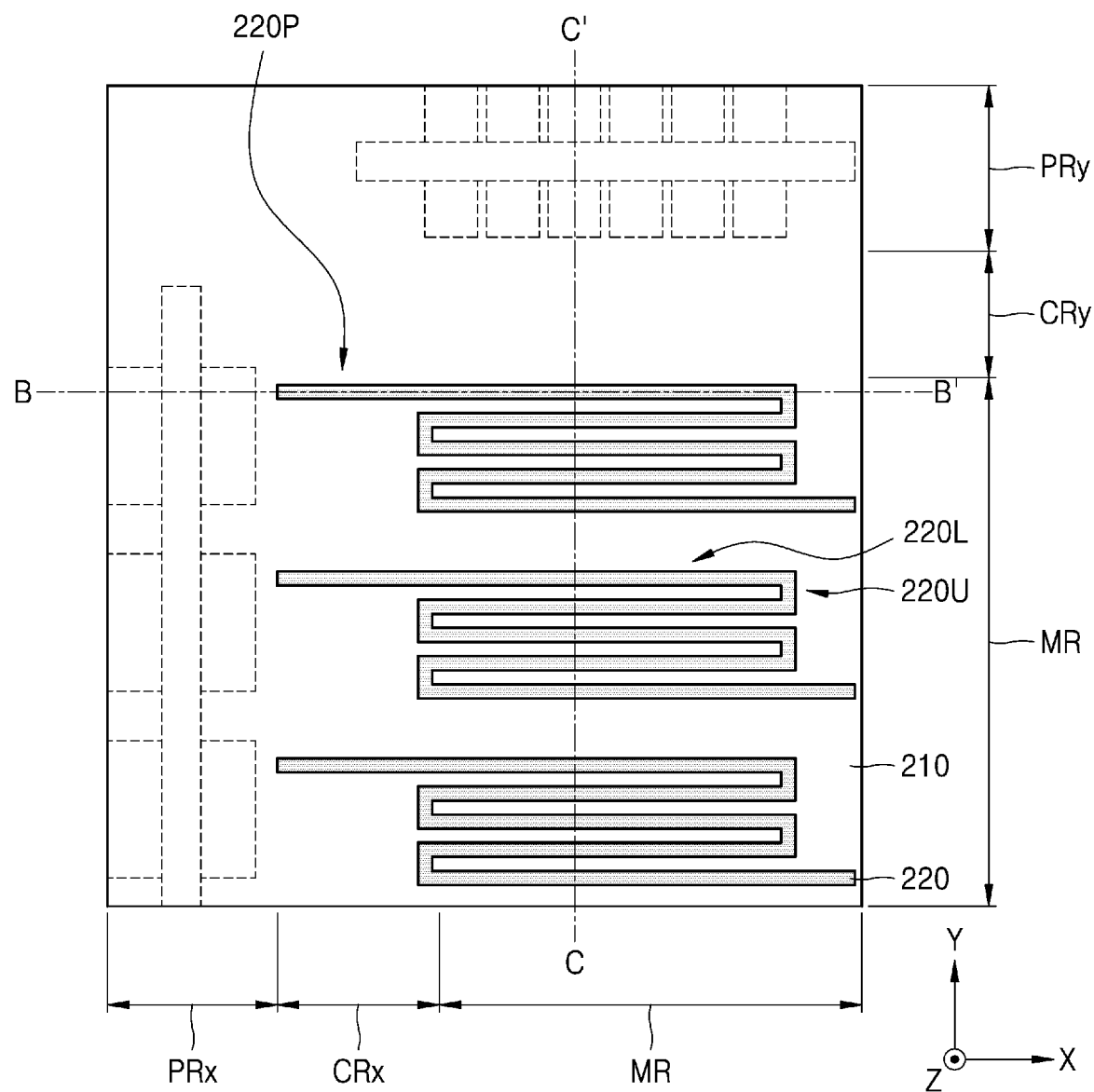
Figure 2B:
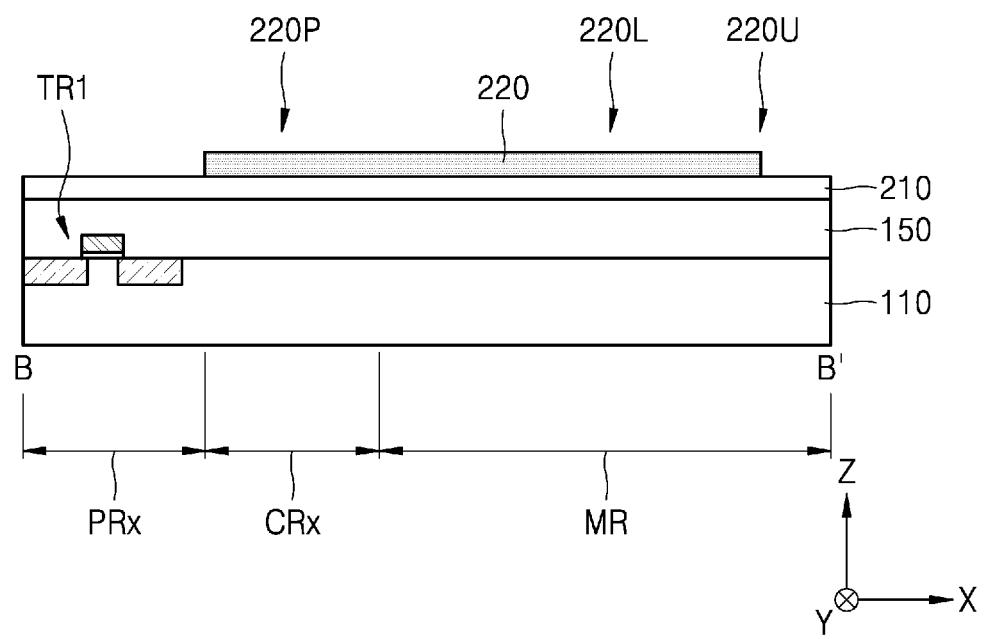
Figure 2C:
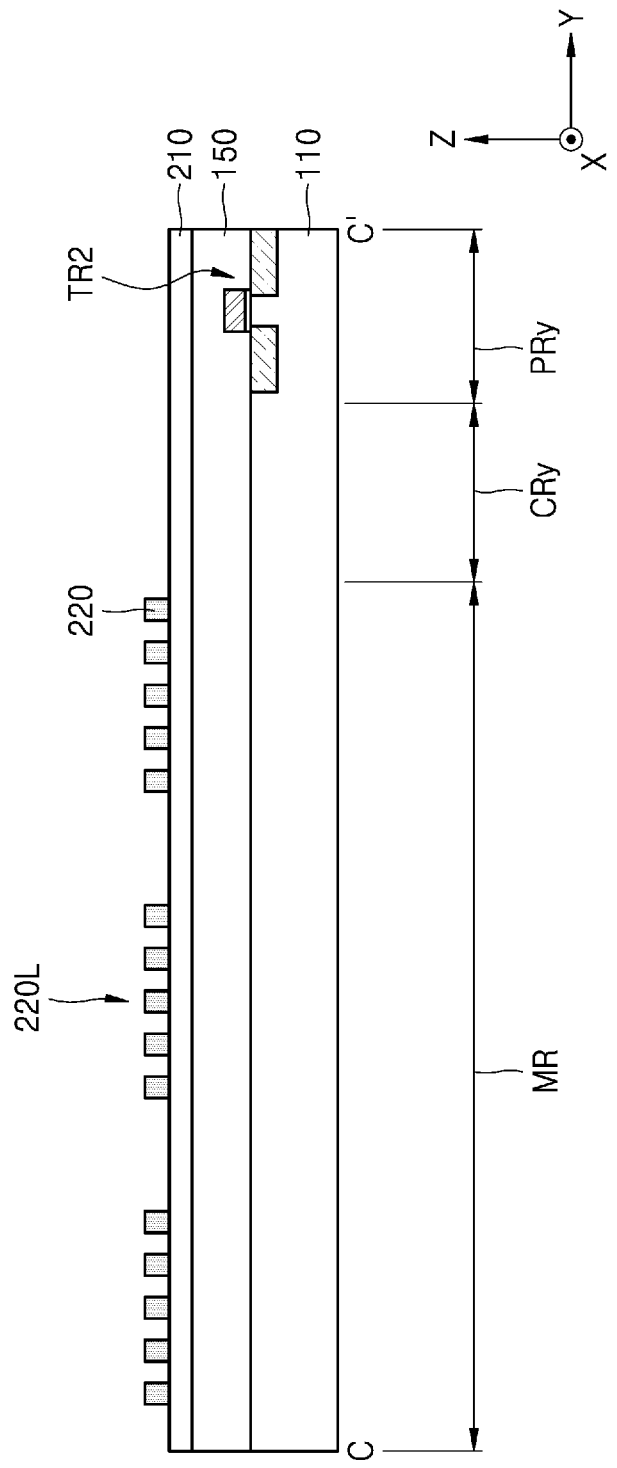

Referring to FIGS. 2A to 2C, a base insulating layer 150 covering the plurality of first driving elements TR1 and the plurality of second driving elements TR2 and an etch stop layer 210 may be formed on the substrate 110. The base insulating layer 150 may be formed of oxide. However, embodiments are not limited thereto. In some embodiments, the etch stop layer 210 may be formed of silicon nitride or aluminum oxide. However, embodiments are not limited thereto.

A plurality of magnetic track layers 220 may be formed on the etch stop layer 210. The plurality of magnetic track layers 220 may be formed by forming a magnetic material layer on the etch stop layer 210 and patterning the magnetic material layer. An etching process of forming the plurality of magnetic track layers 220 by patterning the magnetic material layer may be performed so that the etch stop layer 210 is exposed. In some embodiments, each of the plurality of magnetic track layers 220 may be formed over the memory region MR and the first connection region CRx. In some embodiments, each of the plurality of magnetic track layers 220 may extend along an upper surface of the etch stop layer 210 with a uniform horizontal width. The plurality of magnetic track layers 220 may be referred to as racetracks. In the memory region MR, each of the plurality of magnetic track layers 220 may have a two-dimensionally villi-shaped folded structure. In the memory region MR, each of the plurality of magnetic track layers 220 may include extended, e.g., linearly-shaped, track layers 220L and connecting track layers 220U, e.g., perpendicular to the track layers 220L, connected to the extended track layers 220L. In the first connection region CRx, each of the plurality of magnetic track layers 220 may include a pad track layer 220P extended, e.g., colinearly, from the extended track layer 220L. In some embodiments, the extended track layers 220L and the pad track layer 220P may extend in the first horizontal direction (the X direction).

Two extended track layers 220L and a connecting track layer 220U connecting the two extended track layers 220L may be two-dimensionally U-shaped. In some embodiments, in the memory region MR, each of the plurality of magnetic track layers 220 may have a folding structure including at least two villus formed of a plurality of extended track layers 220L and at least two connecting track layers 220U connecting the plurality of extended track layers 220L, e.g., each of the plurality of magnetic track layers 220 may include multiple extended track layers 220L and multiple connecting track layers 220U that combine into at least two U shapes adjacent to each other (e.g., in the Y direction) and connected to each other at one side. In the magnetic track layer 220, each villus-shaped protrusion, i.e., the connecting track layer 220U, is provided in the first horizontal direction (the X direction) or in a reverse direction of the first horizontal direction (the X direction). However, in the magnetic track layer 220a illustrated in FIG. 11A, each villus-shaped protrusion may be provided in a second horizontal direction (the Y direction) or in a reverse direction of the second horizontal direction (the Y direction).

Each of the plurality of magnetic track layers 220 may extend from one end of the first connection region CRx to the other end positioned in the memory region MR opposite to the first connection region CRx in the first horizontal direction (the X direction). For example, as illustrated in FIGS. 2A and 2B, a first end of each of the magnetic track layers 220 may be in the first peripheral circuit region PRx or the first connection region CRx, and a second end of each of the magnetic track layers 220 may be (opposite the first end) in the memory region MR, e.g., at an edge of the memory region MR opposite to the first connection region CRx. For example, as illustrated in FIGS. 2A and 2B, each of the magnetic track layers 220 may extend along an entire length of the memory region MR in the first horizontal direction (the X direction). Each of the plurality of magnetic track layers 220 with the folding structure in which villus are provided twice may extend from the one end to the other end.

Each of the plurality of magnetic track layers 220 may include a free layer. The free layer may include at least one of a vertical magnetic material, a vertical magnetic material with an L10 structure, a CoPt alloy with a dense hexagonal close packed lattice structure, and a vertical laminate. The vertical magnetic material may include at least one of iron (Fe), nickel (Ni), platinum (Pt), palladium (Pd), boron (B), tantalum (Ta), tungsten (W), iridium (Ir), and cobalt (Co), e.g., at least one of CoFeB, CoFeTb, CoFeGd, and CoFeDy. For example, the vertical magnetic material with the L10 structure may be at least one of $Fe_{50}Pt_{50}$, $Fe_{50}Pd_{50}$, $Co_{50}Pt_{50}$, $Co_{50}Pd_{50}$ and $Fe_{50}Ni_{50}$.

In some embodiments, each of the plurality of magnetic track layers 220 may have a synthetic antiferromagnet (SAF) structure. For example, each of the plurality of magnetic track layers 220 may have a laminated structure of a first material layer, a second material layer, and a third material layer, the first material layer and the third material layer may include a ferromagnetic material, and the second material layer may include a non-magnetic material.

For example, the first material layer and the third material layer may include a vertical laminate with vertical magnetic anisotropy. The vertical laminate may include a laminated structure in which ferromagnetic layers are alternately and repeatedly arranged or a laminated structure in which a ferromagnetic layer and a non-magnetic layer are alternately and repeatedly arranged. For example, the vertical laminate may include at least one of a (Co/Pt)n laminated structure, a (CoFe/Pt)n laminated structure, a (CoFe/Pd)n laminated structure, a (Co/Pd)n laminated structure, a (Co/Ni)n laminated structure, a (CoNi/Pt)n laminated structure, a (CoCr/Pt)n laminated structure, and a (CoCr/Pd)n laminated structure (here, n is a natural number). The second material layer may include a material to enable Ruderman-Kittel-Kasuya-Yosida (RKKY) coupling among ferromagnetic layers, e.g., at least one of ruthenium (Ru), Ir, and rhodium (Rh).

In some embodiments, each of the plurality of magnetic track layers 220 may further include a seed layer and a spin orbit torque (SOT) induction layer between the etch stop layer 210 and the free layer. The seed layer may include at least one of a non-magnetic metal material, e.g., at least one of chromium (Cr), Ru, or Ta, a non-magnetic compound, e.g., cobalt gallium (CoGa) or manganese gallium nitride (MnGaN), and a non-magnetic alloy, e.g., nickel aluminum (NiAl). The SOT induction layer may include at least one non-magnetic metal material, e.g., at least one of W, Pt, Ta, hafnium (Hf), rhenium (Re), Ir, gold (Au), silver (Ag), titanium (Ti), and copper (Cu). In addition, the SOT induction layer may include at least one topological insulating material, e.g., bismuth telluride ($Bi_2Te_3$), bismuth selenide ($Bi_2Se_3$), antimony telluride ($Sb_2Te_3$), molybdenum sulfide ($MoS_2$), molybdenum telluride ($MoTe_2$), tungsten sulfide ($WS_2$), and tungsten telluride ($WTe_2$). The topological insulating material may commonly indicate a material of which the inside has insulation due to crystallographic regularity and a portion adjacent to a surface thereof has conductivity.

Figure 3A:
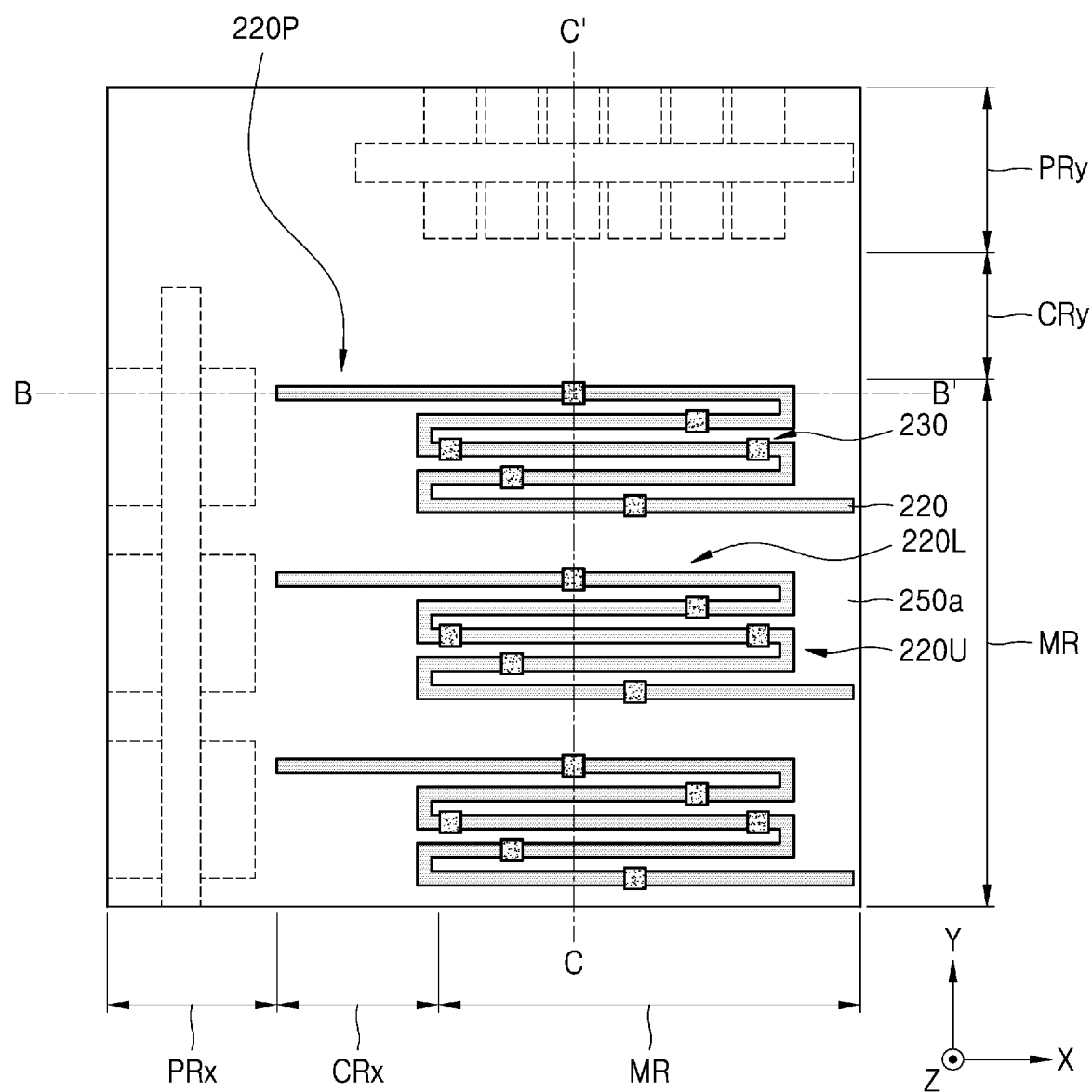
Figure 3B:
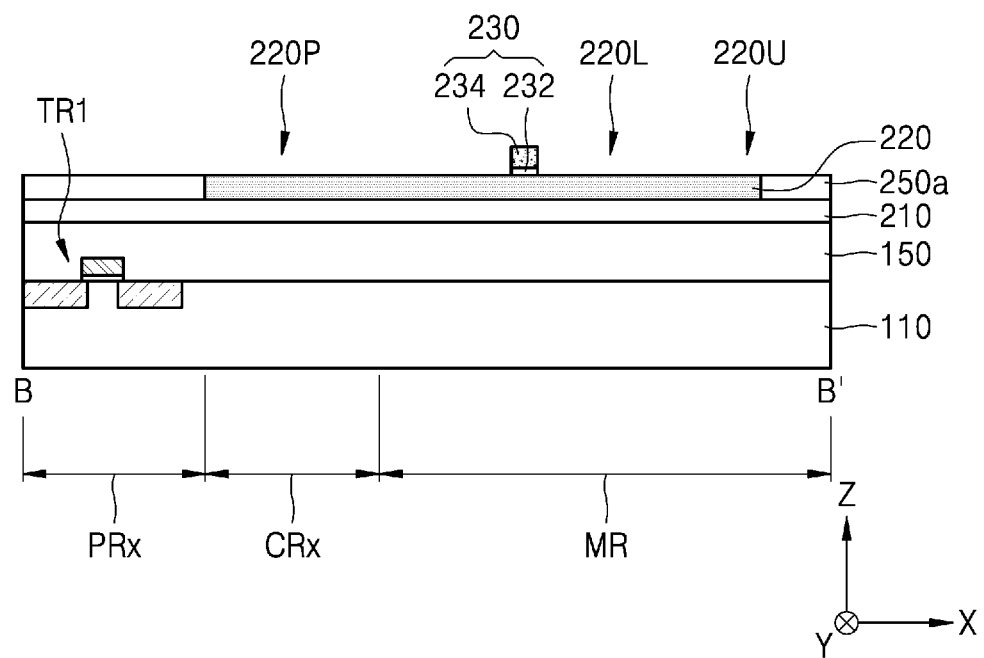
Figure 3C:
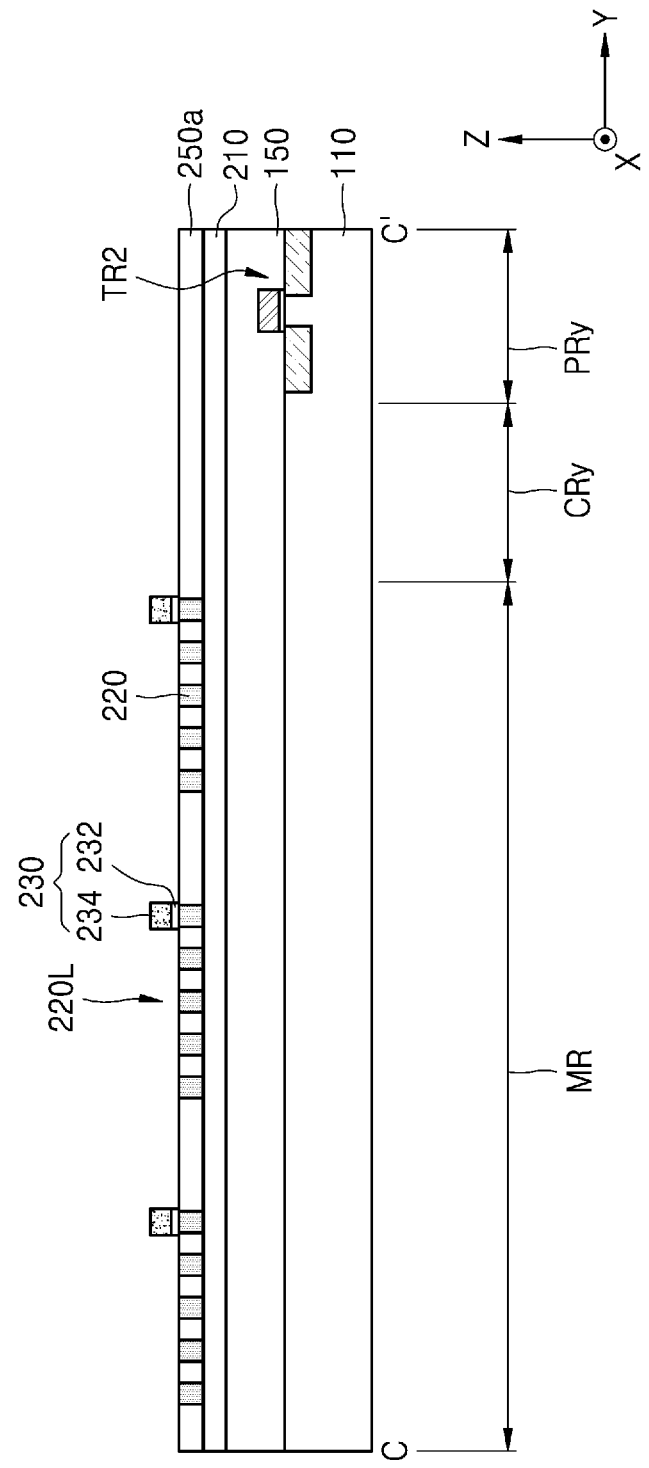

Referring to FIGS. 3A to 3C, on the etch stop layer 210, a first interlayer insulating layer 250a surrounding the plurality of magnetic track layers 220 may be formed. The first interlayer insulating layer 250a may be formed of e.g., oxide. However, embodiments are not limited thereto. The first interlayer insulating layer 250a may cover side surfaces of the plurality of magnetic track layers 220 and may expose at least parts of upper surfaces of the plurality of magnetic track layers 220. In some embodiments, an upper surface of the first interlayer insulating layer 250a may be coplanar with the upper surfaces of the plurality of magnetic track layers 220.

On different parts on the upper surface of each of the plurality of magnetic track layers 220, a plurality of reading units 230 may be arranged. The reading unit 230 may include a tunnel barrier layer 232 and a fixed layer 234 formed on the magnetic track layer 220.

The plurality of reading units 230 may be arranged on parts of each of the plurality of magnetic track layers 220 arranged in the memory region MR and may not be arranged on parts of each of the plurality of magnetic track layers 220 arranged in the first connection region CRx, i.e., the plurality of reading units 230 may not be arranged on the pad track layers 220P. In FIG. 3A, the plurality of reading units 230 are illustrated as being arranged only on each of the extended track layers 220L. However, embodiments are not limited thereto, e.g., some of the plurality of reading units 230 may be arranged on each of the connecting track layers 220U.

Each of the plurality of reading units 230 may have a horizontal width, e.g., along the Y direction, greater than that of the magnetic track layer 220, as illustrated in FIGS. 3A and 3C. In some embodiments, each of the plurality of reading units 230 may be formed over a part of the upper surface of the magnetic track layer 220 and a part of the upper surface of the first interlayer insulating layer 250a, e.g., a part of the reading unit 230 may extend along the second horizontal direction (Y direction) beyond the upper surface of the magnetic track layer 220 to overlap a part of the upper surface of the first interlayer insulating layer 250a.

The tunnel barrier layer 232 may include a non-magnetic insulating material. In some embodiments, the tunnel barrier layer 232 may include an oxide, e.g., of at least one of magnesium (Mg), Ti, Al, magnesium-zinc (MgZn), or magnesium-boron (MgB), or a nitride, e.g., of at least one of Ti or vanadium (V). For example, the tunnel barrier layer 232 may be a magnesium oxide (MgO) layer or a magnesium-aluminum oxide (MgAlO) layer. In other embodiments, the tunnel barrier layer 232 may include a plurality of layers. For example, the tunnel barrier layer 232 may have a laminated structure such as Mg/MgO, MgO/Mg, MgO/MgAlO, MgAlO/MgO, Mg/MaAlO/Mg, MgO/MgAlO/MgO, or MgAlO/MgO/MaAlO.

In some embodiments, the tunnel barrier layer 232 may have a NaCl crystal structure (e.g., a face-centered cubic lattice structure).

For example, the fixed layer 234 may include at least one of Fe, Co, Ni, Pd, and Pt. In some embodiments, the fixed layer 234 may be formed of a Co-M1 alloy (here, M1 is at least one metal of Pt, Pd, and Ni) or an Fe-M2 alloy (here, M2 is at least one metal of Pt, Pd, and Ni). In other embodiments, the fixed layer 234 may further include at least one of B, carbon (C), Cu, Ag, Au, Ru, Ta, and Cr. In some embodiments, the fixed layer 234 may include a material with perpendicular magnetic anisotropy (PMA). However, embodiments are not limited thereto.

The magnetic track layer 220 may be arranged to contact the reading unit 230, and one magnetic domain that is a part of the free layer included in the magnetic track layer 220 vertically overlapping the reading unit 230 may form a magnetic tunnel junction (MTJ) together with the reading unit 230. For example, a resistance value of the MTJ may vary in accordance with magnetization directions of the fixed layer 234 and the magnetic domain of the magnetic track layer 220. For example, when the magnetization directions of the fixed layer 234 and the magnetic domain of the magnetic track layer 220 are antiparallel, the MTJ may have a high resistance value and may store data '1'. When the magnetization directions of the fixed layer 234 and the magnetic domain of the magnetic track layer 220 are parallel, the MTJ may have a low resistance value and may store data '0'.

On the magnetic track layer 220, intervals among the plurality of reading units 230 may have uniform or similar values, which will be described in detail with reference to FIG. 10D.

Figure 4A:
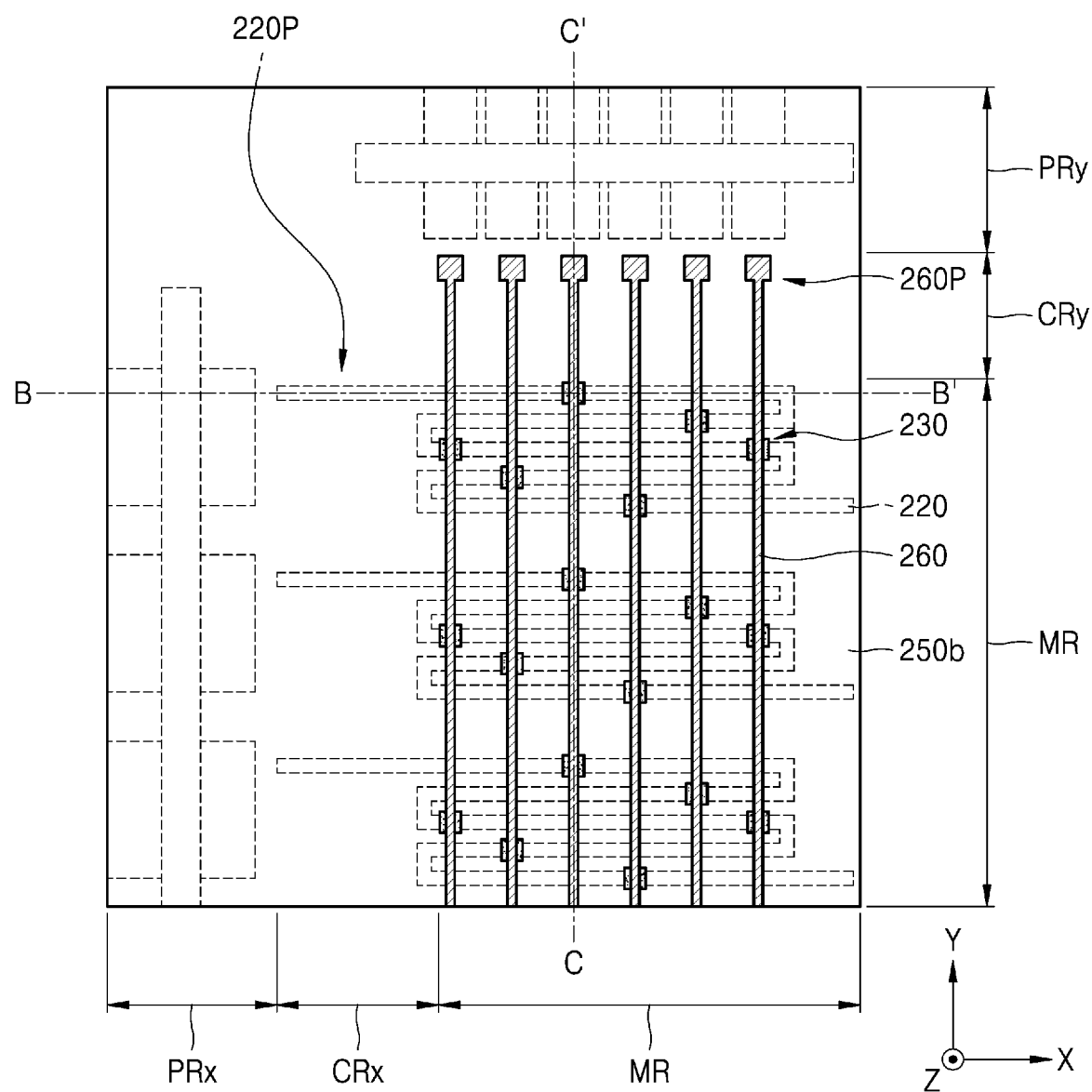
Figure 4B:
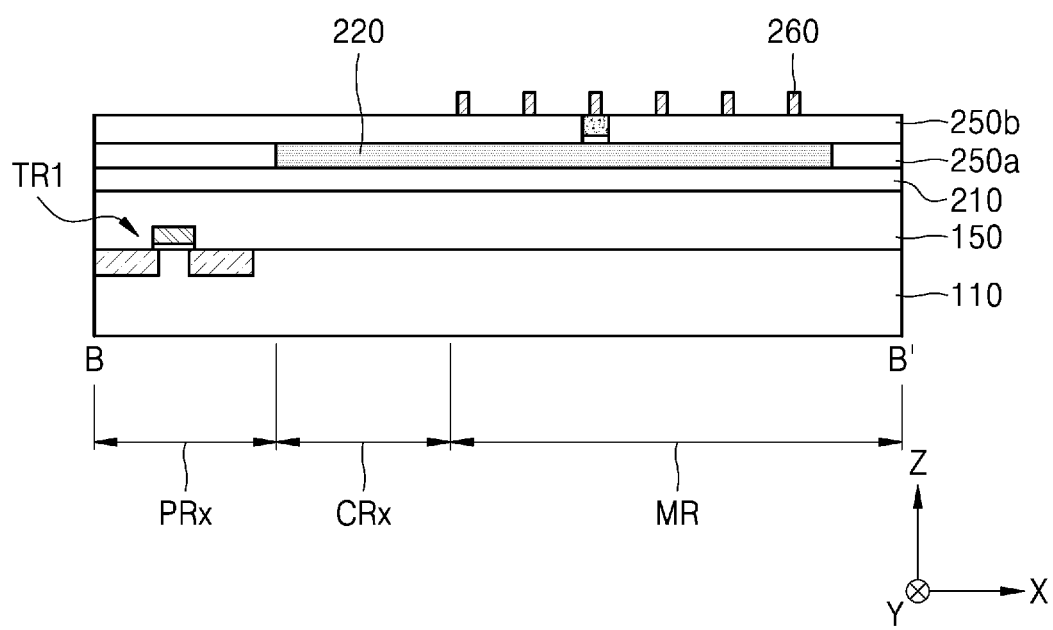
Figure 4C:
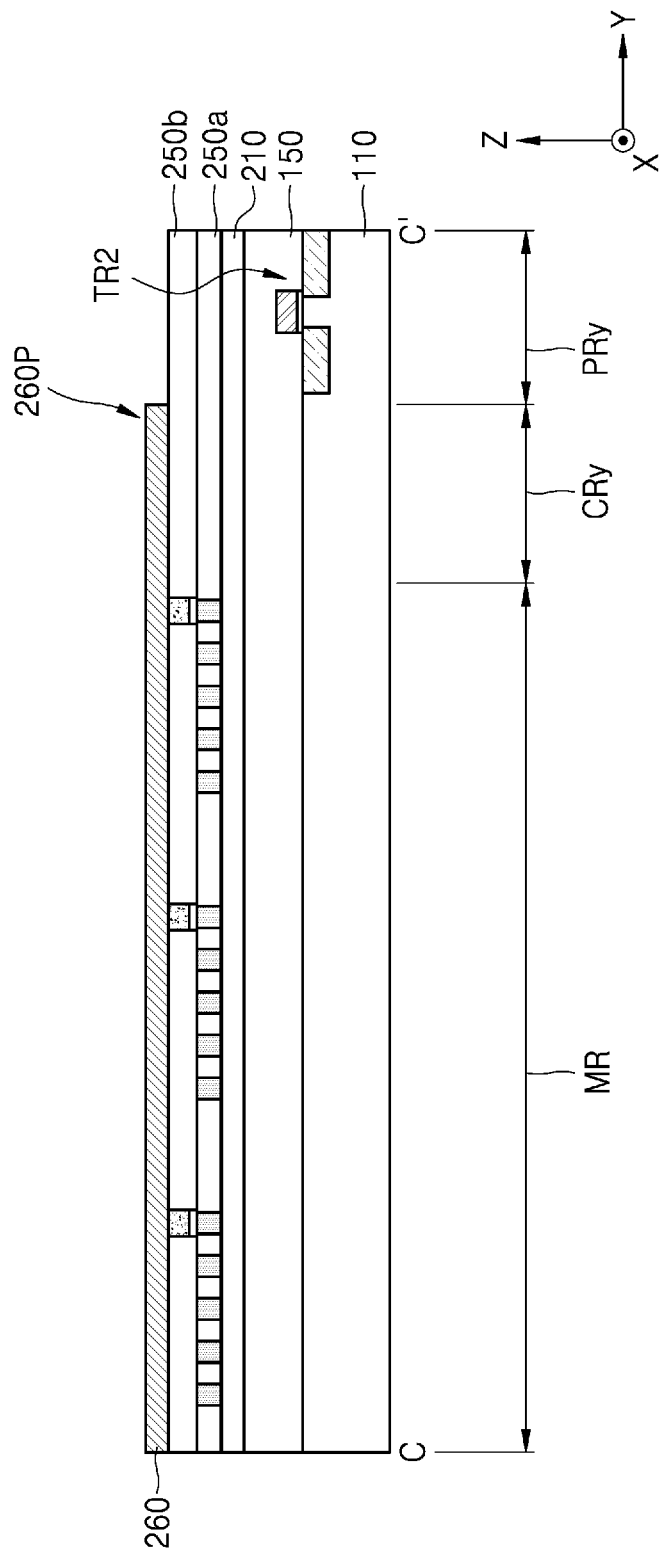

Referring to FIGS. 4A to 4C, on the first interlayer insulating layer 250a and the plurality of magnetic track layers 220, a second interlayer insulating layer 250b surrounding the plurality of reading units 230 may be formed. The second interlayer insulating layer 250b may be formed of an oxide. However, embodiments are not limited thereto. The second interlayer insulating layer 250b may cover side surfaces of the plurality of reading units 230 and may expose at least parts of upper surfaces of the plurality of reading units 230. In some embodiments, an upper surface of the second interlayer insulating layer 250b may be coplanar with the upper surfaces of the plurality of reading units 230.

A plurality of bit lines 260 may be formed on the second interlayer insulating layer 250b and the plurality of reading units 230. The plurality of bit lines 260 may extend in the second horizontal direction (Y direction) at uniform intervals in the first horizontal direction (X direction). The plurality of bit lines 260 may be formed of a polysilicon doped with impurities, metal, e.g., at least one of W, Cu, Al, Ni, Co, Ti, and Ta, a metal silicide, e.g., at least one of W silicide, Ni silicide, Co silicide, Ti silicide, and Ta silicide, a conductive metal nitride, e.g., at least one of Ti nitride and Ta nitride, or a combination of the above.

The plurality of bit lines 260 may extend while intersecting with at least parts of the plurality of magnetic track layers 220. In some embodiments, each of the plurality of magnetic track layers 220 may intersect with the plurality of bit lines 260. In some embodiments, each of the plurality of bit lines 260 may intersect with different parts of each of the plurality of magnetic track layers 220.

Each of the plurality of bit lines 260 may contact upper surfaces of different reading units 230 among the plurality of reading units 230 arranged on each of the plurality of magnetic track layers 220. That is, the number of bit lines 260 intersecting with each of the plurality of magnetic track layers 220 may be equal to the number of reading units 230 arranged on each of the plurality of magnetic track layers 220, e.g., so each bit line 260 may intersect only one reading unit 230 in each of the magnetic track layers 220.

Each of the plurality of bit lines 260 may extend to be formed over the memory region MR and the second connection region CRy. Each of the plurality of bit lines 260 may include a bit line pad unit 260P in the second connection region CRy. In some embodiments, a horizontal width of the bit line pad unit 260P may have a value greater than that of a horizontal width, e.g., along the X direction, of each of the plurality of bit lines 260 in the memory region MR.

Figure 5A:
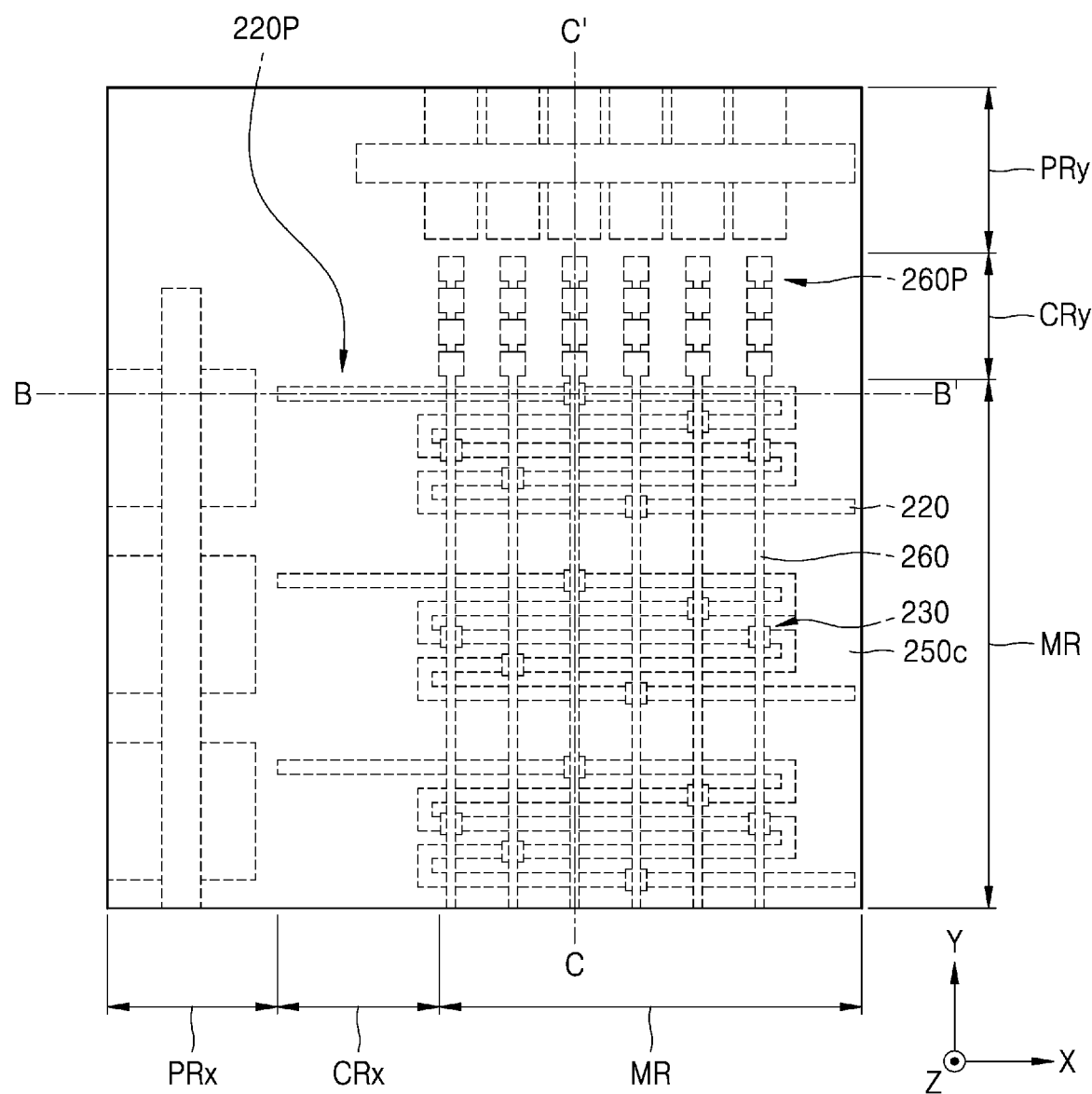
Figure 5B:
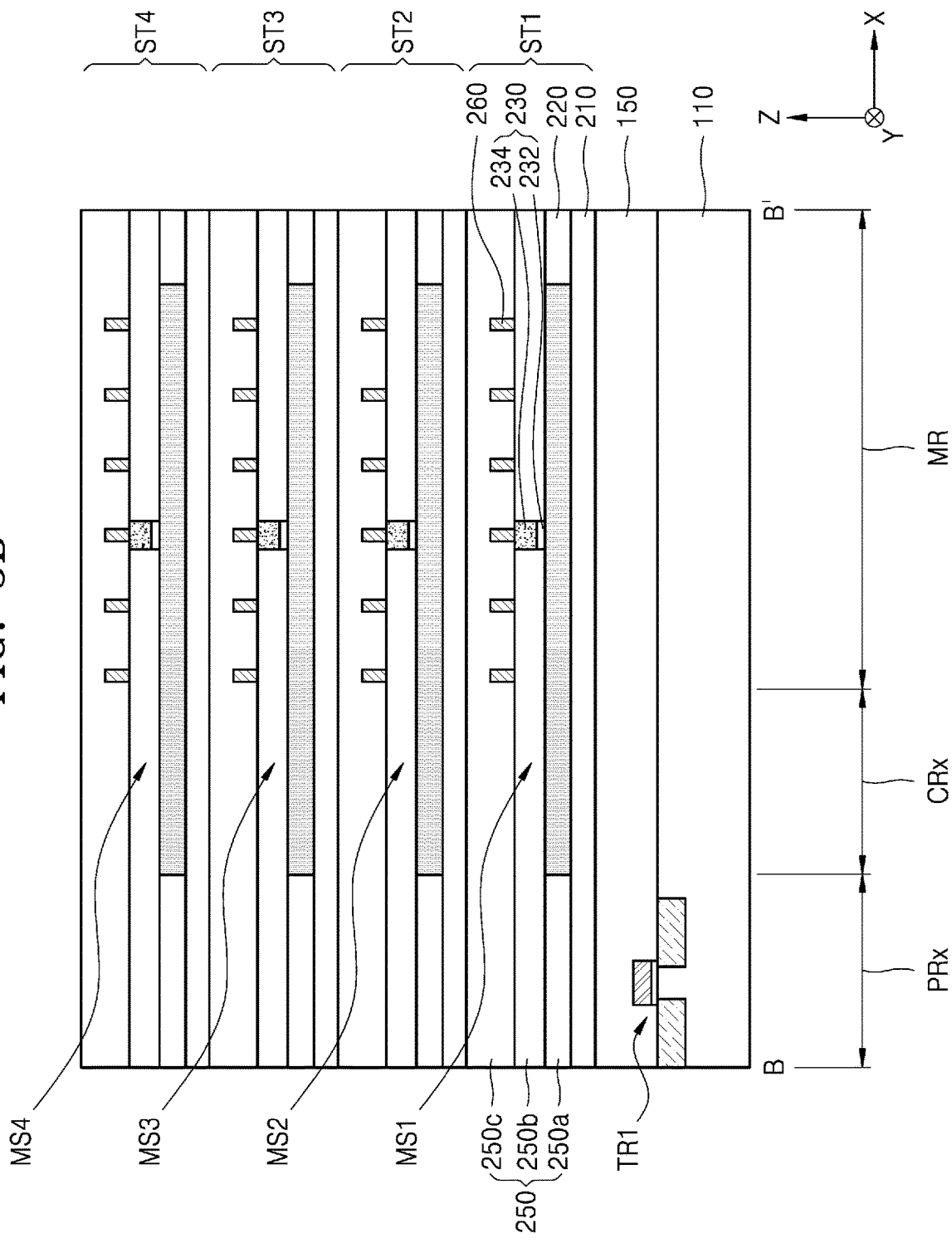
Figure 5C:
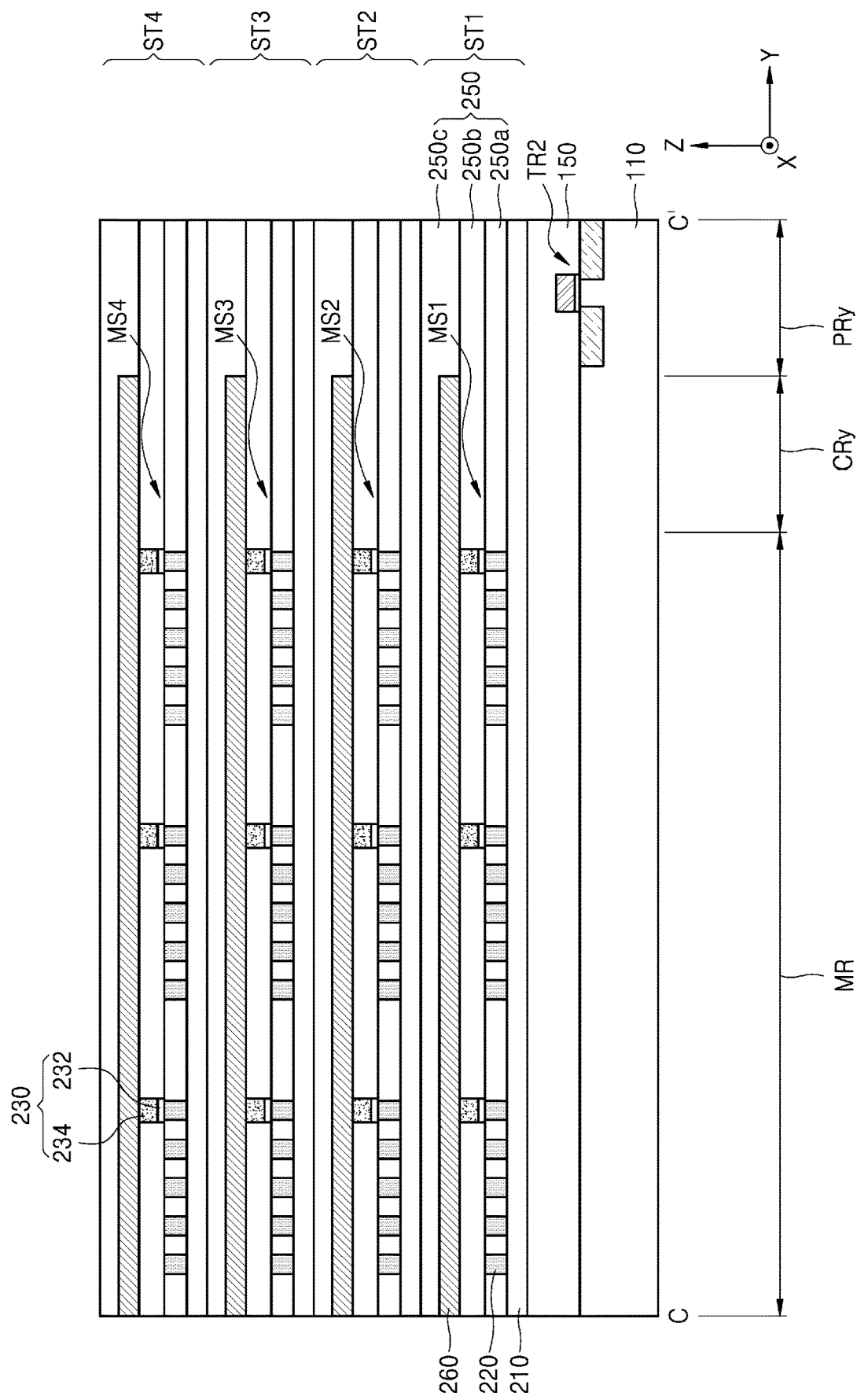

Referring to FIGS. 5A to 5C, on the second interlayer insulating layer 250b, a third interlayer insulating layer 250c covering the plurality of bit lines 260 may be formed. The third interlayer insulating layer 250c may cover upper and side surfaces of the plurality of bit lines 260. The third interlayer insulating layer 250c may be formed of, e.g., oxide. In some embodiments, the first interlayer insulating layer 250a, the second interlayer insulating layer 250b, and the third interlayer insulating layer 250c may be formed of the same material or similar materials. The first interlayer insulating layer 250a, the second interlayer insulating layer 250b, and the third interlayer insulating layer 250c may be referred to as an interlayer insulating layer 250.

Then, a plurality of memory stacks ST1, ST2, ST3, and ST4 laminated in a vertical direction (a Z direction) are formed by repeatedly forming the etch stop layer 210, the plurality of magnetic track layers 220, the plurality of reading units 230, the plurality of bit lines 260, and the interlayer insulating layer 250. Each of the plurality of memory stacks ST1, ST2, ST3, and ST4 may be formed of the etch stop layer 210, the plurality of magnetic track layers 220 arranged on the etch stop layer 210, the plurality of reading units 230 contacting the plurality of magnetic track layers 220, the plurality of bit lines 260 contacting the upper surfaces of the plurality of reading units 230, and the interlayer insulating layer 250 covering the plurality of magnetic track layers 220, the plurality of reading units 230, and the plurality of bit lines 260 on the etch stop layer 210.

The plurality of memory stacks ST1, ST2, ST3, and ST4 may respectively include a plurality of memory strings MS1, MS2, MS3, and MS4, each formed of the plurality of magnetic track layers 220 and the plurality of reading units 230.

The plurality of memory strings MS1, MS2, MS3, and MS4 respectively included in the plurality of memory stacks ST1, ST2, ST3, and ST4 may respectively overlap in the vertical direction (the Z direction). In some embodiments, the plurality of magnetic track layers 220 of each of the plurality of memory stacks ST1, ST2, ST3, and ST4 overlap in the vertical direction (the Z direction) and at least some of the plurality of reading units 230 may not overlap. Because the plurality of bit lines 260 respectively included the plurality of memory stacks ST1, ST2, ST3, and ST4 are arranged in accordance with arrangements of the plurality of reading units 230, the plurality of bit lines 260 may overlap in the vertical direction (the Z direction) and at least some of the plurality of bit lines 260 may not overlap.

In FIGS. 5B and 5C, it is illustrated that four memory stacks ST1, ST2, ST3, and ST4 are laminated. However, embodiments are not limited thereto, e.g., memory stacks of multiples of two or four may be laminated.

Figure 6A:
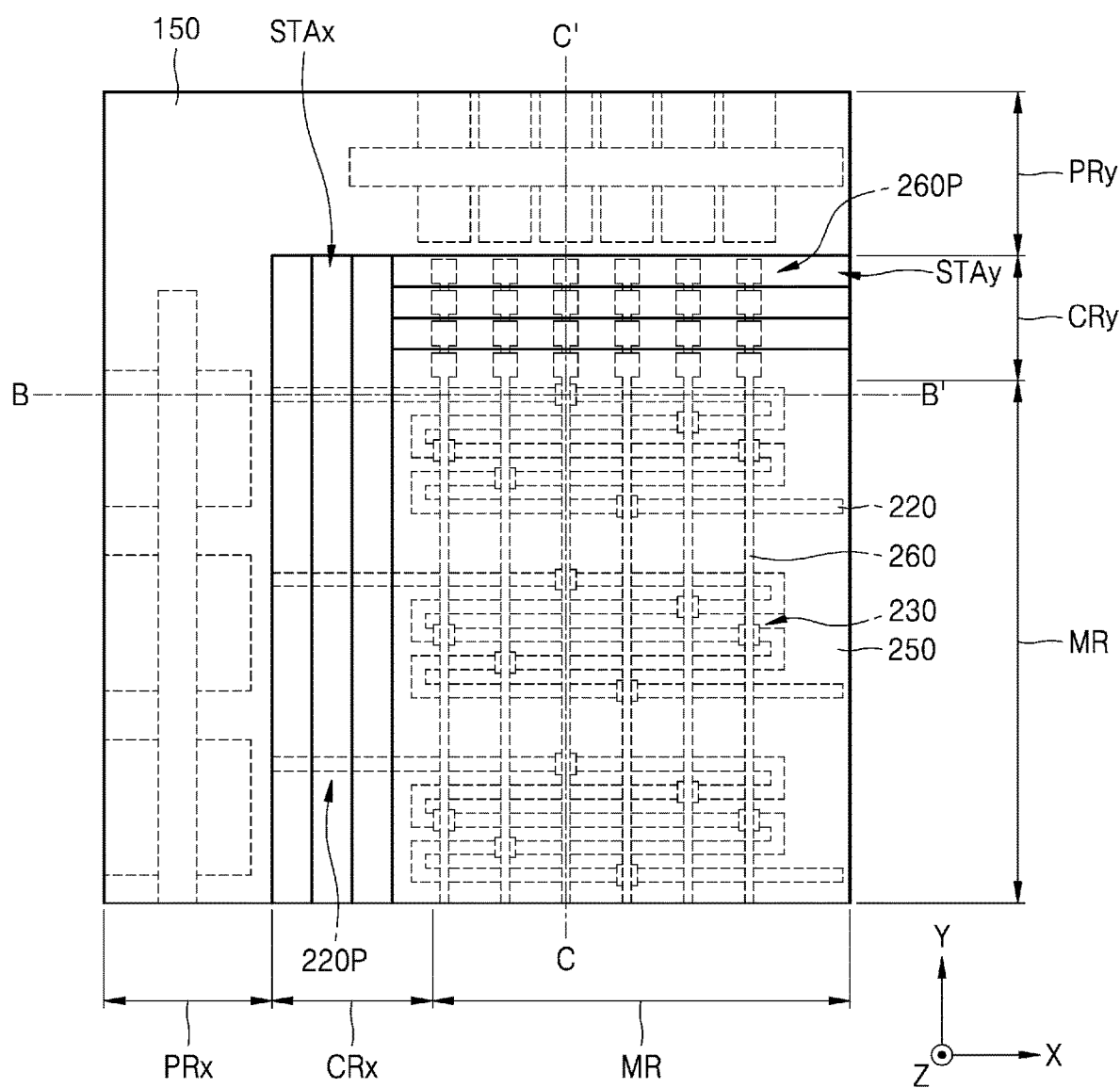
Figure 6B:
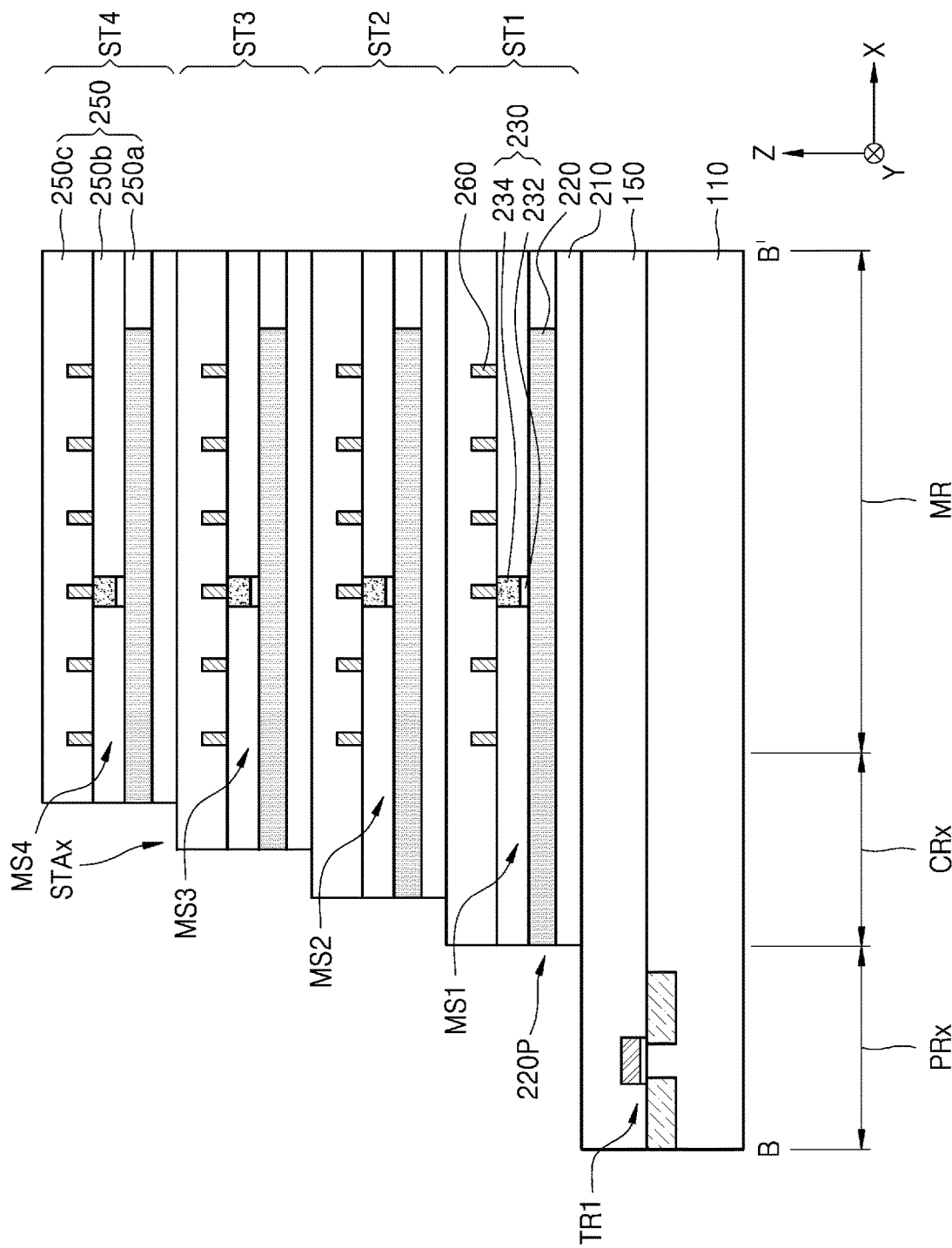

Referring to FIGS. 6A to 6C, by removing parts of the plurality of memory stacks ST1, ST2, ST3, and ST4, the plurality of memory stacks ST1, ST2, ST3, and ST4 may form stair profile, i.e., to include a plurality of stairs, in the first connection region CRx and the second connection region CRy. Each of the plurality of memory stacks ST1, ST2, ST3, and ST4 may have a first stair unit STAx and a second stair unit STAy forming stair-shaped step boards in the first connection region CRx and the second connection region Cry. The first stair unit STAx and the second stair unit STAy of each of the plurality of memory stacks ST1, ST2, ST3, and ST4 may protrude above upper memory stacks in the first horizontal direction (the X direction) and the second horizontal direction (Y direction).

Therefore, horizontal lengths of the etch stop layers 210 of the plurality of memory stacks ST1, ST2, ST3, and ST4 in the first horizontal direction (X direction) and the second horizontal direction (Y direction) may vary. The horizontal lengths of the etch stop layers 210 of the plurality of memory stacks ST1, ST2, ST3, and ST4 in the first horizontal direction (X direction) and the second horizontal direction (Y direction) may be reduced from the substrate 110 toward upper portions. In addition, horizontal lengths of the pad track layers 220P of the plurality of memory stacks ST1, ST2, ST3, and ST4 in the first horizontal direction (X direction) may be reduced from the substrate 110 toward upper portions and horizontal lengths of the bit line pad units 260P of the plurality of memory stacks ST1, ST2, ST3, and ST4 in the second horizontal direction (Y direction) may be also reduced from the substrate 110 toward upper portions.

For example, the horizontal lengths of the etch stop layer 210, the pad track layer 220P, and the bit line pad unit 260P of the memory stack ST1 positioned in the lowermost portion may be largest and the horizontal lengths of the etch stop layer 210, the pad track layer 220P, and the bit line pad unit 260P of the memory stack ST4 positioned in the uppermost portion may be smallest.

In FIGS. 6B and 6C, it is illustrated that an upper surface of each of the first stair unit STAx and the second stair unit STAy is at the same level as a lower surface of the etch stop layer 210 positioned thereon. However, embodiments are not limited thereto. In some embodiments, in a process of having the plurality of memory stacks ST1, ST2, ST3, and ST4 form stairs in the first connection region CRx and the second connection region CRy so that the upper surface of each of the first stair unit STAx and the second stair unit STAy is at a level lower than that of the lower surface of the etch stop layer 210 positioned thereon, i.e., at a level close to that of the substrate 110, parts of the interlayer insulating layers 250 may be further removed in the first stair unit STAx and the second stair unit STAy.

Referring to FIGS. 7A to 7C, a filling insulation layer 300 may be formed in a portion from which parts of the plurality of memory stacks ST1, ST2, ST3, and ST4 illustrated in FIGS. 6A to 6C are removed. The filling insulation layer 300 may be formed of, e.g., an oxide. However, embodiments are not limited thereto. In some embodiments, the interlayer insulating layers 250 and the filling insulation layer 300 may be formed of the same material or similar materials.

Referring to FIGS. 8A to 8C, a plurality of first contact holes THx exposing parts of the first source regions 112a and parts of the first drain regions 112b are formed in the first peripheral circuit region PRx, a plurality of second contact holes THy exposing parts of the second source regions 114a and parts of the second drain regions 114b are formed in the second peripheral circuit region PRy, a plurality of first connecting contact holes CHx exposing parts of the pad track layers 220P of the plurality of memory stacks ST1, ST2, ST3, and ST4 are formed in the first connection region CRx, a plurality of second connecting contact holes CHy exposing parts of the bit lines pad units 260P of the plurality of memory stacks ST1, ST2, ST3, and ST4 are formed in the second connection region CRy, and a common source trench CSH exposing the substrate 110 is formed in the memory region MR.

The plurality of first contact holes THx and the plurality of second contact holes THy may pass through the filling insulation layer 300 and the base insulating layer 150. The plurality of first connecting contact holes CHx may pass through the filling insulation layer 300, the third interlayer insulating layer 250c, and the second interlayer insulating layer 250b. The plurality of second connecting contact holes CHy may pass through the filling insulation layer 300 and the third interlayer insulating layer 250c. The common source trench CSH may pass through the plurality of memory stacks ST1, ST2, ST3, and ST4 and the base insulating layer 150.

In some embodiments, the plurality of first contact holes THx, the plurality of second contact holes THy, the plurality of first connecting contact holes CHx, and the plurality of second connecting contact holes CHy may be simultaneously formed by an etching process. The etching process for forming the plurality of first contact holes THx, the plurality of second contact holes THy, the plurality of first connecting contact holes CHx, and the plurality of second connecting contact holes CHy may be performed so that the etch stop layer 210 is exposed. In other embodiments, the plurality of first contact holes THx and the plurality of second contact holes THy may be simultaneously formed by an etching process and the plurality of first connecting contact holes CHx and the plurality of second connecting contact holes CHy may be simultaneously formed by another etching process. In other embodiments, the plurality of first contact holes THx and the plurality of second contact holes THy may be simultaneously formed by an etching process and the plurality of first connecting contact holes CHx and the plurality of second connecting contact holes CHy may be formed by separate etching processes, e.g., each grouping of the first and second connecting contact holes CHx and Chy may be formed by a separate etching process.

In some embodiments, the common source trench CSH may be formed by an etching process separate from the etching process of forming the plurality of first contact holes THx, the plurality of second contact holes THy, the plurality of first connecting contact holes CHx, and the plurality of second connecting contact holes CHy. In other embodiments, the common source trench CSH may be formed by the etching process of forming the plurality of first contact holes THx and the plurality of second contact holes THy.

For example, the plurality of first contact holes THx, the plurality of second contact holes THy, the plurality of first connecting contact holes CHx, the plurality of second connecting contact holes CHy, or the common source trench CSH may be formed by performing a high aspect ratio contact (HARC) etching process.

In some embodiments, as illustrated in FIG. 9E, a part of the pad track layer 220P and a part of the etch stop layer 210 may be exposed to a bottom surface of each of the plurality of first connecting contact holes CHx. In other embodiments, only the part of the pad track layer 220P may be exposed, and the part of the etch stop layer 210 may not be exposed to the bottom surface of each of the plurality of first connecting contact holes CHx.

Only a part of the bit line pad unit 260P may be exposed to a bottom surface of each of the plurality of second connecting contact holes CHy.

A part of an upper surface of the substrate 110 may be exposed to a bottom surface of the common source trench CSH. As illustrated in FIG. 9D, the plurality of magnetic track layers 220 may be exposed to an internal wall of the common source trench CSH. That is, the second ends or portions adjacent to the second ends of the plurality of magnetic track layers 220, e.g., ends or portions adjacent to the ends of the plurality of magnetic track layers 220 that are in the memory cell region MR, may be exposed to, e.g., directly contact, the internal wall of the common source trench CSH.

In some embodiments, the plurality of first contact holes THx, the plurality of second contact holes THy, the plurality of first connecting contact holes CHx, and the plurality of second connecting contact holes CHy may have circular or elliptical horizontal cross-sections, e.g., as viewed in a top view (FIG. 9A). In some embodiments, the common source trench CSH may have a bar-shaped horizontal cross-section extending in the second horizontal direction (Y direction) or a rectangular horizontal cross-section having a long axis in the second horizontal direction (Y direction) in the memory region MR, as illustrated in FIG. 9A.

Referring to FIGS. 9A to 9D, a plurality of first contact plugs TCx filling the plurality of first contact holes THx, a plurality of second contact plugs TCy filling the plurality of second contact holes THy, a plurality of first connecting contact plugs MCx filling the plurality of first connecting contact holes CHx, a plurality of second connecting contact plugs MCy filling the plurality of second connecting contact holes CHy, and a common source line CSL filling the common source trench CSH may be formed.

The plurality of first contact plugs TCx, the plurality of second contact plugs TCy, the plurality of first connecting contact plugs MCx, the plurality of second connecting contact plugs MCy, and the common source line CSL may be formed of a conductive material. For example, the plurality of first contact plugs TCx, the plurality of second contact plugs TCy, the plurality of first connecting contact plugs MCx, the plurality of second connecting contact plugs MCy, and the common source line CSL may be formed of metal, conductive metal nitride, transition metal, or a combination of the above metals. The plurality of first contact plugs TCx, the plurality of second contact plugs TCy, the plurality of first connecting contact plugs MCx, the plurality of second connecting contact plugs MCy, and the common source line CSL may be formed by filling the plurality of first contact holes THx, the plurality of second contact holes THy, the plurality of first connecting contact holes CHx, the plurality of second connecting contact holes CHy, and the common source trench CSH, forming a conductive material covering the plurality of memory stacks ST1, ST2, ST3, and ST4 and the filling insulation layer 300, and then removing a portion of the conductive material covering an upper surface of the filling insulation layer 300 and an upper surface of the third interlayer insulating layer 250c of the memory stack ST4 positioned at the uppermost end.

The plurality of first contact plugs TCx, the plurality of second contact plugs TCy, the plurality of first connecting contact plugs MCx, the plurality of second connecting contact plugs MCy, and the common source line CSL may be formed of the same conductive material.

The plurality of first contact plugs TCx may be electrically connected to the first source regions 112a and the first drain regions 112b of the plurality of first driving elements TR1, and the plurality of second contact plugs TCy may be electrically connected to the second source regions 114a and the second drain regions 114b of the plurality of second driving elements TR2. The plurality of first connecting contact plugs MCx and the common source line CSL may be electrically connected to the first and second ends, respectively, of each of the plurality of magnetic track layers 220. The common source line CSL may be electrically connected to the plurality of magnetic track layers 220, and each of the plurality of first connecting contact plugs MCx may be electrically connected to each of the plurality of magnetic track layers 220. Each of the plurality of first connecting contact plugs MCx and the common source line CSL may be positioned at both ends, i.e., both first and second ends, in the first horizontal direction (X direction) with each of the plurality of magnetic track layers 220 therebetween. The plurality of second connecting contact plugs MCy may be connected to the plurality of bit line pad units 260P and may be electrically connected to the plurality of bit lines 260.

In some embodiments, metal silicide layers for reducing contact resistance may be between the first contact plug TCx and the first source region 112a, between the first contact plug TCx and the first drain region 112b, between the second contact plug TCy and the second source region 114a, between the second contact plug TCy and the second drain region 114b, and between the common source line CSL and the substrate 110.

Referring to FIG. 9E, the first connecting contact plug MCx may be connected to a part of the pad track layer 220P adjacent to the first end of the magnetic track layer 220. In some embodiments, a horizontal width of the first connecting contact plug MCx may have a value greater than that of a horizontal width of the pad track layer 220P, e.g., in the second horizontal direction (the Y direction). Here, the horizontal width of the pad track layer 220P means a width in a direction (the second horizontal direction (the Y direction) in FIG. 9D) perpendicular to a direction (the first horizontal direction (the X direction) in FIG. 9D) in which the magnetic track layer 220 extends.

The first connecting contact plug MCx may surround a part of an upper surface of the pad track layer 220P and a part of a side surface of the pad track layer 220P. A lower surface of the first connecting contact plug MCx may contact the pad track layer 220P and the etch stop layer 210, and a lowermost surface of the first connecting contact plug MCx may contact the etch stop layer 210.

Figure 10A:
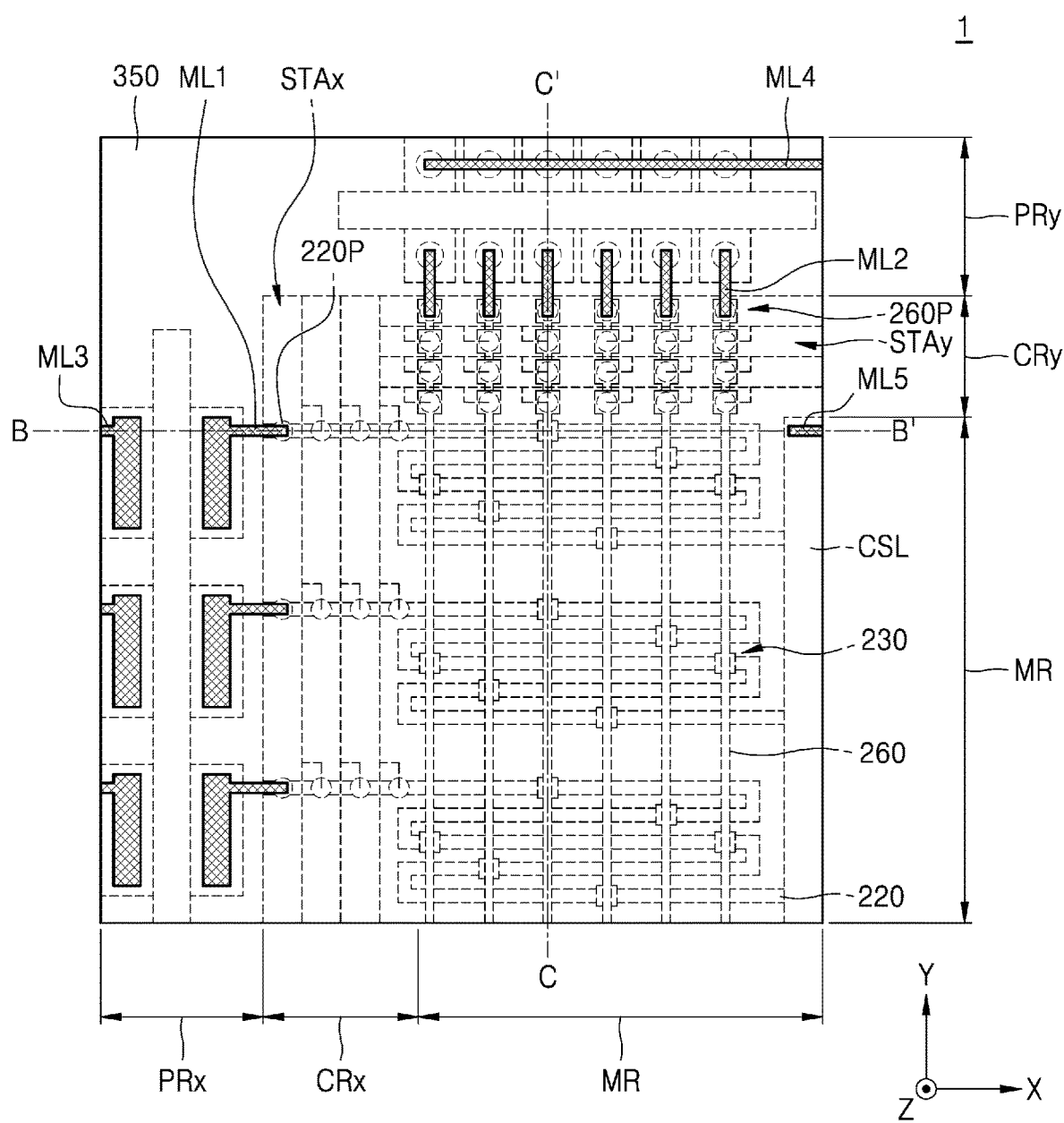
FIGS. 10A to 10C are a plan view and cross-sectional views illustrating a memory device according to embodiments.
Figure 10B:
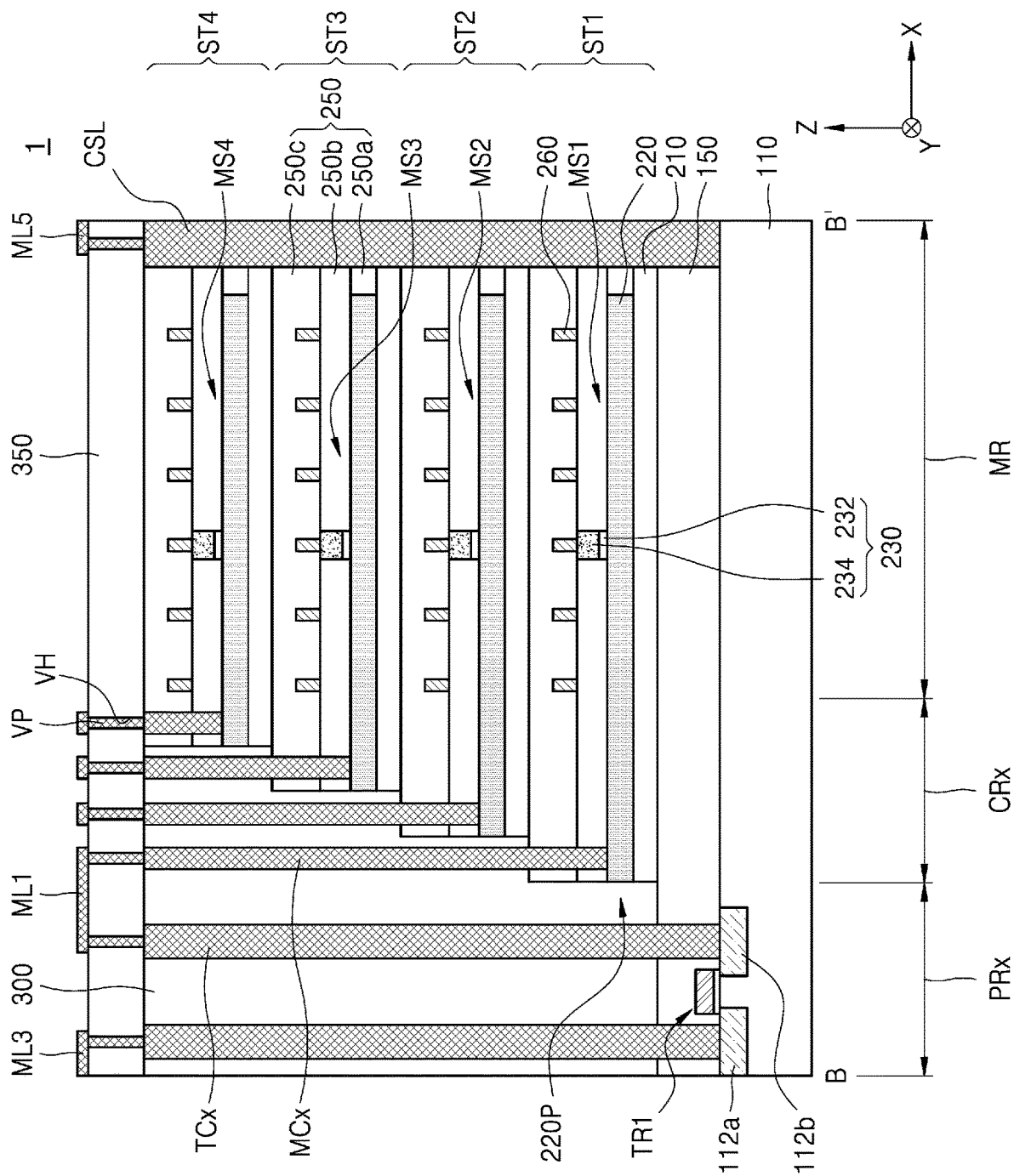
Figure 10C:
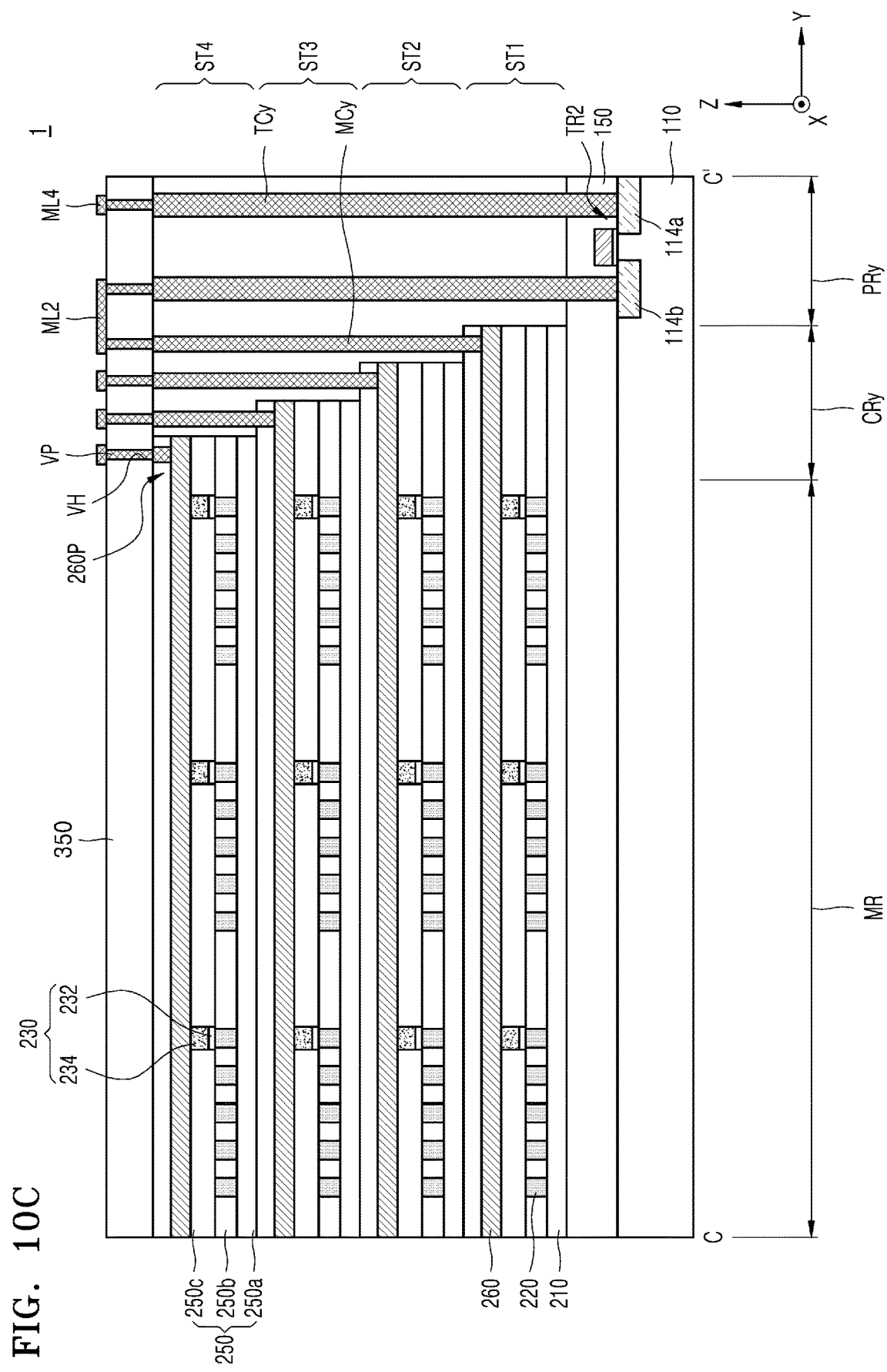
Figure 10D:
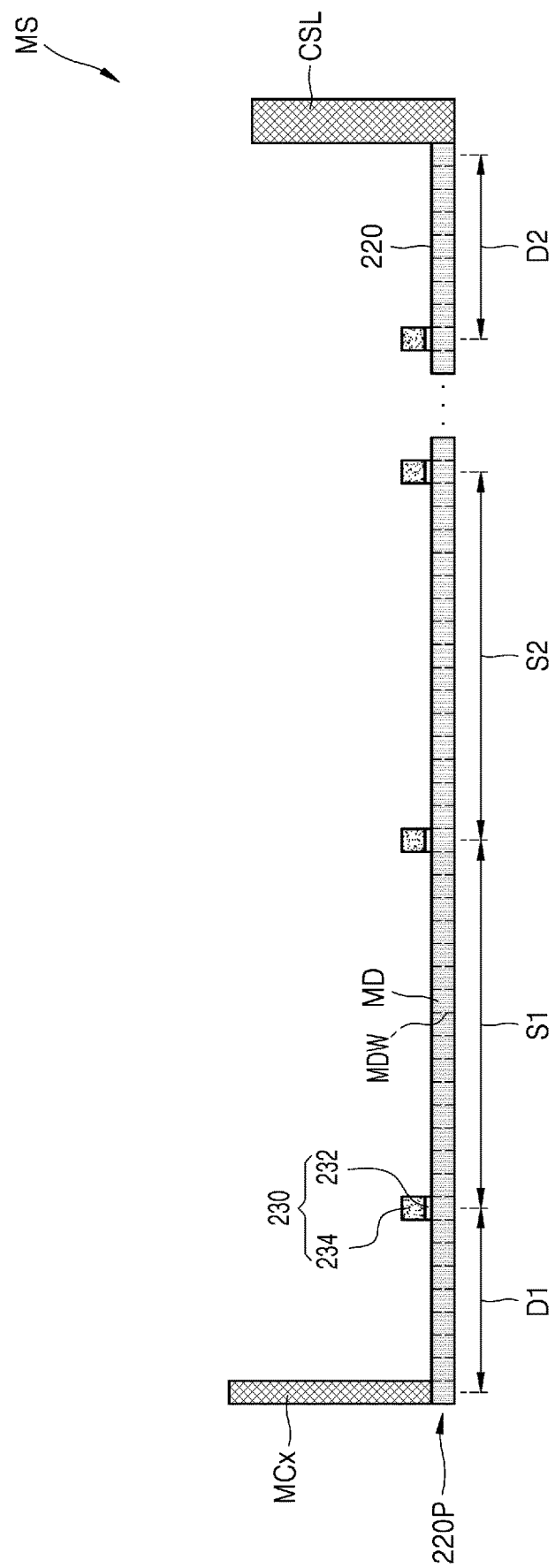
FIG. 10D is a cross-sectional view of a memory string of a memory device.

FIGS. 10A to 10C are a plan view and cross-sectional views illustrating a memory device according to embodiments, and FIG. 10D is a cross-sectional view illustrating a memory string of a memory device. FIGS. 10B and 10C are cross-sectional views along line B-B' and C-C' of FIG. 10A, respectively.

Referring to FIGS. 10A to 10C, after forming a cover insulating layer 350 on the plurality of memory stacks ST1, ST2, ST3, and ST4 and the filling insulation layer 300, a plurality of via holes VH passing through the cover insulating layer 350 and exposing at least parts of upper surfaces of the plurality of first contact plugs TCx, the plurality of second contact plugs TCy, the plurality of first connecting contact plugs MCx, the plurality of second connecting contact plugs MCy, and the common source line CSL on bottom surfaces thereof and a plurality of via plugs VP filling the plurality of via holes VH may be formed. The cover insulating layer 350 may be formed of, e.g., oxide.

The plurality of via plugs VP may be formed of a conductive material. For example, the plurality of via plugs VP may be formed of metal, conductive metal nitride, transition metal, or a combination of the above metals. Each of the plurality of via plugs VP may be connected to at least one of the plurality of first contact plugs TCx, the plurality of second contact plugs TCy, the plurality of first connecting contact plugs MCx, the plurality of second connecting contact plugs MCy, and the common source line CSL.

A memory device 1 may be formed by arranging first to fifth wiring lines ML1, ML2, ML3, ML4, and ML5 connected to at least one of the plurality of via plugs VP on the cover insulating layer 350. In the first to fifth wiring lines ML1, ML2, ML3, ML4, and ML5, the first wiring line ML1 electrically connects the first contact plug TCx connected to the first drain region 112b to the first connecting contact plug MCx, the second wiring line ML2 electrically connects the second contact plug TCy connected to the second drain region 114b to the second connecting contact plug MCy, the third wiring line ML3 is electrically connected to the first contact plug TCx connected to the first source region 112a, the fourth wiring line ML4 is electrically connected to the second contact plug TCy connected to the second source region 114a, and the fifth wiring line ML5 is electrically connected to the common source line CSL.

Referring to FIG. 10D, the memory string MS may include the magnetic track layer 220 and the plurality of reading units 230. The memory string MS illustrated in FIG. 10D may be one of the plurality of memory strings MS1, MS2, MS3, and MS4 illustrated in FIGS. 10B and 10C and is cut in an extension direction of the magnetic track layer 220.

A plurality of magnetic domains MD may be formed in the magnetic track layer 220, and a magnetic domain wall MDW may be between two adjacent magnetic domains MD. In the plurality of magnetic domains MD, magnetic moment directions of electrons may be the same. The magnetic domain wall MDW is a boundary between magnetic domains that may have different magnetization directions and may be moved by a current or a magnetic field applied to the magnetic track layer 220.

Referring to FIGS. 10A to 10D, the first contact plug TCx is connected to the pad track layer 220P adjacent to one end of the magnetic track layer 220 and the first driving element TR1 connected to the first connecting contact plug MCx may provide a predetermined magnetic moment direction to each of the plurality of magnetic domains MD so that data of "0" or "1" may be stored in each of the plurality of magnetic domains MD. The first driving element TR1 may be a part of a domain wall transport. The domain wall transport may include a power source, and a pulse current may be applied by the domain wall transport to the magnetic track layer 220 through the first driving element TR1. By the domain wall transport, the magnetic domain wall MDW between each two of the plurality of magnetic domains MD may move in a predetermined direction. The magnetic domain MD passes through the reading unit 130 due to the movement of the magnetic domain wall MDW so that the data may be read.

Through the first connecting contact plug MCx electrically connected to the first driving element TR1, the pulse current is sequentially applied to the plurality of magnetic domains MD so that each of the plurality of magnetic domains MD may have a predetermined magnetic moment direction or a magnetization direction. In addition, the pulse current is applied from the domain wall transport to the magnetic track layer 220 through the first connecting contact plug MCx so that the magnetic domain wall MDW may be moved. In other embodiments, the domain wall transport may be connected to the magnetic track layer 220 in addition to the first connecting contact plug MCx.

The reading unit 230 may read the data by the magnetic moment direction of each of the plurality of magnetic domains MD. The reading unit 230 may be an element using the tunnel magneto resistance (TMR) effect or the giant magneto resistance (GMR) effect. The reading unit 230 may be electrically connected to the second driving element TR2 through the bit line 260.

In FIG. 10C, the second driving element TR2 is exemplarily illustrated as being a transistor. However, unlike in FIG. 10C, the second driving element TR2 may include a diode or an OTS element.

Among the plurality of reading units 230 arranged on the magnetic track layer 220, reading unit arrangement intervals S1, S2, . . . that are intervals between reading units 230 adjacent in a direction in which the magnetic track layer 220 extends may have equal or similar values. That is, the numbers of magnetic domains MD between the two reading units 230 adjacent in the direction in which the magnetic track layer 220 extends may have equal or similar values.

In some embodiments, a first distance D1 between the reading units 230 adjacent to the first connecting contact plug MCx in the direction in which the magnetic track layer 220 extends and a second distance D2 between the reading units 230 adjacent to the common source line CSL may have values equal to ½ of the reading unit arrangement intervals S1, S2, . . . or values greater than ½ of the reading unit arrangement intervals S1, S2, . . . . In this case, the magnetic domain walls MDW positioned among the plurality of magnetic domains MD may bidirectionally move in the direction in which the magnetic track layer 220 extends.

In some embodiments, the first distance D1 between the reading units 230 adjacent to the first connecting contact plug MCx in the direction in which the magnetic track layer 220 extends and the second distance D2 between the reading units 230 adjacent to the common source line CSL may have values equal to the reading unit arrangement intervals S1, S2, . . . or values greater than the reading unit arrangement intervals S1, S2, . . . . In this case, the magnetic domain walls MDW positioned among the plurality of magnetic domains MD may unidirectionally move in the direction in which the magnetic track layer 220 extends.

The memory device 1 according to embodiments may be a racetrack memory device including the plurality of magnetic track layers 220. Each of the plurality of magnetic track layers 220 of the memory device 1 two-dimensionally extends and may have a folded structure in which each of the plurality of magnetic track layers 220 is at least two villi-shaped, e.g., continuously folded into multiple U shapes that are aligned and connected to each other. The plurality of magnetic track layers 220 of the memory device 1 may be arranged on the same plane or may overlap in the vertical direction (Z direction).

Because the memory device 1 according to embodiments includes the plurality of memory stacks ST1, ST2, ST3, and ST4 having the plurality of memory strings MS1, MS2, MS3, and MS4 formed of the plurality of magnetic track layers 220 and the plurality of reading units 230, the memory device 1 may be a three-dimensional memory device in which data may be three-dimensionally stored.

In the memory device 1 according to embodiments, because the plurality of memory stacks ST1, ST2, ST3, and ST4 form stairs in each of the first connection region CRx and the second connection region CRy, the plurality of first connecting contact plugs MCx connected to the plurality of magnetic track layers 220 of each of the plurality of memory stacks ST1, ST2, ST3, and ST4 and the plurality of second connecting contact plugs MCy connected to the plurality of bit lines 260 of each of the plurality of memory stacks ST1, ST2, ST3, and ST4 may be formed by a photomask and by an etching process. In some embodiments, the plurality of first contact plugs TCx connected to the first driving element TR1, the plurality of second contact plugs TCy connected to the second driving element TR2, the plurality of first connecting contact plugs MCx connected to the plurality of magnetic track layers 220, and the plurality of second connecting contact plugs MCy connected to the plurality of bit lines 260 may be formed by a photomask and an etching process. Therefore, manufacturing time and cost of the memory device 1 may be reduced. In addition, in the memory device 1 according to embodiments, because the magnetic track layer 220 is arranged on the etch stop layer 210, process mass productivity for forming the racetrack memory device including the plurality of magnetic track layers 220 may increase.

The magnetic track layer 220 of the memory device 1 according to embodiments may have a folding structure in which the magnetic track layer 220 is two-dimensionally villi-shaped. Therefore, in the direction in which the magnetic track layer 220 extends, pitches of the plurality of bit lines 260 connected to the plurality of reading units 230 arranged at equal or similar intervals may be freely controlled. Therefore, a process margin for forming the plurality of bit lines 260 may increase.

Because the memory device 1 according to embodiments may have the folding structure in which the magnetic track layer 220 is two-dimensionally at least two villi-shaped, the first connecting contact plug MCx and the common source line CSL connected to both ends of the magnetic track layer 220 may be arranged on opposite sides in the memory region MR. Therefore, because wiring structures for driving the memory device 1 may be freely arranged, the memory device 1 may efficiently store high capacity data.

Figure 11A:
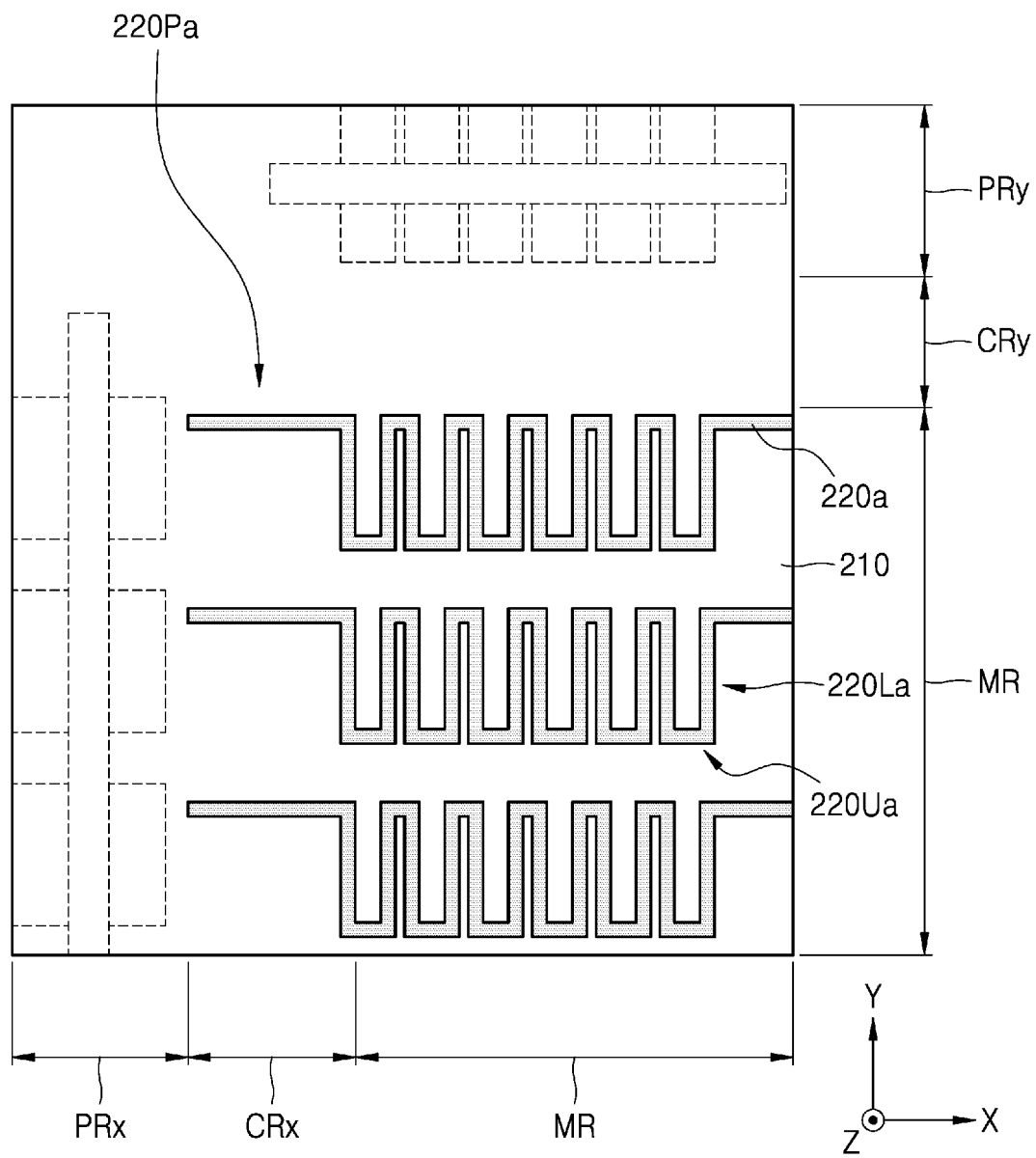
FIGS. 11A to 11C are plan views illustrating stages in a method of manufacturing a memory device according to embodiments.
Figure 11B:
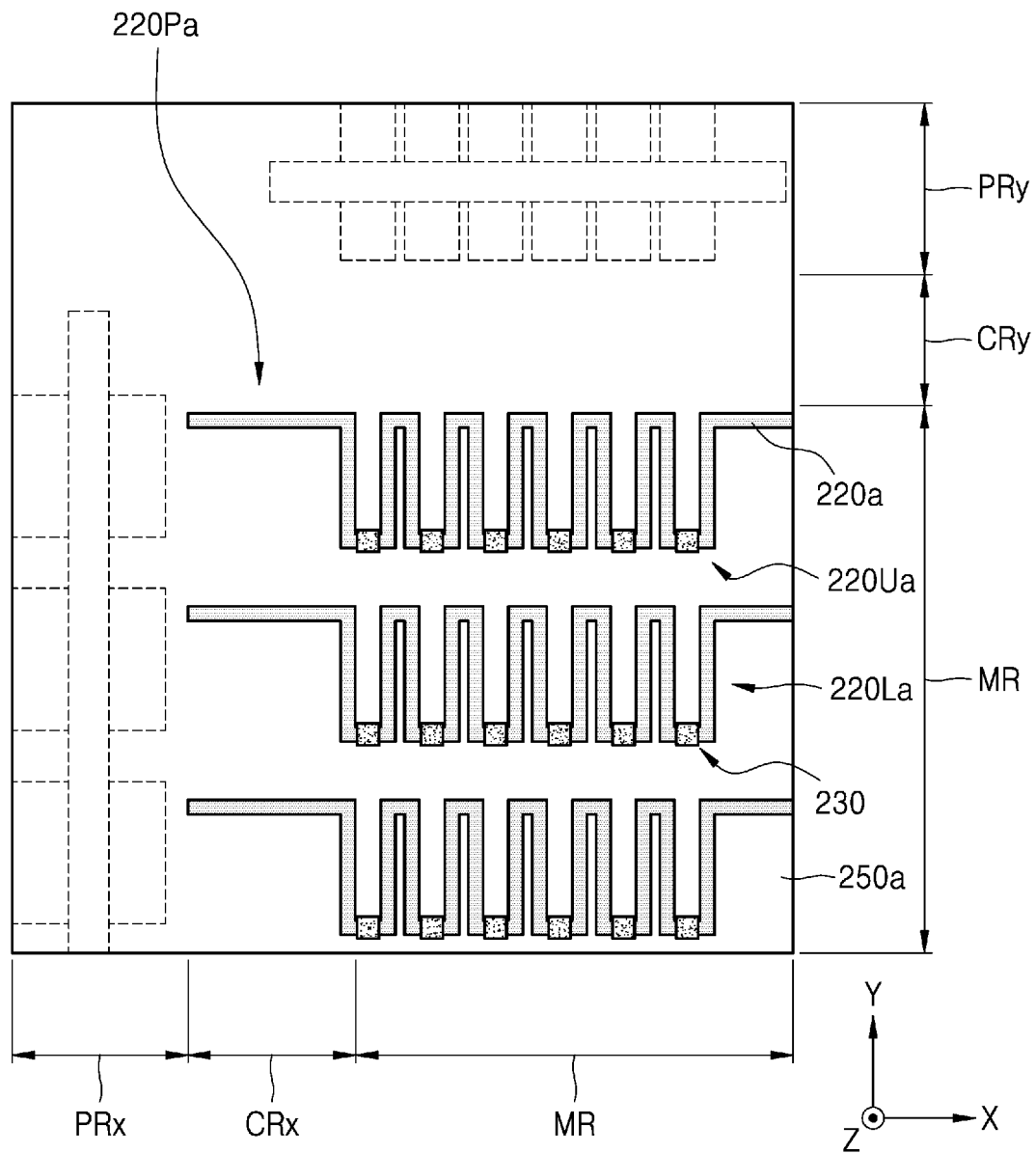
Figure 11C:
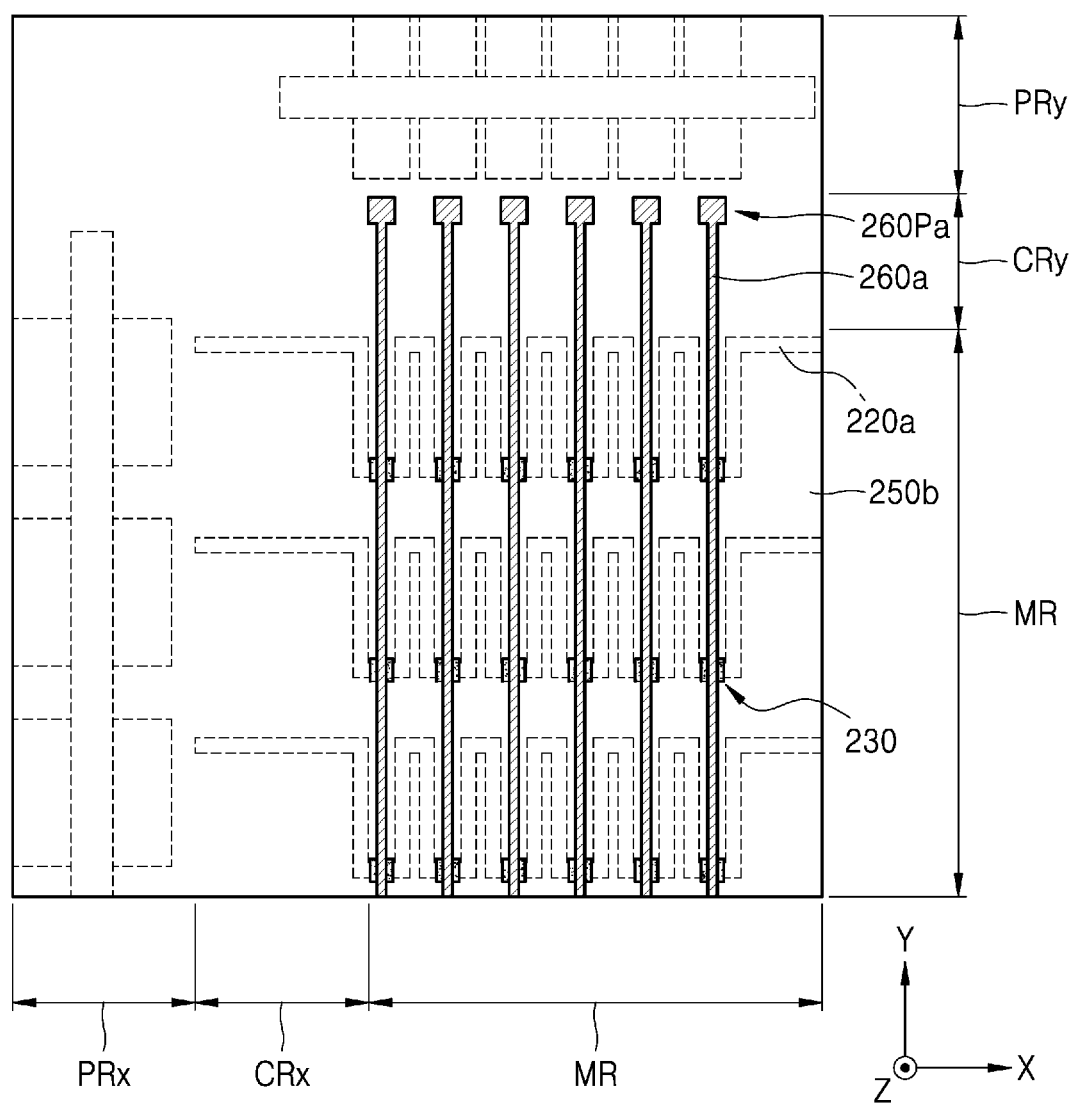

FIGS. 11A to 11C are plan views illustrating a method of manufacturing a memory device according to embodiments. Description of FIGS. 11A to 11C previously given with reference to FIGS. 10A to 10D will not be repeated.

Referring to FIG. 11A, a plurality of magnetic track layers 220a may be formed on the etch stop layer 210. In some embodiments, each of the plurality of magnetic track layers 220a may be formed over the memory region MR and the first connection region CRx. In some embodiments, each of the plurality of magnetic track layers 220a may extend with a uniform horizontal width. In the memory region MR, each of the plurality of magnetic track layers 220a may have a folding structure in which each of the plurality of magnetic track layers 220a is two-dimensionally villi-shaped. In the memory region MR, each of the plurality of magnetic track layers 220a may include extended track layers 220La and connecting track layers 220Ua connected to the extended track layers 220La. In the first connection region CRx, each of the plurality of magnetic track layers 220a may include a pad track layer 220Pa extended from the extended track layer 220La. In some embodiments, the pad track layer 220Pa may extend in the first horizontal direction (the X direction) and the extended track layers 220La may extend in the second horizontal direction (the Y direction).

Two extended track layers 220La and one connecting track layer 220Ua connecting the two extended track layers 220La may be two-dimensionally U-shaped. In some embodiments, in the memory region MR, each of the plurality of magnetic track layers 220a may have a folding structure in which each of the plurality of magnetic track layers 220a is at least two villi-shaped to include a plurality of extended track layers 220La and at least two connecting track layers 220Ua connecting the plurality of extended track layers 220La, e.g., to have a structure of a at least two U shapes adjacent to each other (e.g., along the X direction) and connected to each other at one side. Each of the plurality of magnetic track layers 220a may extend from a first end at the first connection region CRx to a second end positioned in the memory region MR opposite to the first connection region CRx in the first horizontal direction (the X direction).

In the magnetic track layer 220 illustrated in FIG. 2A, each villus-shaped protrusion, i.e., the connecting track layer 220U, is provided in the first horizontal direction (the X direction) or the reverse direction of the first horizontal direction (the X direction). However, in the magnetic track layer 220a illustrated in FIG. 11A, each villus-shaped protrusion, i.e., the connecting track layer 220Ua, may be provided in the second horizontal direction (the Y direction) or the reverse direction of the second horizontal direction (the Y direction). Therefore, each of the plurality of magnetic track layers 220a may extend from the first end to the second end with the folding structure in which each of the plurality of magnetic track layers 220a is an integer of at least two villi-shaped. Because the magnetic track layer 220a is almost the same as the magnetic track layer 220 illustrated in FIGS. 2A to 2C excluding the extended shape, detailed description thereof will not be repeated.

Referring to FIG. 11B, the first interlayer insulating layer 250a surrounding the plurality of magnetic track layers 220a may be formed on the etch stop layer 210. The first interlayer insulating layer 250a may be formed of, e.g., oxide. The first interlayer insulating layer 250a may cover side surfaces of the plurality of magnetic track layers 220a and may expose at least parts of upper surfaces of the plurality of magnetic track layers 220a. In some embodiments, the upper surface of the first interlayer insulating layer 250a may be coplanar with the upper surfaces of the plurality of magnetic track layers 220a.

On an upper surface of each of the plurality of magnetic track layers 220a, the plurality of reading units 230 may be arranged. The plurality of reading units 230 may be arranged on parts of each of the plurality of magnetic track layers 220a in the memory region MR and may not be arranged on parts of each of the plurality of magnetic track layers 220a in the first connection region CRx, i.e., the pad track layers 220P. In some embodiments, the plurality of reading units 230 may be arranged on the connecting track layer 220Ua and may not be arranged on the extended track layer 220La.

In FIG. 11A, the plurality of reading units 230 are illustrated as being arranged only on the connecting track layers 220Ua provided in the reverse direction of the second horizontal direction (the Y direction) among the plurality of connecting track layers 220Ua. However, embodiments are not limited thereto. In some embodiments, the plurality of reading units 230 may be arranged only on the connecting track layers 220Ua provided in the second horizontal direction (the Y direction) among the plurality of connecting track layers 220Ua. In other embodiments, some of the plurality of reading units 230 may be arranged on the connecting track layers 220Ua provided in the second horizontal direction (the Y direction) and the others of the plurality of reading units 230 may be arranged on the connecting track layers 220Ua provided in the reverse direction of the second horizontal direction (the Y direction).

Each of the plurality of reading units 230 may have a horizontal width greater than that of the magnetic track layer 220a, e.g., in the Y direction. In some embodiments, each of the plurality of reading units 230 may be formed over a part of the upper surface of the magnetic track layer 220a and a part of the upper surface of the first interlayer insulating layer 250a. The magnetic track layer 220a may be arranged to contact the reading unit 230, and one magnetic domain that is a part of a free layer included in the magnetic track layer 220a vertically overlapping the reading unit 230 may form a magnetic tunnel junction (MTJ) together with the reading unit 230.

Referring to FIG. 11C, on the first interlayer insulating layer 250a and the plurality of magnetic track layers 220a, the second interlayer insulating layer 250b surrounding the plurality of reading units 230 may be formed. The second interlayer insulating layer 250b may cover side surfaces of the plurality of reading units 230 and may expose at least parts of the upper surfaces of the plurality of reading units 230. In some embodiments, the upper surface of the second interlayer insulating layer 250b may be coplanar with the upper surfaces of the plurality of reading units 230.

A plurality of bit lines 260a may be formed on the second interlayer insulating layer 250b and the plurality of reading units 230. The plurality of bit lines 260a may extend in the second horizontal direction (the Y direction) at uniform intervals in the first horizontal direction (the X direction).

Each of the plurality of bit lines 260a may contact upper surfaces of different reading units 230 among the plurality of reading units 230 arranged on each of the plurality of magnetic track layers 220a. That is, the number of bit lines 260a intersecting with each of the plurality of magnetic track layers 220a may be equal to the number of reading units 230 arranged on each of the plurality of magnetic track layers 220a.

Each of the plurality of bit lines 260a may extend to be formed over the memory region MR and the second connection region CRy. Each of the plurality of bit lines 260a may include a bit line pad unit 260Pa in the second connection region CRy. In some embodiments, a horizontal width of the bit line pad unit 260Pa may be greater than that of a horizontal width of each of the plurality of bit lines 260a in the memory region MR.

Then, the memory device may be formed by a method similar to that described in FIGS. 5A to 10D. The memory device formed by the method described with reference to FIGS. 11A to 11C may be formed so that intervals among the plurality of reading units 230 be uniform, and the plurality of bit lines 260 described with reference to FIGS. 5A to 5C have uniform intervals in the first horizontal direction (the X direction) on one magnetic track layer 220a because each of the plurality of reading units 230 is arranged on the connecting track layer 220Ua of the magnetic track layer 220a.

Figure 12A:
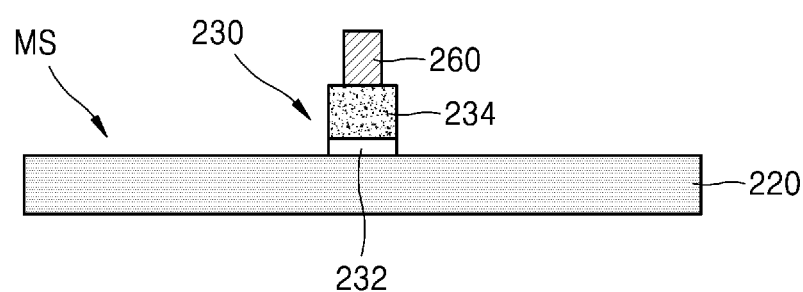
FIGS. 12A to 12C are cross-sectional views illustrating a part of a memory string of a memory device according to embodiments.
Figure 12B:
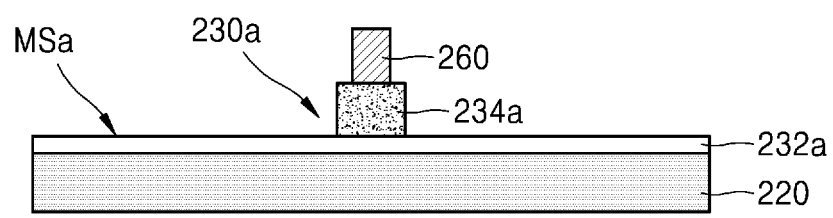
Figure 12C:
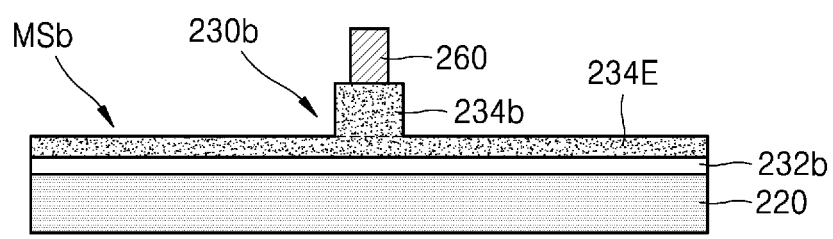

FIGS. 12A to 12C are cross-sectional views illustrating a part of a memory string of a memory device according to embodiments.

Referring to FIG. 12A, the memory string MS may include the magnetic track layer 220 and the plurality of reading units 230. The memory string MS may be one of the plurality of memory strings MS1, MS2, MS3, and MS4 illustrated in FIGS. 10B and 10C, e.g., the memory string MS may be an enlarged portion of the memory string MS in FIG. 10D. In detail, as illustrated in FIG. 12A, the magnetic track layer 220 may extend with a uniform horizontal width. On the upper surface of the magnetic track layer 220, the plurality of reading units 230 may be arranged. The reading unit 230 may include the tunnel barrier layer 232 and the fixed layer 234 formed on the magnetic track layer 220. The bit line 260 may be formed on the reading unit 230. The reading unit 230 may be between the magnetic track layer 220 and the bit line 260.

The magnetic track layer 220 may extend with a folding structure in which the magnetic track layer 220 is two-dimensionally at least two villi-shaped like the magnetic track layer 220 illustrated in FIG. 2A or the magnetic track layer 220a illustrated in FIG. 11A. The bit line 260 may extend in one direction.

The tunnel barrier layer 232 and the fixed layer 234 forming the reading unit 230 may be two-dimensionally rectangular as illustrated in FIG. 3A or 11B. However, embodiments are not limited thereto, e.g., the tunnel barrier layer 232 and the fixed layer 234 may be two-dimensionally circular or polygonal.

Referring to FIG. 12B, a memory string MSa may include the magnetic track layer 220 and a reading unit 230a. The memory string MSa may be one of the plurality of memory strings MS1, MS2, MS3, and MS4 illustrated in FIGS. 10B and 10C. The reading unit 230a may include a tunnel barrier layer 232a and a fixed layer 234a formed on the magnetic track layer 220. The bit line 260 may be formed on the reading unit 230a. The reading unit 230a may be between the magnetic track layer 220 and the bit line 260.

The fixed layer 234a may be two-dimensionally circular, rectangular, or polygonal like the fixed layer 234 illustrated in FIG. 12A. The tunnel barrier layer 232a may extend while covering the upper surface of the magnetic track layer 220. That is, a two-dimensional shape of the tunnel barrier layer 232a may be similar to that of the magnetic track layer 220. That is, the tunnel barrier layer 232a may extend with a folding structure in which the tunnel barrier layer 232a is two-dimensionally at least two villi-shaped. That is, the plurality of reading units 230a may include the plurality of fixed layers 234a arranged on the magnetic track layer 220 to be apart from each other and portions of the tunnel barrier layer 232a between the magnetic track layer 220 and the plurality of fixed layers 234a.

Referring to FIG. 12C, a memory string MSb may include the magnetic track layer 220 and a reading unit 230b. The memory string MSb may be one of the plurality of memory strings MS1, MS2, MS3, and MS4 illustrated in FIGS. 10B and 10C. The reading unit 230b may include a tunnel barrier layer 232b, a polarization enhancement layer 234E, and a fixed layer 234b formed on the magnetic track layer 220. The bit line 260 may be formed on the reading unit 230b. The reading unit 230a may be between the magnetic track layer 220 and the bit line 260.

Flat shapes of the tunnel barrier layer 232b and the fixed layer 234b may be almost the same as those of the tunnel barrier layer 232a and the fixed layer 234a illustrated in FIG. 12B. The polarization enhancement layer 234E may extend while covering an upper surface of the tunnel barrier layer 232b. That is, a flat shape of the polarization enhancement layer 234E may be almost the same as those of the magnetic track layer 220 and the tunnel barrier layer 232b. The fixed layer 234b may be arranged on a part of an upper surface of the polarization enhancement layer 234E. The polarization enhancement layer 234E may be formed of a material the same as or similar to that of the fixed layer 234b. The polarization enhancement layer 234E may increase tunnel magneto-resistance effect in a MTJ formed in the memory string MSb.

Figure 13A:
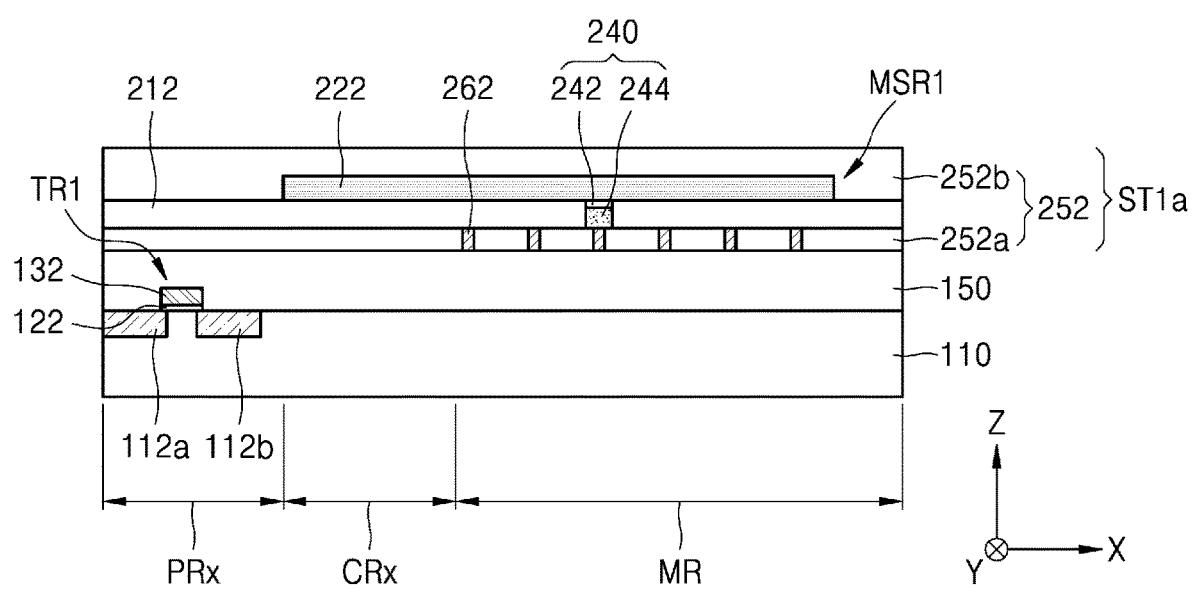
FIGS. 13A and 13B are cross-sectional views illustrating stages in a method of manufacturing a memory device according to embodiments.
Figure 13B:
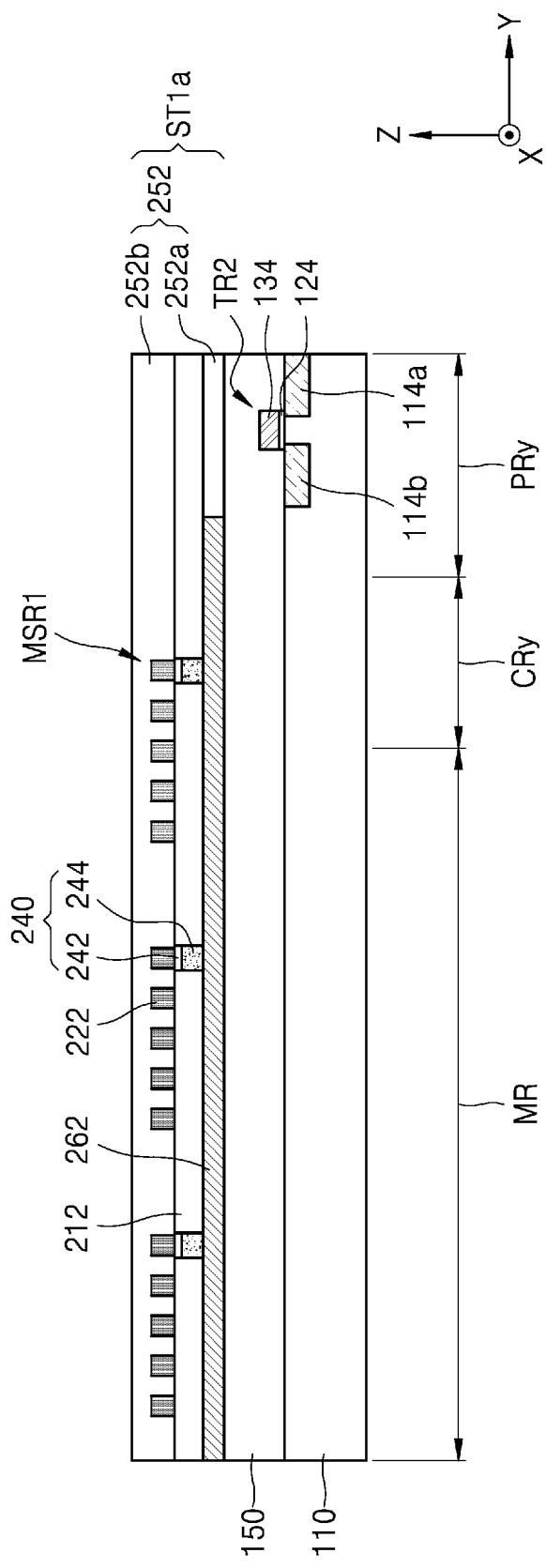

FIGS. 13A and 13B are cross-sectional views illustrating a method of manufacturing a memory device according to embodiments.

Referring to FIGS. 13A and 13B, a memory stack ST1a positioned in the lowermost portion may include a plurality of bit lines 262 extending in the second horizontal direction (the Y direction) at uniform intervals in the first horizontal direction (the X direction), a first interlayer insulating layer 252a surrounding the plurality of bit lines 262, a plurality of reading units 240 arranged on the plurality of bit lines 262, an etch stop layer 212 surrounding the plurality of reading units 240 while covering upper surfaces of the first interlayer insulating layer 252a and the plurality of bit lines 262, a plurality of magnetic track layers 222 arranged on the etch stop layer 212 and contacting upper surfaces of the plurality of reading units 240, and a second interlayer insulating layer 252b covering the plurality of magnetic track layers 222 on the etch stop layer 212.

Unlike the memory stack ST1 (described with reference to FIGS. 1A to 10D), where the plurality of magnetic track layers 220, the plurality of reading units 230, and the plurality of bit lines 260 are arranged from a lower side to an upper side, in the memory stack ST1a, as illustrated in FIGS. 13a and 13B, the plurality of magnetic track layers 222, the plurality of reading units 240, and the plurality of bit lines 262 may be arranged from an upper side to a lower side, i.e., in an opposite order to that in the memory stack ST1. The plurality of magnetic track layers 222, the plurality of reading units 240, and the plurality of bit lines 262 may be formed of same or similar materials to those of the plurality of magnetic track layers 220, the plurality of reading units 230, and the plurality of bit lines 260, respectively. Flat shapes, e.g., in cross-sectional views, of the plurality of magnetic track layers 222, the plurality of reading units 240, and the plurality of bit lines 262 may be almost the same as those of the plurality of magnetic track layers 220, the plurality of reading units 230, and the plurality of bit lines 260.

The first interlayer insulating layer 252a and the second interlayer insulating layer 252b may be formed of oxide. However, embodiments are not limited thereto. The first interlayer insulating layer 252a may cover side surfaces of the plurality of bit lines 262 and may expose at least parts of upper surfaces of the plurality of bit lines 262. In some embodiments, an upper surface of the first interlayer insulating layer 252a and the upper surfaces of the plurality of bit lines 262 may be coplanar. The second interlayer insulating layer 252b may cover upper and side surfaces of the plurality of magnetic track layers 222. The first interlayer insulating layer 252a and the second interlayer insulating layer 252b may be referred to as the interlayer insulating layer 252.

The memory stack ST1a positioned in the lowermost portion may have a memory string MSR1 formed of the plurality of magnetic track layers 222 and the plurality of reading units 240.

In some embodiments, the etch stop layer 212 may be formed of, e.g., silicon nitride or aluminum oxide. The etch stop layer 212 may cover side surfaces of the plurality of reading units 240. In some embodiments, an upper surface of the etch stop layer 212 may be coplanar with upper surfaces of the plurality of reading units 240. The reading unit 240 may include a fixed layer 244 and a tunnel barrier layer 242.

Then, the memory device may be formed by a method similar to that described with reference to FIGS. 5A to 10D. Unlike that, in the plurality of memory stacks ST1, ST2, ST3, and ST4 of the memory device 1 described with reference to FIGS. 1A to 10D, the plurality of magnetic track layers 220, the plurality of reading units 230, and the plurality of bit lines 260 are arranged from a lower side to an upper side, in the plurality of memory stacks of the memory device formed by the method described with reference to FIGS. 13A and 13B, like in the memory stack ST1a positioned in the lowermost portion, the plurality of magnetic track layers 222, the plurality of reading units 240, and the plurality of bit lines 262 may be arranged from an upper side to a lower side. The plurality of magnetic track layers 222, the plurality of reading units 240, and the plurality of bit lines 262 may be formed of same as or similar materials to those of the plurality of magnetic track layers 220, the plurality of reading units 230, and the plurality of bit lines 260, respectively. Flat shapes of the plurality of magnetic track layers 222, the plurality of reading units 240, and the plurality of bit lines 262 may be almost the same as those of the plurality of magnetic track layers 220, the plurality of reading units 230, and the plurality of bit lines 260, respectively.

Figure 14A:
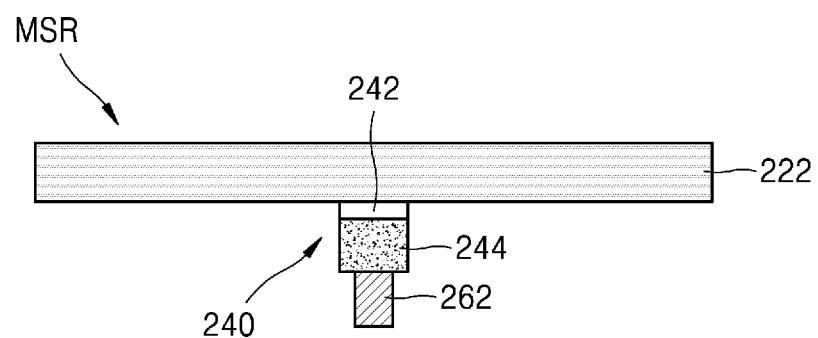
FIGS. 14A to 14C are cross-sectional views illustrating a part of a memory string of a memory device according to embodiments.
Figure 14B:
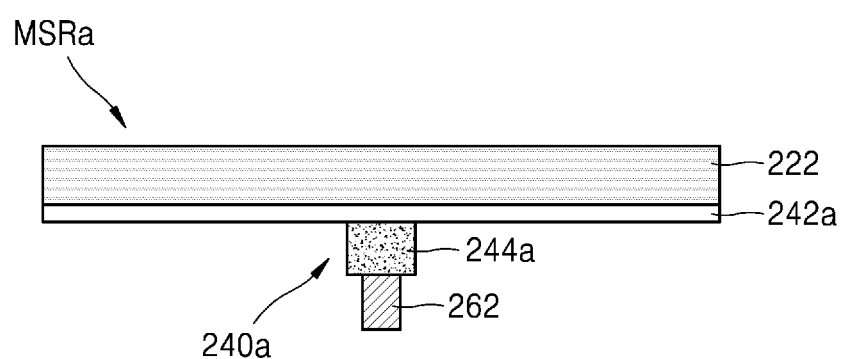
Figure 14C:
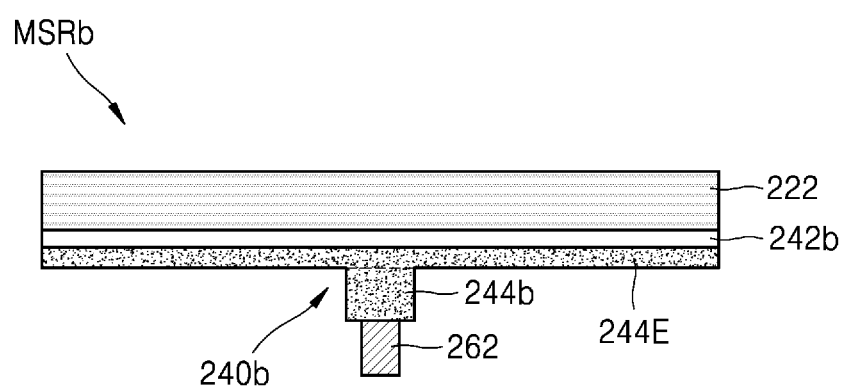

FIGS. 14A to 14C are cross-sectional views illustrating a part of a memory string of a memory device according to embodiments.

Referring to FIG. 14A, the memory string MSR may be formed of the magnetic track layer 222 and the reading unit 240. The memory string MSR may be the memory string MSR1 illustrated in FIGS. 13A and 13B or one of the plurality of memory strings of the memory device formed by the method described in FIGS. 13A and 13B. The magnetic track layer 222 may extend with a uniform horizontal width. The reading unit 240 may be arranged on a lower surface of the magnetic track layer 222. The reading unit 240 may include the tunnel barrier layer 242 and the fixed layer 244 formed on the lower surface of the magnetic track layer 222. The bit line 262 may be formed under the reading unit 240. The reading unit 240 may be between the magnetic track layer 222 and the bit line 262.

The magnetic track layer 222 may extend with a folding structure in which the magnetic track layer 222 is two-dimensionally at least two villi-shaped like the magnetic track layer 220 illustrated in FIG. 2A or the magnetic track layer 220a illustrated in FIG. 11A. The bit line 262 may extend in one direction.

The tunnel barrier layer 242 and the fixed layer 244 that form the reading unit 240 may be two-dimensionally rectangular as illustrated in FIG. 3A or 11B. However, embodiments are not limited thereto. In some embodiments, the tunnel barrier layer 242 and the fixed layer 244 may be two-dimensionally circular or polygonal.

Referring to FIG. 14B, a memory string MSRa may be formed of the magnetic track layer 222 and a reading unit 240a. The memory string MSRa may be the memory string MSR1 illustrated in FIGS. 13A and 13B or one of the plurality of memory strings of the memory device formed by the method described in FIGS. 13A and 13B. The reading unit 240a may include a tunnel barrier layer 242a and a fixed layer 244a formed on the lower surface of the magnetic track layer 222. The bit line 262 may be formed under the reading unit 240a. The reading unit 240a may be between the magnetic track layer 222 and the bit line 262.

The fixed layer 244a may be two-dimensionally circular, rectangular, or polygonal like the fixed layer 234 illustrated in FIG. 14A. The tunnel barrier layer 242a may extend while covering the lower surface of the magnetic track layer 222. That is, a flat shape of the tunnel barrier layer 242a may be similar to that of the magnetic track layer 222. That is, the tunnel barrier layer 242a may extend with a folding structure in which the tunnel barrier layer 242a is two-dimensionally at least two villi-shaped. That is, the reading unit 240a may be formed of the plurality of fixed layers 244a arranged on the magnetic track layer 222 to be apart from each other and parts of the tunnel barrier layer 242a between the magnetic track layer 222 and the plurality of fixed layers 244a.

Referring to FIG. 14C, a memory string MSRb may be formed of the magnetic track layer 222 and a reading unit 240b. The memory string MSRb may be the memory string MSR1 illustrated in FIGS. 13A and 13B or one of the plurality of memory strings of the memory device formed by the method described in FIGS. 13A and 13B. The reading unit 240b may include a tunnel barrier layer 242b, a polarization enhancement layer 244E, and a fixed layer 244b formed on the magnetic track layer 222. The bit line 262 may be formed on the reading unit 240b. The reading unit 240b may be between the magnetic track layer 222 and the bit line 262.

Flat shapes of the tunnel barrier layer 242b and the fixed layer 244b may be almost the same as those of the tunnel barrier layer 242a and the fixed layer 244a illustrated in FIG. 14B. The polarization enhancement layer 244E may extend while covering a lower surface of the tunnel barrier layer 242b. That is, a flat shape of the polarization enhancement layer 244E may be almost the same as those of the magnetic track layer 222 and the tunnel barrier layer 242b. The fixed layer 244b may be arranged on a part of a lower surface of the polarization enhancement layer 244E. The polarization enhancement layer 244E may be formed of a material the same as or similar to that of the fixed layer 244b. The polarization enhancement layer 244E may increase tunnel magneto-resistance effect in a MTJ formed in the memory string MSRb.

Figure 15:
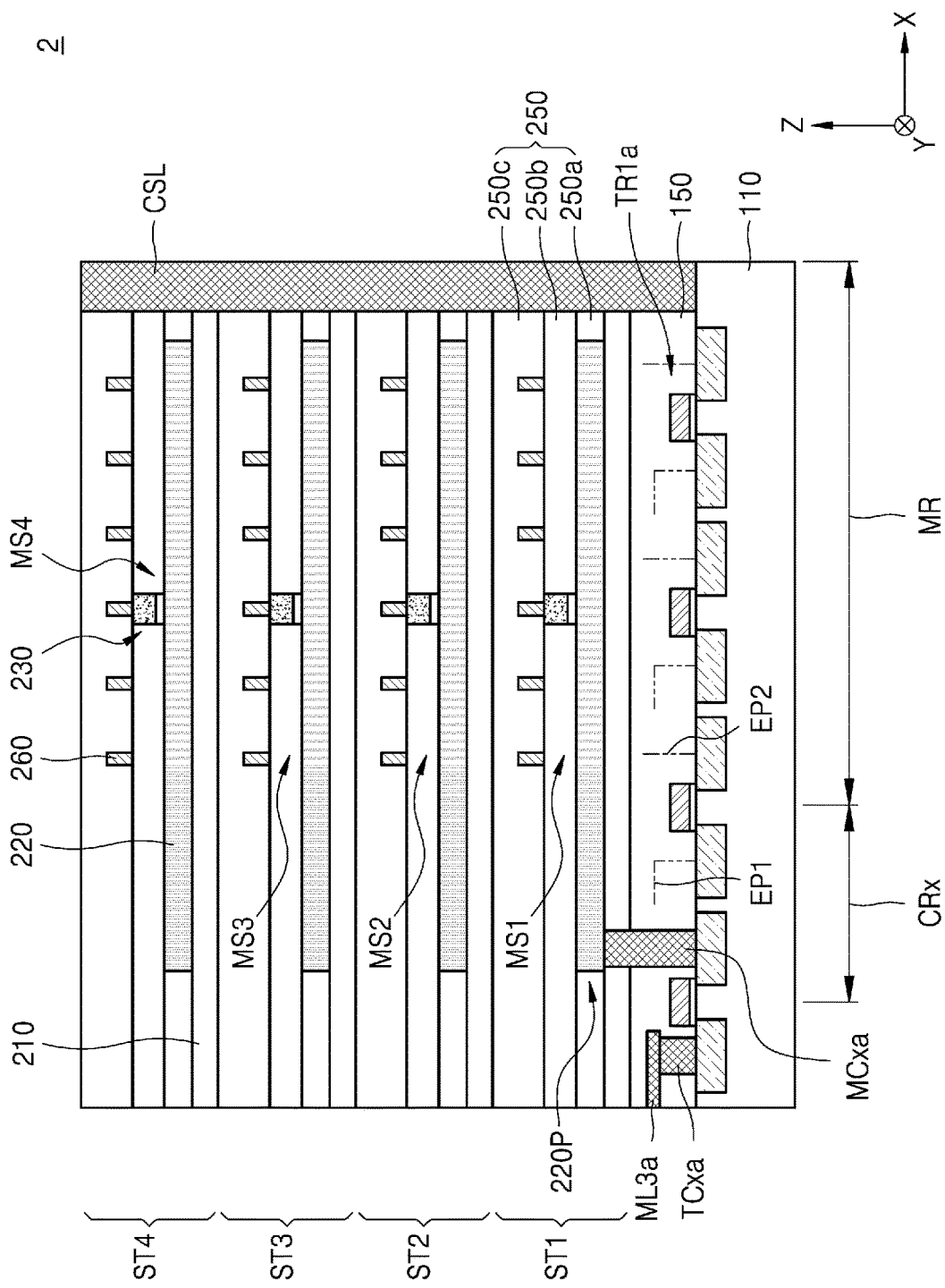
FIG. 15 is a cross-sectional view illustrating a memory device according to an embodiment.

FIG. 15 is a cross-sectional view illustrating a memory device according to an embodiment.

Referring to FIG. 15, a memory device 2 may include the substrate 110, the base insulating layer 150 on the substrate 110, and the plurality of memory stacks ST1, ST2, ST3, and ST4 laminated on the base insulating layer 150 in the vertical direction (the Z direction). The plurality of memory stacks ST1, ST2, ST3, and ST4 of the memory device 2 may not form stairs in the first connection region CRx. In some embodiments, the plurality of memory stacks ST1, ST2, ST3, and ST4 of the memory device 2 may form stairs in the second connection region CRy as illustrated in the memory device 1 of FIG. 10C. In other embodiments, the plurality of memory stacks ST1, ST2, ST3, and ST4 of the memory device 2 may not form stairs in the second connection region CRy.

A plurality of first driving elements TR1a may be formed on the substrate 110. At least some of the plurality of first driving elements TR1a may be positioned under the plurality of memory stacks ST1, ST2, ST3, and ST4. As compared to the plurality of first driving elements TR1 in FIGS. 10A and 10B (which are arranged in the first peripheral circuit region PRx that is a part of the substrate excluding the memory region MR and the first connection region CRx), the plurality of first driving elements TR1a in FIG. 15 may be arranged in the memory region MR or over the memory region MR and the second connection region Cry.

The memory device 2 may have the plurality of second driving elements TR2 arranged in the second peripheral circuit region PRy as illustrated in FIGS. 10A and 10C. However, the memory device 2 may have a plurality of second driving elements arranged in the memory region MR like the plurality of first driving elements TR1a or over the memory region MR and the second connection region CRy.

The memory device 2 may include a first connecting contact plug MCxa arranged in the first connection region CRx and connected to a lower surface of the pad track layer 220P. The first connecting contact plug MCxa may be connected to one of the plurality of first driving elements TR1a through the etch stop layer 210 and the base insulating layer 150. A first contact plug TCxa may electrically connect one of the plurality of first driving elements TR1a to a third wiring line ML3a through at least a part of the base insulating layer 150. The third wiring line ML3a is illustrated as being arranged in a middle part of the base insulating layer 150 in the vertical direction (the X direction). However, embodiments are not limited thereto. For example, the third wiring line ML3a may be arranged on an upper surface of the base insulating layer 150. In other embodiments, the memory device 2 may not include the first contact plug TCxa, and the third wiring line ML3a may extend along the upper surface of the substrate 110. The remaining ones of the plurality of first driving elements TR1a may have the third wiring line ML3a and/or a first electric path EP1 similar to the first contact plug TCxa, and a second electric path EP2 similar to the first connecting contact plug MCxa.

Figure 16:
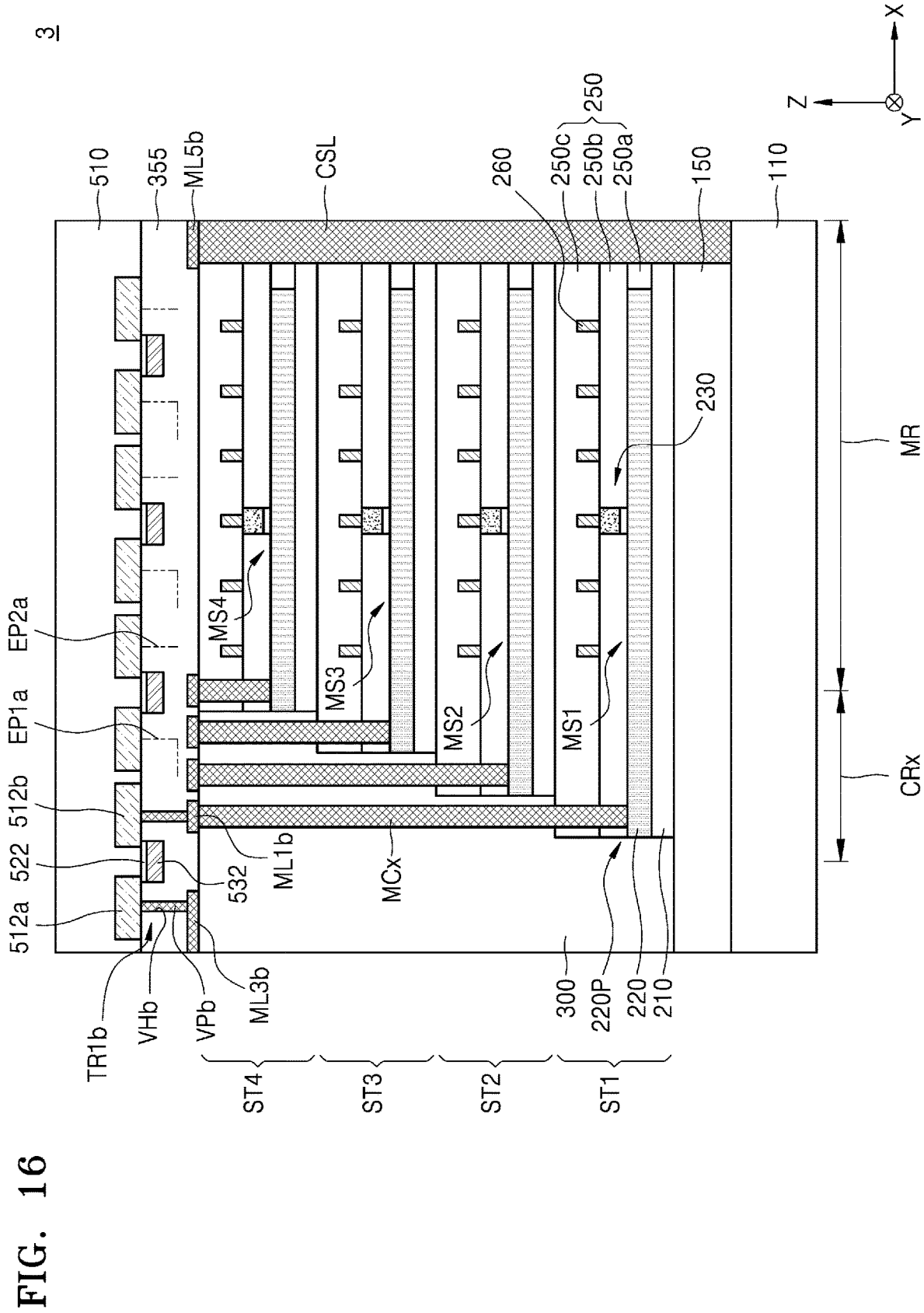
FIG. 16 is a cross-sectional view illustrating a memory device according to an embodiment.

FIG. 16 is a cross-sectional view illustrating a memory device according to an embodiment.

Referring to FIG. 16, a memory device 3 may include the substrate 110, the base insulating layer 150 on the substrate 110, and the plurality of memory stacks ST1, ST2, ST3, and ST4 laminated on the base insulating layer 150 in the vertical direction (the Z direction). The plurality of memory stacks ST1, ST2, ST3, and ST4 of the memory device 3 may form stairs in the first connection region CRx. The memory device 3 further includes a bonded insulating layer 355 on the plurality of memory stacks ST1, ST2, ST3, and ST4 and a bonded substrate 510 bonded on the bonded insulating layer 355. A plurality of first driving elements TR1b may be formed on the bonded substrate 510. Each of the plurality of first driving elements TR1b may include a first gate insulating layer 522 formed on the bonded substrate 510, a first gate electrode 532 covering an upper surface of the first gate insulating layer 522, and a first source region 512a and a first drain region 512b formed on the bonded substrate 510 with the first gate electrode 532 therebetween. The bonded insulating layer 355 may cover the plurality of first driving elements TR1b on the bonded substrate 510.

The memory device 3 may have the plurality of second driving elements TR2 arranged in the second peripheral circuit region PRy as illustrated in FIGS. 10A and 10C. However, the memory device 3 may have a plurality of second driving elements formed on the bonded substrate 510 like the plurality of first driving elements TR1b.

The memory device 3 may include the first connecting contact plug MCx arranged in the first connection region CRx and connected to the upper surface of the pad track layer 220P. A first wiring line ML1b, a third wiring line ML3b, and a fifth wiring line ML5b may be arranged on the filling insulation layer 300 and the plurality of memory stacks ST1, ST2, ST3, and ST4. The first wiring line ML1b may be connected to the connecting contact plug MCx. The fifth wiring line ML5b may be connected to the common source line CSL.

A plurality of via holes VHb may expose at least parts of upper surfaces of the first wiring line ML1b and the third wiring line ML3b to bottom surfaces thereof through the bonded insulating layer 355 and a plurality of via plugs VPb may fill the plurality of via holes VHb. Some of the plurality of via plugs VPb may electrically connect the first drain region 512b to the first wiring line ML1b and the others of the plurality of via plugs VPb may electrically connect the first source region 512a to the third wiring line ML3b.

The third wiring line ML3b may be connected to one of the plurality of first driving elements TR1b through one of the plurality of via plugs VPb. The first connecting contact plug MCx may be connected to one of the plurality of first driving elements TR1b through the first wiring line ML1b and one of the plurality of via plugs VPb.

The remaining ones of the plurality of first driving elements TR1b may have the third wiring line ML3b and a first electric path EP1a similar to the via plug VPb and the first wiring line ML1b connected to the first connecting contact plug MCxa and a second electric path EP2a similar to the via plug VPb.

The memory device 3 may be formed by forming the plurality of first driving elements TR1b on the bonded substrate 510 and then, bonding the bonded substrate 510 onto the substrate 110 on which the plurality of memory stacks ST1, ST2, ST3, and ST4 are formed. In some embodiments, after forming the bonded insulating layer 355 on the bonded substrate 510, the bonded substrate 510 may be bonded onto the substrate 110. In other embodiments, after forming a part of the bonded insulating layer 355 on the bonded substrate 510 and forming the remaining part of the bonded insulating layer 355 on the filling insulation layer 300 and the plurality of memory stacks ST1, ST2, ST3, and ST4, the bonded substrate 510 may be bonded onto the substrate 110.

In the memory device 3 according to embodiments, because the plurality of first driving elements TR1b are additionally formed on the bonded substrate 510, an additional region for forming the plurality of first driving elements TR1b may not be required. Therefore, a horizontal area of the memory device 3 may be minimized.

Figure 17A:
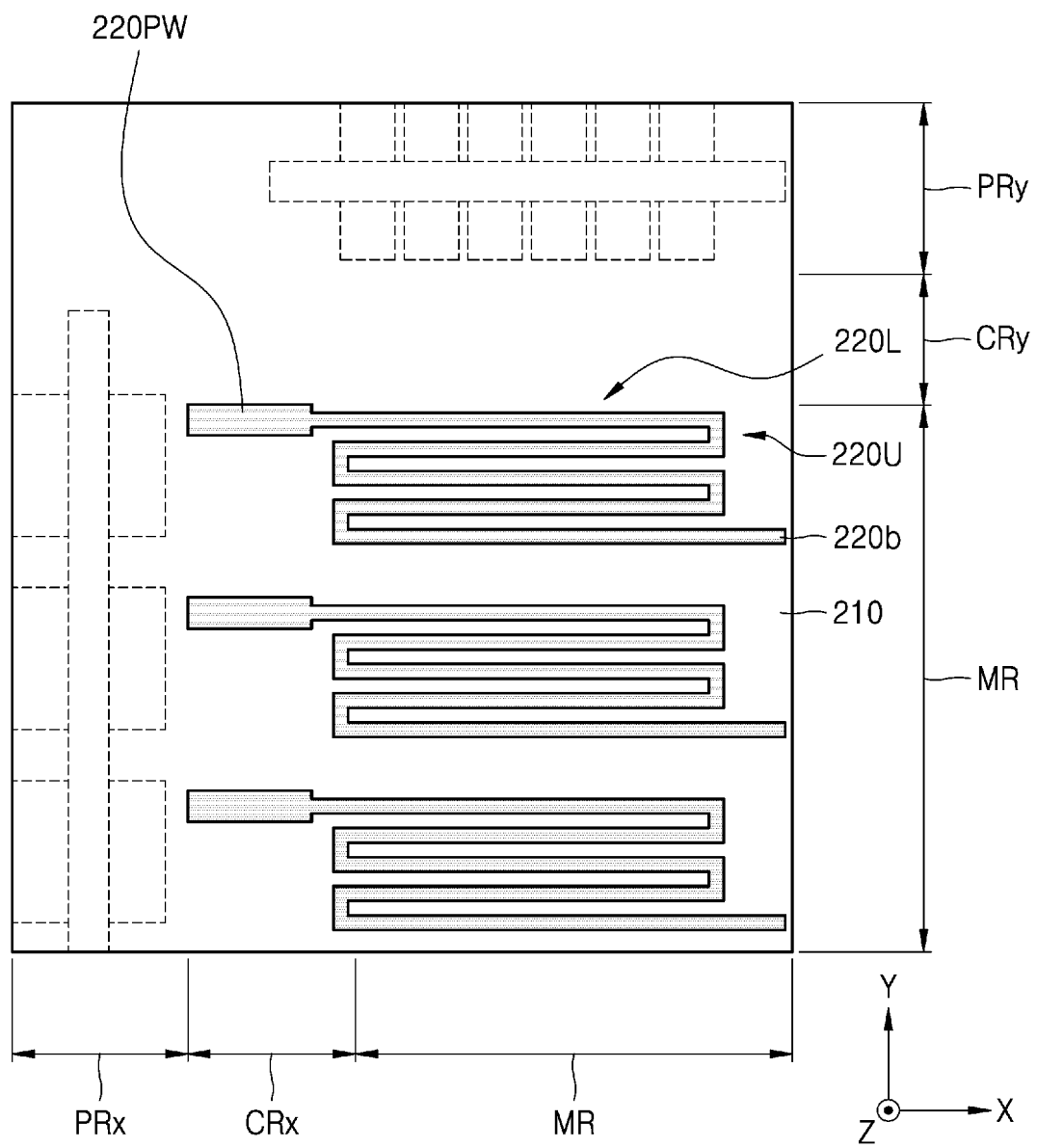
FIG. 17A is a cross-sectional view illustrating a method of manufacturing a memory device according to an embodiment.
Figure 17B:
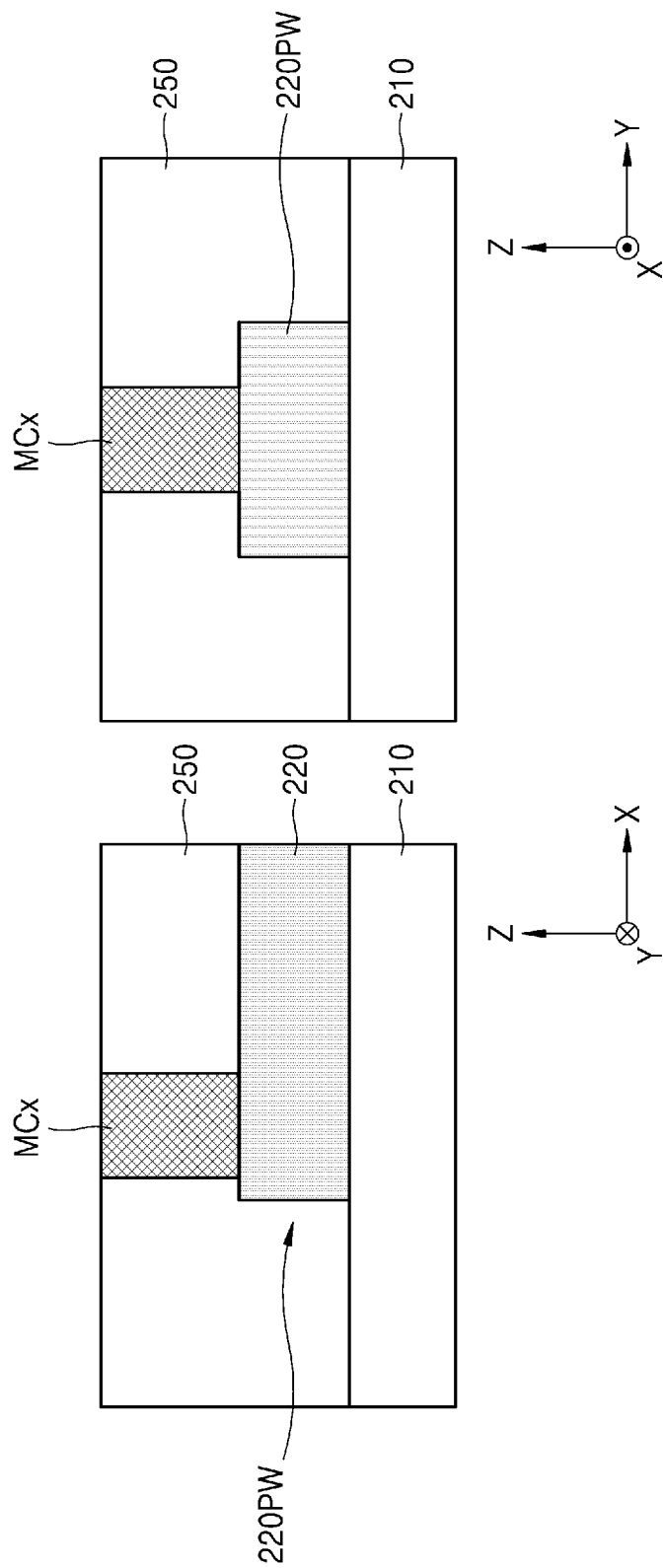
FIG. 17B is a cross-sectional view illustrating a part of a magnetic track layer of a memory device according to an embodiment.

FIG. 17A is a cross-sectional view illustrating a method of manufacturing a memory device according to an embodiment, and FIG. 17B is a cross-sectional view of a part of a magnetic track layer of a memory device according to an embodiment.

Referring to FIG. 17A, a plurality of magnetic track layers 220b may be formed on the etch stop layer 210. In some embodiments, each of the plurality of magnetic track layers 220b may be formed over the memory region MR and the first connection region CRx.

In the memory region MR, each of the plurality of magnetic track layers 220b may include extended track layers 220L and connecting track layers 220U connected to the extended track layers 220L. In the first connection region CRx, each of the plurality of magnetic track layers 220b may include a pad track layer 220PW extended from the extended track layer 220L. In some embodiments, the extended track layers 220L and the pad track layer 220PW may extend in the first horizontal direction (the X direction).

In some embodiments, the extended track layers 220L and the connecting track layers 220U of each of the plurality of magnetic track layers 220b may extend with a uniform horizontal width, and a horizontal width of the pad track layer 220PW may have a value greater than that of the horizontal width of the extended track layers 220L and the connecting track layers 220U.

Referring to FIG. 17B, the first connecting contact plug MCx may be connected to a part of the pad track layer 220PW adjacent to one end of the magnetic track layer. In some embodiments, the horizontal width of the pad track layer 220PW may have a value greater than that of a horizontal width of the first connecting contact plug MCx.

The first connecting contact plug MCx may contact a part of an upper surface of the pad track layer 220PW and may not contact the etch stop layer 210.

Figure 18A:
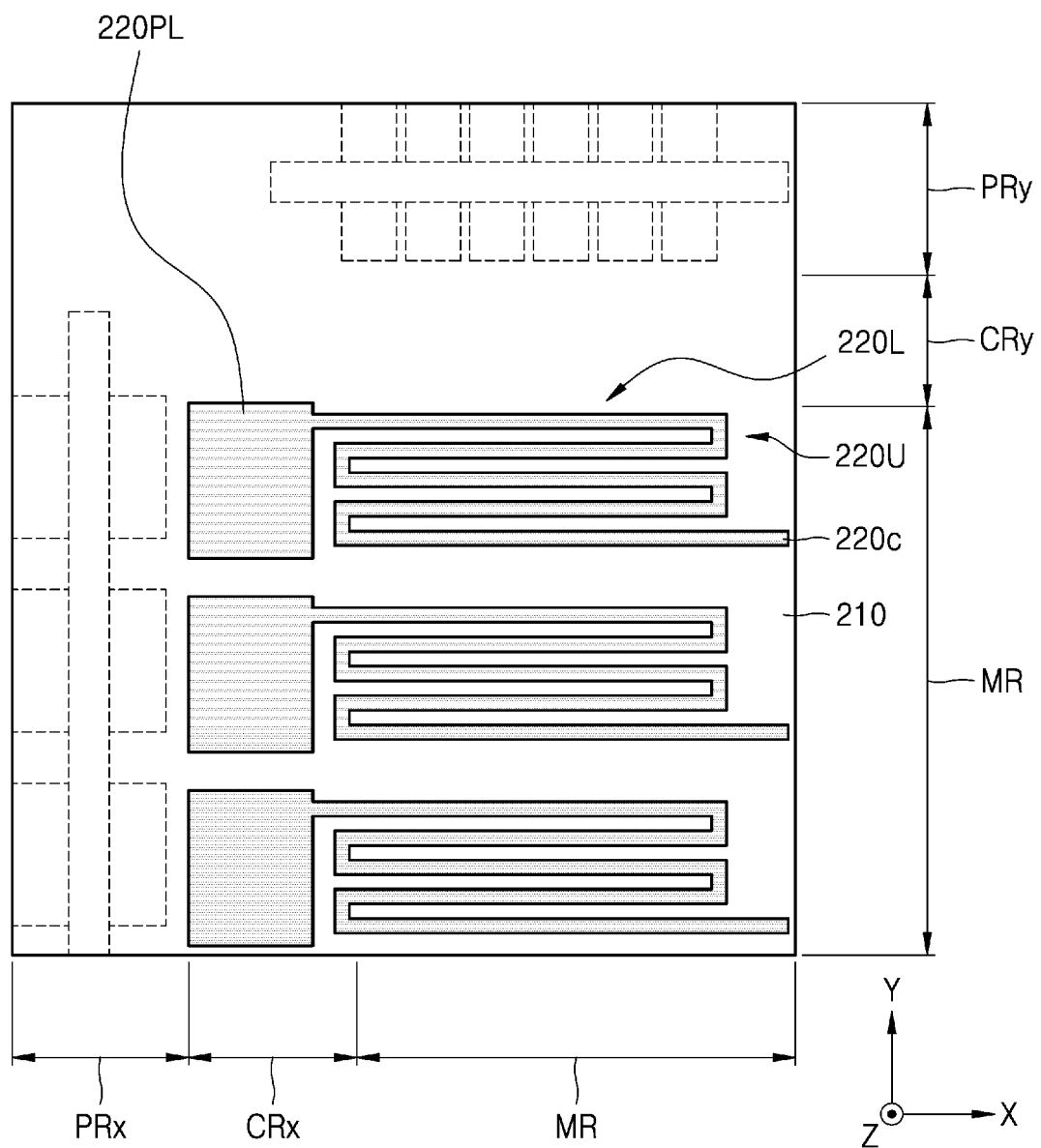
FIG. 18A is a cross-sectional view illustrating a method of manufacturing a memory device according to an embodiment.
Figure 18B:
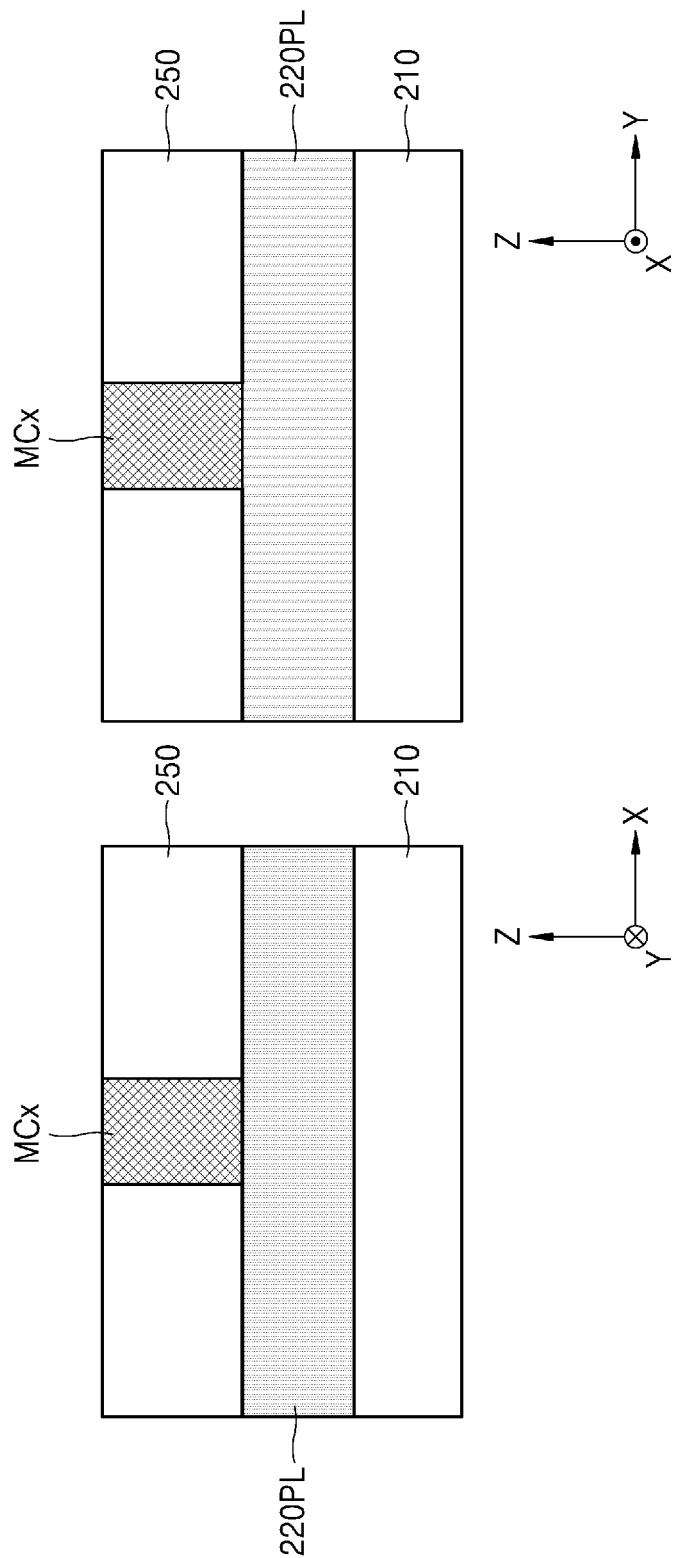
FIG. 18B is a cross-sectional view illustrating a part of a magnetic track layer of a memory device according to an embodiment.

FIG. 18A is a cross-sectional view illustrating a method of manufacturing a memory device according to an embodiment, and FIG. 18B is a cross-sectional view of a part of a magnetic track layer of a memory device according to an embodiment.

Referring to FIG. 18A, a plurality of magnetic track layers 220c may be formed on the etch stop layer 210. In some embodiments, each of the plurality of magnetic track layers 220c may be formed over the memory region MR and the first connection region CRx.

In the memory region MR, each of the plurality of magnetic track layers 220c may include extended track layers 220L and connecting track layers 220U connected to the extended track layers 220L. In the first connection region CRx, each of the plurality of magnetic track layers 220c may include a pad track layer 220PL extended from the extended track layer 220L. In some embodiments, the extended track layers 220L may extend in the first horizontal direction (the X direction).

In some embodiments, the extended track layers 220L and the connecting track layers 220U of each of the plurality of magnetic track layers 220c may extend with a uniform horizontal width. In some embodiments, the pad track layer 220PL may be rectangular. A long axis direction width and a short axis direction width of the pad track layer 220PL may have values greater than that of the horizontal width of the extended track layers 220L and the connecting track layers 220U.

Referring to FIG. 18B, the first connecting contact plug MCx may be connected to a part of the pad track layer 220PL adjacent to one end of the magnetic track layer. The first connecting contact plug MCx may contact a part of an upper surface of the pad track layer 220PL and may not contact the etch stop layer 210.

Figure 19A:
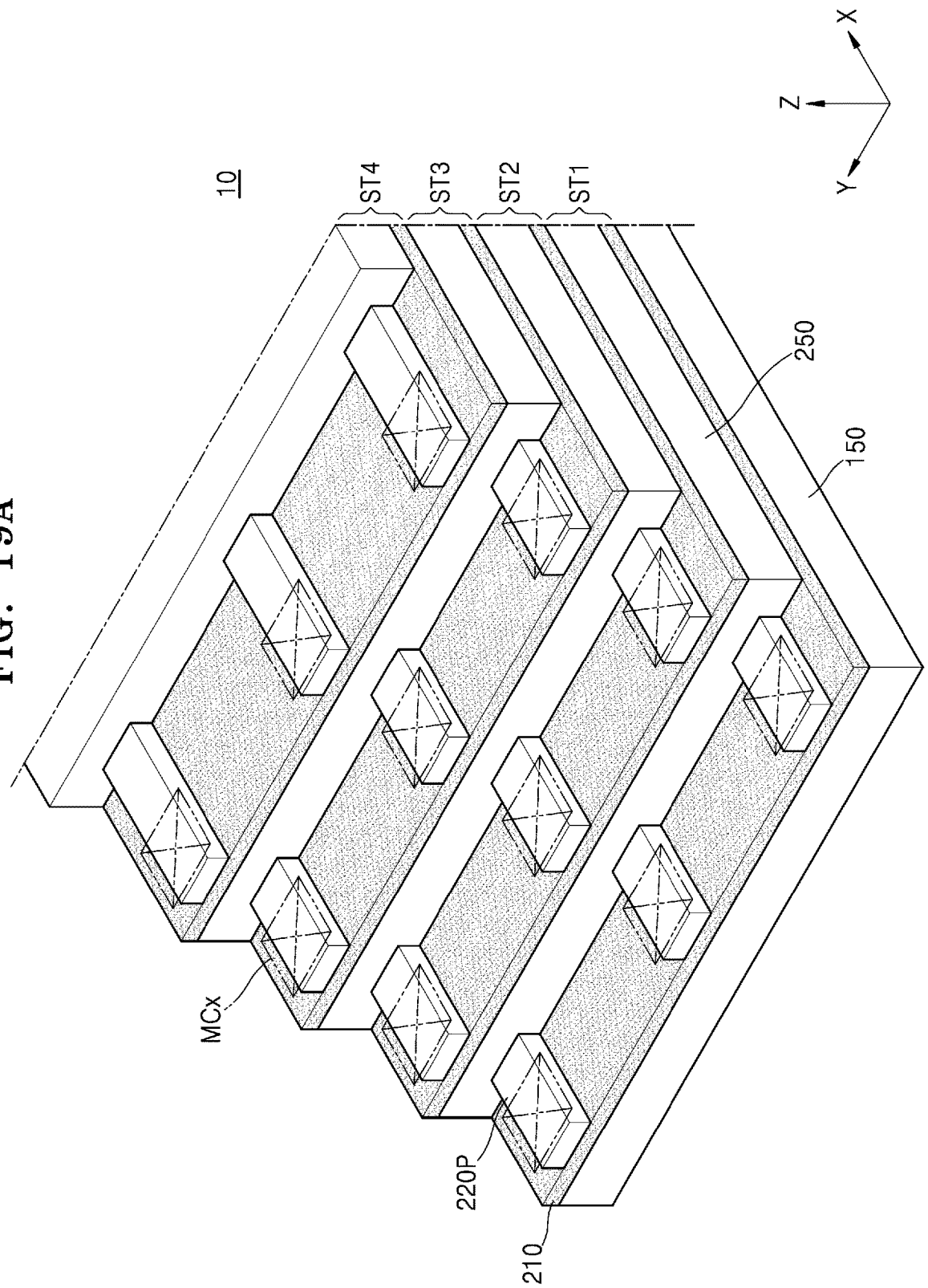
FIGS. 19A to 19C are perspective views illustrating memory devices according to embodiments.
Figure 19B:
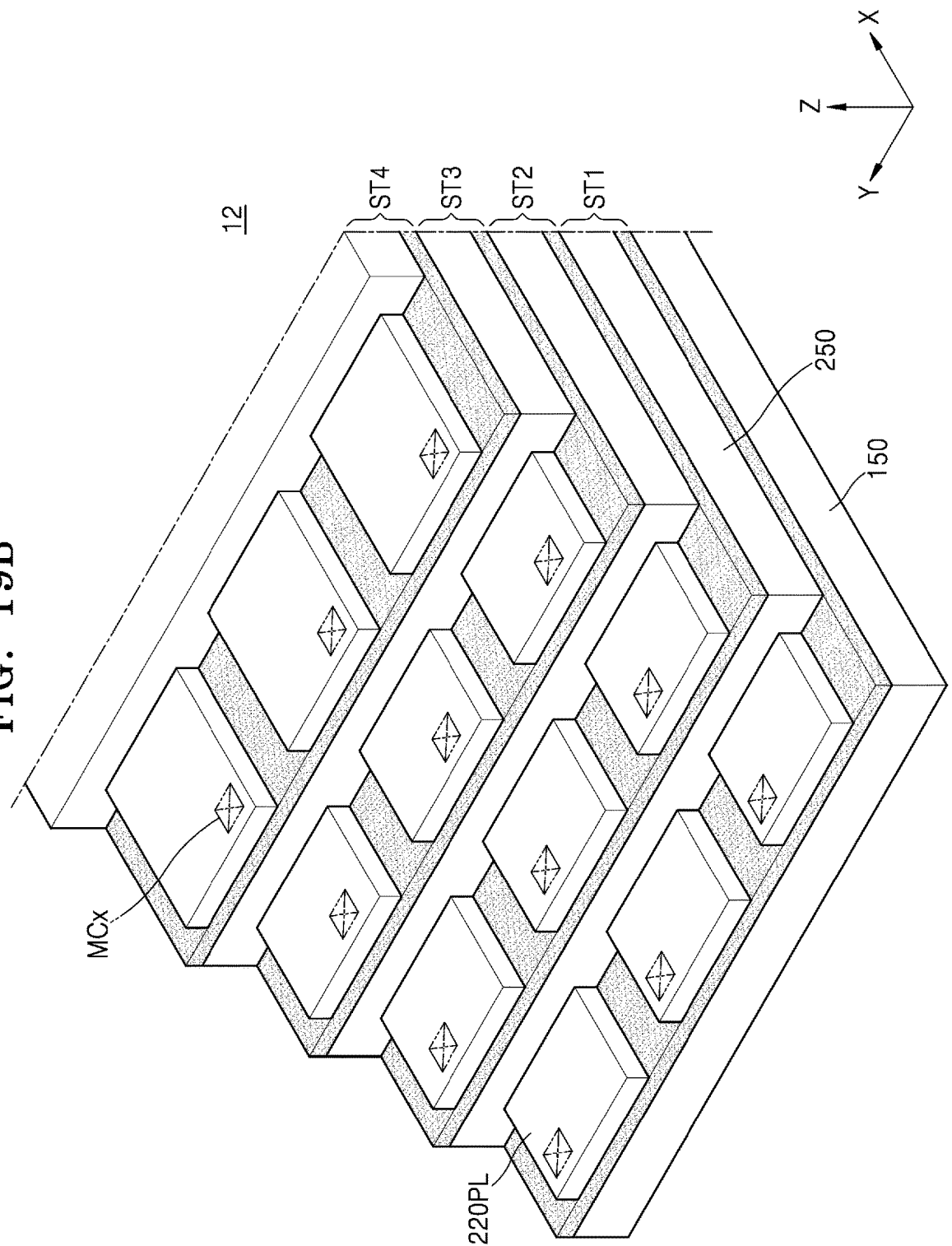
Figure 19C:
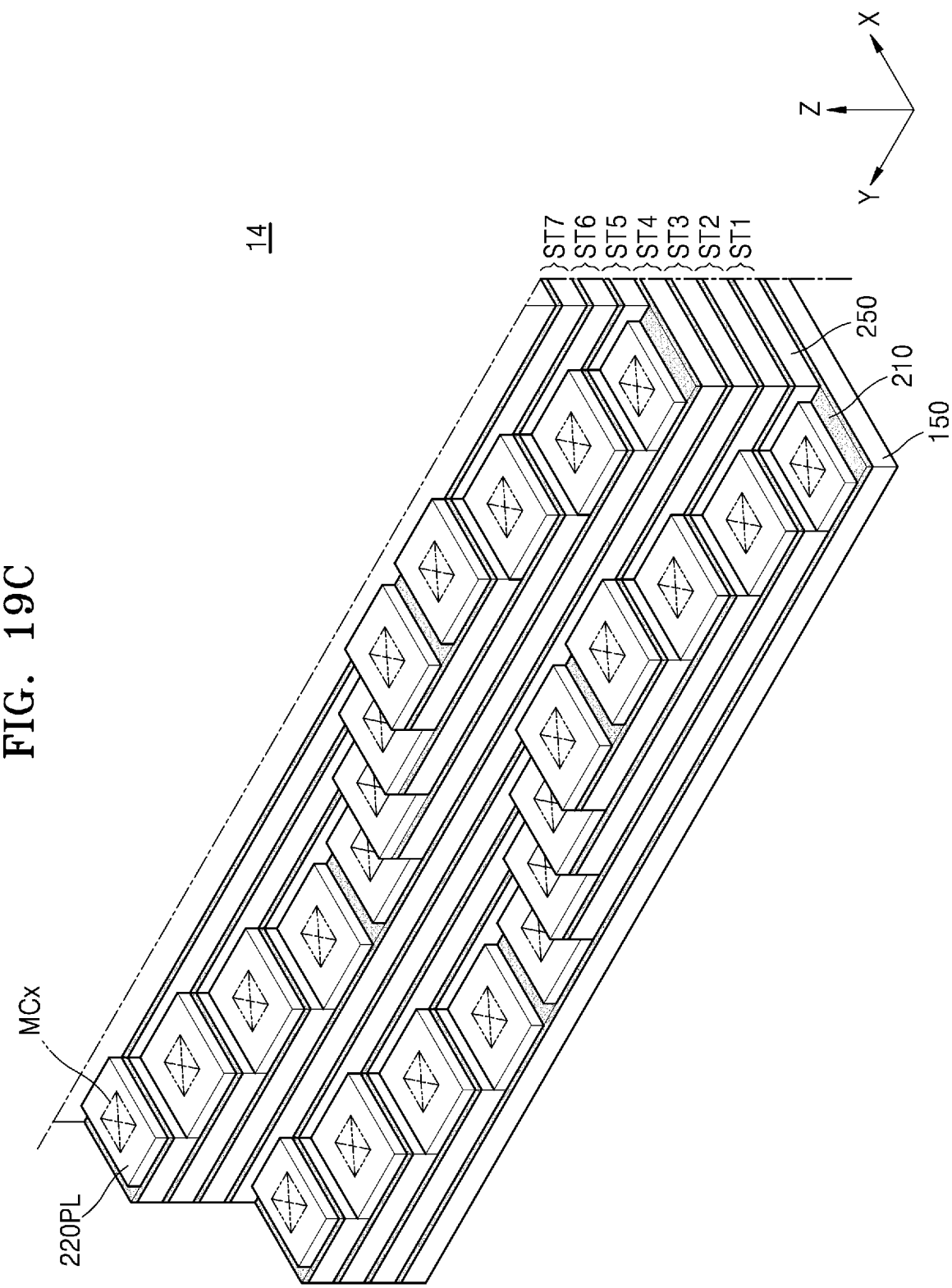

FIGS. 19A to 19C are perspective views illustrating memory devices according to embodiments. Specifically, FIGS. 19A to 19C are perspective views illustrating first connection regions of memory devices.

Referring to FIG. 19A, a plurality of memory stacks ST1, ST2, ST3, and ST4 of a memory device 10 may form stairs in the first horizontal direction (the X direction). In some embodiments, a horizontal width of the first connecting contact plug MCx may have a value greater than that of the horizontal width of the pad track layer 220P.

When the pad track layer 220PW illustrated in FIG. 17A is provided, the plurality of memory stacks ST1, ST2, ST3, and ST4 may form stairs in the first horizontal direction (the X direction). In this case, a horizontal width of the pad track layer 220PW may be greater than the horizontal width of the first connecting contact plug MCx.

Referring to FIG. 19B, a plurality of memory stacks ST1, ST2, ST3, and ST4 of a memory device 12 may form stairs in the first horizontal direction (the X direction). In some embodiments, a horizontal width of each of a plurality of pad track layers 220PL may be greater than a horizontal width of each of a plurality of first connecting contact plugs MCx.

The plurality of first connecting contact plugs MCx may be arranged while being shifted in the second horizontal direction (the Y direction) on the plurality of pad track layers 220PL in different memory stacks among the plurality of memory stacks ST1, ST2, ST3, and ST4.

Referring to FIG. 19C, a plurality of memory stacks ST1, ST2, ST3, and ST4 of a memory device 14 may form stairs in the first horizontal direction (the X direction) and the second horizontal direction (the Y direction). In some embodiments, a horizontal width of each of a plurality of pad track layers 220PL may have a value greater than that of a horizontal width of each of a plurality of first connecting contact plugs MCx.

In some of the plurality of memory stacks ST1, ST2, ST3, and ST4, the plurality of pad track layers 220PL may cover all of the etch stop layer 210 of a stair-shaped step board and, in the others of the plurality of memory stacks ST1, ST2, ST3, and ST4, the plurality of pad track layers 220PL may cover a part of the etch stop layer 210 of the stair-shaped step board. For example, in the memory stacks ST1 and ST4 positioned in the uppermost portion and at the uppermost end among the plurality of memory stacks ST1, ST2, ST3, and ST4, the plurality of pad track layers 220PL may cover a part of the etch stop layer 210 of the stair-shaped step board and, in the other memory stacks ST2 and ST3, the plurality of pad track layers 220PL may cover all the etch stop layer 210 of the stair-shaped step board.

By way of summation and review, embodiments relate to a memory device including a racetrack, thereby achieving high integrity. In addition, embodiments relate to a method of manufacturing the memory device including the racetrack.

That is, according to embodiments, because each of a plurality of memory stacks with a magnetic track layer has a stairs shape, connecting contact plugs connected to the plurality of memory stacks may be formed by performing a photolithography, thereby reducing manufacturing costs. In addition, because the magnetic track layer is arranged on an etch stop layer, process mass productivity may increase and, because the magnetic track layer has a folding structure that is two-dimensionally villi-shaped, a pitch of a bit line may be freely controlled, thereby increasing process margin.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a magnetic track layer extending on a substrate, the magnetic track layer having a folded structure that is two-dimensionally villi-shaped;
a plurality of reading units including a plurality of fixed layers and a tunnel barrier layer between the magnetic track layer and each of the plurality of fixed layers; and
a plurality of bit lines extending on different ones of the plurality of reading units, the plurality of reading units being between the magnetic track layer and corresponding ones of the plurality of bit lines.

2. The memory device as claimed in claim 1, wherein the magnetic track layer includes:
a plurality of extended track layers extending in one direction, and
at least two connecting track layers connecting two extended track layers among the plurality of extended track layers to define the two-dimensionally villi-shaped folded structure of the magnetic track layer.

3. The memory device as claimed in claim 2, further comprising:
a first connecting contact plug connected to a first end of the magnetic track layer; and
a common source line connected to a second end of the magnetic track layer, the first and second ends being opposite to each other in a first horizontal direction, and the magnetic track layer being between the first connecting contact plug and the common source line.

4. The memory device as claimed in claim 3, wherein each of the plurality of extended track layers extends in the first horizontal direction and each of the plurality of bit lines extends in a second horizontal direction perpendicular to the first horizontal direction.

5. The memory device as claimed in claim 4, wherein each of the plurality of reading units is arranged on a part of each of the plurality of extended track layers.

6. The memory device as claimed in claim 3, wherein each of the plurality of extended track layers extends in a second horizontal direction perpendicular to the first horizontal direction and each of the plurality of bit lines extends in the second horizontal direction.

7. The memory device as claimed in claim 6, wherein each of the plurality of reading units is arranged on a part of each of the at least two connecting track layers.

8. The memory device as claimed in claim 1, further comprising an etch stop layer on the substrate, the magnetic track layer extending along an upper surface of the etch stop layer.

9. The memory device as claimed in claim 8, wherein the plurality of reading units are arranged on an upper surface of the magnetic track layer.

10. The memory device as claimed in claim 8, wherein the plurality of reading units are arranged on a lower surface of the magnetic track layer, the etch stop layer surrounding the plurality of reading units.

11. A memory device, comprising:
a substrate having a memory region and a connection region, the memory region and the connection region being adjacent to each other along a first horizontal direction;
a plurality of memory stacks on the substrate, each of the plurality of memory stacks having a stair profile in the connection region and including a magnetic track layer extending over the memory region and the connection region with a folded structure that is two-dimensionally villi-shaped, the magnetic track layer including:
a plurality of extended track layers two-dimensionally extending in one direction, and
at least two connecting track layers connecting two extended track layers among the plurality of extended track layers;
a plurality of reading units including a plurality of fixed layers and a tunnel barrier layer between the magnetic track layer and each of the plurality of fixed layers;
a plurality of bit lines extending on different ones of the plurality of reading units, the plurality of reading units being between the magnetic track layer and corresponding ones of the plurality of bit lines;
a plurality of connecting contact plugs in the connection region, each of the plurality of connecting contact plugs being connected to a pad track layer at a first end of a corresponding magnetic track layer of the plurality of memory stacks; and
a common source line in the memory region, the common source line being connected to a second end of the corresponding magnetic track layer of the plurality of memory stacks, the first and second ends being spaced apart from each other along the first horizontal direction.

12. The memory device as claimed in claim 11, wherein each of the plurality of extended track layers extends in the first horizontal direction and each of the plurality of bit lines extends in a second horizontal direction perpendicular to the first horizontal direction.

13. The memory device as claimed in claim 11, wherein each of the plurality of extended track layers and each of the plurality of bit lines extends in a second horizontal direction perpendicular to the first horizontal direction.

14. The memory device as claimed in claim 11, wherein the magnetic track layer extends with a uniform horizontal width.

15. The memory device as claimed in claim 11, wherein a horizontal width of the pad track layer of the corresponding magnetic track layer is greater than that of each of the plurality of extended track layers and that of each of the at least two connecting track layers.

16. The memory device as claimed in claim 11, wherein each of the plurality of memory stacks further includes an etch stop layer, the magnetic track layer extending along an upper surface of the etch stop layer, and the plurality of reading units being on an upper surface of the magnetic track layer.

17. The memory device as claimed in claim 11, further comprising an etch stop layer surrounding the plurality of reading units, the plurality of reading units being on a lower surface of the magnetic track layer.

18. A memory device, comprising:
a substrate including a memory region, a first connection region in a first horizontal direction of the memory region, and a second connection region in a second horizontal direction perpendicular to the first horizontal direction of the memory region;
a plurality of memory stacks on the substrate, each of the plurality of memory stacks having a stair profile in the first connection region and the second connection region, and including an etch stop layer laminated on the substrate;
a magnetic track layer extending along an upper surface of the etch stop layer over the memory region and the first connection region with a folded structure that is two-dimensionally villi-shaped, the magnetic track layer including:
a plurality of extended track layers two-dimensionally extending in one direction,
at least two connecting track layers connecting two extended track layers among the plurality of extended track layers, and
a plurality of magnetic domains;
a plurality of reading units including a plurality of fixed layers and a tunnel barrier layer between the magnetic track layer and each of the plurality of fixed layers;
a plurality of bit lines extending on different ones of the plurality of reading units, the plurality of reading units being between the magnetic track layer and corresponding ones of the plurality of bit lines to define a magnetic tunnel junction (MTJ);
a plurality of first connecting contact plugs in the first connection region, each of the plurality of first connecting contact plugs being connected to a pad track layer at a first end of a corresponding magnetic track layer of the plurality of memory stacks;
a common source line connected to the magnetic track layers of the plurality of memory stacks in the memory region opposite to the first connection region in the first horizontal direction; and
a plurality of second connecting contact plugs in the second connection region, each of the plurality of second connecting contact plugs being connected to a partial bit line pad unit of a magnetic track layer that is a part of the bit line of the plurality of memory stacks.

19. The memory device as claimed in claim 18, wherein, in a direction in which the magnetic track layer extends, a distance between the common source line and a reading unit of the plurality of reading units that is adjacent to the common source line is equal to or greater than ½ of a distance between two adjacent reading units of the plurality of reading units.

20. The memory device as claimed in claim 18, wherein, in a direction in which the magnetic track layer extends, a distance between the first connecting contact plug and a reading unit of the plurality of reading units that is adjacent to the first connecting contact plug is equal to or greater than ½ of a distance between two adjacent reading units of the plurality of reading units.

* * * * *